United States Patent
Thorkelsson et al.

(10) Patent No.: US 10,692,735 B2
(45) Date of Patent: Jun. 23, 2020

(54) ELECTRO-OXIDATIVE METAL REMOVAL IN THROUGH MASK INTERCONNECT FABRICATION

(71) Applicant: Lam Research Corporation, Fremont, CA (US)

(72) Inventors: Kari Thorkelsson, Portland, OR (US); Richard G. Abraham, Sherwood, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/040,407

(22) Filed: Jul. 19, 2018

(65) Prior Publication Data

US 2019/0035640 A1    Jan. 31, 2019

Related U.S. Application Data

(60) Provisional application No. 62/538,202, filed on Jul. 28, 2017.

(51) Int. Cl.
*H01L 21/3213* (2006.01)
*C25D 7/12* (2006.01)
(Continued)

(52) U.S. Cl.
CPC .......... *H01L 21/32139* (2013.01); *C25D 5/48* (2013.01); *C25D 7/12* (2013.01);
(Continued)

(58) Field of Classification Search
CPC .......... C25D 17/001; C25D 3/38; C25D 5/02; C25D 5/022; C25D 5/48; C25D 7/12;
(Continued)

(56) References Cited

U.S. PATENT DOCUMENTS

| H000036 H | 3/1986 | Smith |
| 5,391,271 A | 2/1995 | Ludwig |

(Continued)

FOREIGN PATENT DOCUMENTS

| CN | 1303124 A | 7/2001 |
| CN | 1506499 A | 6/2004 |

(Continued)

OTHER PUBLICATIONS

U.S. Office Action dated Oct. 15, 2014 issued in U.S. Appl. No. 13/904,283.

(Continued)

*Primary Examiner* — Binh X Tran
(74) *Attorney, Agent, or Firm* — Weaver Austin Villeneuve & Sampson LLP

(57) ABSTRACT

In one implementation a wafer processing method includes filling a plurality of through-resist recessed features with a metal, such that a ratio of fill rate of a first feature to a fill rate of a second feature is R1; followed by electrochemically removing metal such that a ratio of metal removal rate from the first feature to the metal removal rate from the second feature is greater than R1, improving the uniformity of the fill. In some embodiments the method includes contacting an anodically biased substrate with an electrolyte such that the electrolyte has a transverse flow component in a direction that is substantially parallel to the working surface of the substrate. The method can be implemented in an apparatus that is configured for generating the transverse flow at the surface of the substrate. In some implementations the method makes use of distinct electrochemical regimes to achieve improvement in uniformity.

29 Claims, 47 Drawing Sheets

(51) Int. Cl.
*H01L 21/67* (2006.01)
*C25D 5/48* (2006.01)
*C25F 3/14* (2006.01)
*H01L 21/288* (2006.01)
*C25D 17/00* (2006.01)
*C25D 5/02* (2006.01)
*C25D 3/38* (2006.01)

(52) U.S. Cl.
CPC .............. *C25F 3/14* (2013.01); *H01L 21/288* (2013.01); *H01L 21/32134* (2013.01); *H01L 21/6723* (2013.01); *H01L 21/67075* (2013.01); *C25D 3/38* (2013.01); *C25D 5/02* (2013.01); *C25D 5/022* (2013.01); *C25D 7/123* (2013.01); *C25D 17/001* (2013.01)

(58) Field of Classification Search
CPC ......... C25D 7/123; C25F 3/14; H01L 21/288; H01L 21/32134; H01L 21/32139; H01L 21/67075; H01L 21/6723
USPC ............ 216/86; 156/345.11, 345.17, 345.21; 205/83, 96, 157, 48
See application file for complete search history.

(56) References Cited

U.S. PATENT DOCUMENTS

| | | |
|---|---|---|
| 5,425,862 A | 6/1995 | Hartmann et al. |
| 5,858,196 A | 1/1999 | Ikenaga |
| 6,113,771 A | 9/2000 | Landau et al. |
| 6,231,743 B1 | 5/2001 | Etherington |
| 6,261,433 B1 | 7/2001 | Landau |
| 6,315,883 B1 | 11/2001 | Mayer et al. |
| 6,350,366 B1 | 2/2002 | Landau et al. |
| 6,383,917 B1 | 5/2002 | Cox |
| 6,398,926 B1 | 6/2002 | Mahneke |
| 6,514,570 B1 | 2/2003 | Matsuyama et al. |
| 6,527,920 B1 | 3/2003 | Mayer et al. |
| 6,576,111 B1 | 6/2003 | Hupe et al. |
| 6,709,565 B2 | 3/2004 | Mayer et al. |
| 6,951,599 B2 | 10/2005 | Yahalom et al. |
| 7,105,925 B2 | 9/2006 | Boardman et al. |
| 7,264,704 B2 | 9/2007 | Nevosi et al. |
| 7,387,131 B2 | 6/2008 | Kuroda et al. |
| 7,405,157 B1 | 7/2008 | Reid et al. |
| 7,531,099 B1 | 5/2009 | Rhodes et al. |
| 7,670,950 B2 | 3/2010 | Richardson et al. |
| 7,776,741 B2 | 8/2010 | Reid et al. |
| 8,043,967 B2 | 10/2011 | Reid et al. |
| 8,128,791 B1 | 3/2012 | Buckalew et al. |
| 8,722,539 B2 | 5/2014 | Reid et al. |
| 8,795,480 B2 | 8/2014 | Mayer et al. |
| 9,109,295 B2 | 8/2015 | Reid et al. |
| 9,449,808 B2 | 9/2016 | Buckalew et al. |
| 9,624,592 B2 | 4/2017 | Abraham et al. |
| 9,899,230 B2 | 2/2018 | Buckalew et al. |
| 10,472,730 B2 | 11/2019 | Mayer et al. |
| 2002/0088709 A1 | 7/2002 | Hongo et al. |
| 2003/0079683 A1 | 5/2003 | Nakano et al. |
| 2003/0080431 A1 | 5/2003 | Uzoh et al. |
| 2003/0106802 A1 | 6/2003 | Hagiwara et al. |
| 2003/0186540 A1 | 10/2003 | Ito et al. |
| 2004/0022940 A1 | 2/2004 | Nagai et al. |
| 2004/0053147 A1 | 3/2004 | Ito |
| 2004/0134682 A1 | 7/2004 | En et al. |
| 2004/0154917 A1 | 8/2004 | Ishida |
| 2004/0256238 A1 | 12/2004 | Suzuki et al. |
| 2005/0000814 A1 | 1/2005 | Metzger |
| 2005/0053874 A1 | 3/2005 | Yoshihara et al. |
| 2005/0082172 A1* | 4/2005 | Kovarsky ............ C25D 21/14 205/101 |
| 2005/0241946 A1 | 11/2005 | Nagai et al. |
| 2006/0038182 A1 | 2/2006 | Rogers et al. |
| 2006/0144699 A1 | 7/2006 | Klocke |
| 2006/0243598 A1* | 11/2006 | Singh ................ C25D 5/04 205/260 |
| 2007/0158202 A1 | 7/2007 | Nagai et al. |
| 2007/0187237 A1 | 8/2007 | San et al. |
| 2007/0235341 A1 | 10/2007 | Mizohata et al. |
| 2007/0235392 A1 | 10/2007 | Edwards |
| 2008/0217183 A1 | 5/2008 | Muthukumar et al. |
| 2009/0038947 A1 | 2/2009 | Dubin et al. |
| 2010/0032303 A1* | 2/2010 | Reid .................... C25D 17/002 205/96 |
| 2010/0035192 A1 | 2/2010 | Ando et al. |
| 2010/0041226 A1 | 2/2010 | Reid et al. |
| 2010/0200412 A1 | 8/2010 | Reid et al. |
| 2011/0083965 A1 | 4/2011 | Reid et al. |
| 2011/0266154 A1 | 11/2011 | Pavlov et al. |
| 2012/0000786 A1 | 1/2012 | Mayer et al. |
| 2012/0031768 A1 | 2/2012 | Reid et al. |
| 2012/0175262 A1 | 7/2012 | Basol |
| 2013/0001198 A1* | 1/2013 | Arvin ................. C25D 17/007 216/86 |
| 2013/0134045 A1* | 5/2013 | Porter ................. C25D 17/001 205/158 |
| 2013/0313123 A1 | 11/2013 | Abraham et al. |
| 2014/0299478 A1 | 10/2014 | Mayer et al. |
| 2014/0357089 A1 | 12/2014 | Buckalew et al. |
| 2015/0225866 A1 | 8/2015 | Lee et al. |
| 2015/0315720 A1 | 11/2015 | Mayer et al. |
| 2016/0108529 A1* | 4/2016 | Albrecht ................ C25B 1/00 526/344 |
| 2016/0273119 A1 | 9/2016 | He et al. |
| 2016/0343582 A1 | 11/2016 | Buckalew et al. |

FOREIGN PATENT DOCUMENTS

| | | |
|---|---|---|
| CN | 1610066 A | 4/2005 |
| CN | 1679154 A | 10/2005 |
| CN | 1773675 A | 5/2006 |
| CN | 101022703 A | 8/2007 |
| CN | 101622585 A | 1/2010 |
| CN | 202465938 U | 10/2012 |
| CN | 102995096 A | 3/2013 |
| CN | 103035544 A | 4/2013 |
| CN | 104060319 A | 9/2014 |
| JP | 09-223858 | 8/1997 |
| JP | 2003-113479 | 4/2003 |
| KR | 10-1999-0015599 | 3/1999 |
| KR | 10-2002-0077811 | 10/2002 |
| TW | 200302519 | 8/2003 |
| TW | 200532057 A | 10/2005 |
| TW | 200633032 A | 9/2006 |
| TW | 201204877 A1 | 2/2012 |
| TW | 201313968 A1 | 4/2013 |
| WO | WO2010/022009 | 2/2010 |

OTHER PUBLICATIONS

U.S. Notice of Allowance dated May 5, 2015 issued in U.S. Appl. No. 13/904,283.
U.S. Notice of Allowance dated Feb. 1, 2016 issued in U.S. Appl. No. 13/904,283.
U.S. Notice of Allowance dated Aug. 2, 2016 issued in U.S. Appl. No. 13/904,283.
U.S. Office Action dated May 26, 2017 issued in U.S. Appl. No. 15/231,623.
U.S. Notice of Allowance dated Sep. 20, 2017 issued in U.S. Appl. No. 15/231,623.
Taiwan Notice of Allowance and Search Report dated Oct. 31, 2017 issued in Application No. TW 103118470.
Taiwan First Office Action dated May 31, 2018 issued in Application No. TW 106141265.
U.S. Notice of Allowance, dated Jan. 28, 2010, issued in U.S. Appl. No. 12/193,644.
U.S. Notice of Allowance, dated May 3, 2010, issued in U.S. Appl. No. 12/193,644.
U.S. Office Action, dated Mar. 22, 2011, issued in U.S. Appl. No. 12/762,275.

(56) References Cited

OTHER PUBLICATIONS

U.S. Notice of Allowance, dated Jul. 18, 2011, issued in U.S. Appl. No. 12/762,275.
U.S. Office Action, dated Aug. 27, 2013, issued in U.S. Appl. No. 13/270,897.
U.S. Notice of Allowance, dated Jan. 15, 2014, issued in U.S. Appl. No. 13/270,897.
U.S. Notice of Allowance (Supplemental Notice of Allowability), dated Feb. 25, 2014, issued in U.S. Appl. No. 13/270,897.
U.S. Office Action, dated Feb. 21, 2013, issued in U.S. Appl. No. 12/577,619.
U.S. Final Office Action, dated Sep. 23, 2013, issued in U.S. Appl. No. 12/577,619.
U.S. Notice of Allowance, dated Apr. 14, 2015, issued in U.S. Appl. No. 12/577,619.
U.S. Office Action dated Apr. 3, 2017 issued in U.S. Appl. No. 14/800,344.
U.S. Final Office Action dated Sep. 25, 2017 issued in U.S. Appl. No. 14/800,344.
U.S. Office Action dated Aug. 27, 2018 issued in U.S. Appl. No. 14/800,344.
U.S. Final Office Action dated Apr. 29, 2019 issued in U.S. Appl. No. 14/800,344.
U.S. Notice of Allowance dated Jul. 17, 2019 issued in U.S. Appl. No. 14/800,344.
PCT International Search Report and Written Opinion (ISA:KR) dated Nov. 8, 2018 in PCT/US2018/043319.
PCT International Search Report and Written Opinion dated Mar. 11, 2010 issued in PCT/US2009/054094.
PCT International Preliminary Report on Patentability and Written Opinion dated Mar. 3, 2011 issued in PCT/US2009/054094.
Chinese First Office Action dated Dec. 5, 2012 issued in CN 200980132002.3.
Chinese Second Office Action dated Aug. 9, 2013 issued in CN 200980132002.3.
Chinese Third Office Action dated Feb. 25, 2014 issued in N 200980132002.3.
Chinese Fourth Office Action dated Aug. 26, 2014 issued in CN 200980132002.3.
Chinese Fifth Office Action dated Mar. 3, 2015 issued in CN 200980132002.3.
Chinese Sixth Office Action dated Nov. 23, 2015 issued in CN 200980132002.3.
Chinese First Office Action dated Jan. 2, 2018 issued in Application No. CN 201610319106.7.
Chinese Second Office Action dated Sep. 26, 2018 issued in Application No. CN 201610319106.7.
Chinese Third Office Action dated May 30, 2019 issued in Application No. CN 201610319106.7.
Taiwan Office Action dated Jun. 24, 2014 issued in TW 098127630.
Chinese First Office Action dated Nov. 15, 2017 issued in Application No. CN 201610560655.3.
Chinese Second Office Action dated Aug. 8, 2018 issued in Application No. CN 201610560655.3.
Chinese Third Office Action dated Feb. 11, 2019 issued in Application No. CN 201610560655.3.
Li, Ya-bing, et al. (Jan. 2007) "Development Status of Copper Via-filling for PCB," Plating and Finishing, *China Academic Journal Electronic Publishing House*, 29(1)Serial No. 172:32-39 [Chinese publication, English Abstract Only].
Xiao, et al. (2002) "Preparation and performance of shape stabilized phase change thermal storage materials with high thermal conductivity," Energy Conversion and Management, vol. 43, pp. 103-108.
PCT International Preliminary Report on Patentability dated Feb. 6, 2020 in PCT/US2018/043319.

\* cited by examiner

ELECTRO-OXIDATIVE METAL REMOVAL IN THROUGH MASK INTERCONNECT FABRICATION

CROSS-REFERENCE TO RELATED APPLICATIONS

This application claims benefit under 35 U.S.C. § 119(e) to U.S. Provisional Patent Application No. 62/538,202, filed Jul. 28, 2017, titled "Electro-Oxidative Method and Apparatus for Improving Through Mask Interconnect Uniformity" naming Mayer et al. as inventors, which is herein incorporated by reference in its entirety.

FIELD OF THE INVENTION

This invention pertains to an apparatus and method for improving uniformity of metal layers using electrochemical metal removal. In one implementation, this invention pertains to an apparatus and method for improving within-wafer, within-die and/or within-feature uniformity of through mask electroplated features.

BACKGROUND

Through mask electroplating is a method for forming metal bumps and pillars in a number of processing schemes in semiconductor device fabrication. One of the standard processes that utilizes through mask electroplating involves the following steps. First, a substrate (e.g., a semiconductor substrate having a planar exposed surface) is coated with a thin conductive seed layer material (e.g., Cu, or Ni seed layer) that can be deposited by any suitable method, such as physical vapor deposition (PVD). Next, a non-conductive mask layer, such as photoresist is deposited over the seed layer and is then patterned to define recessed features, where patterning exposes the seed layer at the bottom of each recessed feature. After patterning, the exposed surface of the substrate includes portions of non-conductive mask in the field region, and conductive seed layer at the bottom portions of the recessed features.

Next, through mask electroplating (or, in the case of photoresist, through resist electroplating) follows. In through resist electroplating, the substrate is positioned in an electroplating apparatus such that electrical contact is made to the seed layer, most typically at the periphery of the substrate. The apparatus houses an anode and an electrolyte that contains ions of one or more metals, that are to be plated. The substrate is cathodically biased and is immersed into the electrolyte, where metal ions from the electrolyte are reduced at the surface of the substrate, as shown in equation (1), where M is metal (e.g., copper), and n is the number of electrons transferred during the reduction.

$$M^{n+} + ne \rightarrow M^0 \tag{1}$$

Because the conductive seed layer is exposed only at the bottom portions of the recessed features, electrochemical deposition occurs only within the recessed features, and not on the field (before the recessed features are filled with metal), resulting in a number of metal-filled recesses embedded into the photoresist layer.

After electroplating, the mask is removed, e.g., by a conventional wet or dry stripping method, thereby providing a substrate having a number of free standing metal bumps or pillars.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A method and an apparatus for improving uniformity of metal layers on semiconductor substrates, and particularly for improving uniformity of metal-filled through mask features, using electro-oxidative processes are provided. The methods and apparatuses provided herein can significantly reduce the metal thickness variability across the entire wafer, across a die, and/or within a metal-filled feature. In addition, for a goal of obtaining a metal layer having a target uniformity, throughput of a tool performing electrodeposition of metal followed by electroplanarization as described herein can be 1.5-2 fold greater in some embodiments than the throughput of a tool that is configured for electrodeposition only. Electroplanarization, in some embodiments, can be carried out at fast metal removal rates of at least about 2 µm/minute, such as between about 5-10 µm/minute, and can be performed after relatively fast electrodeposition of metal with deposition rates of at least about 1 µm/minute, such as between about 2-3 µm/minute.

In one aspect, a method for processing a semiconductor substrate is provided, where the method includes: (a) providing a semiconductor substrate having a working surface, wherein the working surface comprises an exposed metal (e.g., copper), into an apparatus configured for electrochemical metal removal; (b) anodically biasing the semiconductor substrate and immersing the working surface of the semiconductor substrate into an electrolyte; (c) electrochemically removing a portion of the exposed metal, and improving uniformity of the metal, while providing a transverse flow of the electrolyte contacting the working surface of the semiconductor substrate in a direction that is substantially parallel to the working surface of the semiconductor substrate by a method other than rotation of the semiconductor substrate. In some embodiments, rotation may contribute to the electrolyte flow, but at least some of the flow is generated using a method other than rotation. In some embodiments, the transverse flow of the electrolyte is provided for at least 50% of the time of the electrochemical metal removal.

In some embodiments, the working surface of the semiconductor substrate provided in (a) further comprises an exposed dielectric, and the exposed metal comprises a plurality of exposed metal features (e.g., through-mask features) that are connected by a conductive layer (e.g., a metal seed layer) under the exposed dielectric. For example, the working surface of the semiconductor substrate provided in (a) may include an exposed photoresist (as the exposed dielectric), and the substrate may include a plurality of copper-filled features having an aspect ratio of at least about 1:1 (the depth including both filled and unfilled portion of the feature) that are connected by a conductive layer under the exposed photoresist, wherein the copper-filled features are filled with copper to at least about 50%.

The uniformity improved by the provided electrochemical removal of metal can include one or more of a within wafer uniformity, within die uniformity, and within feature uniformity. In some embodiments, the electrochemical metal removal improves both within die uniformity and within feature uniformity.

In one implementation providing the transverse flow of the electrolyte comprises flowing the electrolyte through an inlet of the apparatus and out of the outlet of the apparatus, wherein the inlet and the outlet are positioned proximate azimuthally opposing perimeter locations of the working surface of the semiconductor substrate. In some implementations providing the transverse flow comprises forming the transverse flow with a reciprocating paddle motion. In some implementations providing the transverse flow comprises diverting a flow of the electrolyte from an impinging flow in a direction substantially perpendicular to the working surface of the semiconductor substrate to the transverse flow. In some embodiments, the transverse flow of the electrolyte is provided in a gap having a width of 10 mm or less, wherein the gap is between an ionically resistive ionically permeable element and the working surface of the substrate. In one implementation, the gap has sidewalls, an inlet and an outlet, and the electrolyte flows in the gap substantially parallel to the working surface of the substrate from the inlet to the outlet.

Preferably the transverse electrolyte flow has a velocity is at least about 3 cm/second, such as at least about 10 cm/second across a center point of the working surface of the substrate (in the electrolyte proximate the substrate center in a direction that crosses the substrate center and parallel to the working surface of the substrate). In some embodiments, the method further involves rotating the semiconductor substrate during the electrochemical metal removal at a rotation rate of between about 1 to 30 rpm.

In some embodiments, the method involves processing a substrate having a plurality of through mask features, and the method involves, prior to (a) and electrochemical metal removal, electroplating a metal into a plurality of recessed features to a thickness that is at least 10% greater than a target thickness of metal obtained after electrochemically removing the metal after (c). In some embodiments, the metal is electroplated into the plurality of recessed features to a thickness that is about 20-30% greater than the target thickness. In some embodiments the electroplating is performed in an electrolyte that is different from the electrolyte that is used in the electrochemical metal removal and in some implementations the electroplating and the electrochemical metal removal are performed in different cells.

Viscous water-based or water-containing electrolytes are preferred for the electrochemical metal removal in many embodiments. For example, in some embodiments the electrolyte is a conductive viscous liquid with a viscosity of at least about 4 centipoise, such as at least about 7 centipoise. In some examples that include viscous electrolytes the electrolyte comprises water and a concentrated viscous acid such as phosphoric acid and/or 1-hydroxyethylidene-1,1 diphosphonic acid (HEDP). In some embodiments the electrolyte is configured such that it is able to form highly supersaturated solutions of metal salts, being resistive to forming a precipitate. When a precipitate does form in such electrolyte after a long and slow process the precipitate it is in the form of fine particles of amorphous and/or hydrated material instead of large crystals. In some embodiments the electrolyte initially provided for the immersion of the semiconductor substrate in the electrochemical metal removal comprises metal ions of the same metal that is exposed on the working surface of the substrate.

In some embodiments a substrate containing through-mask recessed features is processed by first electroplating metal into recessed features on the semiconductor substrate using an electroplating electrolyte comprising a metal salt, an acid, and at least one electroplating additive selected from the group consisting of a leveler and a suppressor, followed by electrochemically removing metal and improving uniformity as described herein, wherein the electrolyte used during the electrochemical metal removal is different from the electroplating electrolyte, and has a viscosity of at least about 4 centipoise. In some embodiments the viscosity of the electrolyte used for the electrochemical metal removal is at least 2 times greater than the viscosity of the electrolyte used for electroplating. In some embodiments the electrolyte used for the electrochemical metal removal is free from electrochemical suppressors and levelers.

In some embodiments electrochemically removing the portion of the exposed metal comprises: (i) selecting a regime for the electrochemical metal removal from a regime selected from the group consisting of an electroetching below a critical potential, electropolishing above the critical potential, and electroetching below the critical potential followed by electropolishing above the critical potential; and (ii) electrochemically removing a portion of the metal in the selected regime to improve the uniformity of the metal. The electrochemical removal of the portion of the exposed metal preferably includes monitoring a potential proximate the semiconductor substrate using a reference electrode.

In some embodiments electrochemically removing the portion of the exposed metal includes maintaining the concentration of metal ions in the electrolyte solution at a target level, such that the concentration of metal ions does not fluctuate by more than about 5% from the target level during the course of electrochemical removal of the metal from the substrate. In some embodiments, the method further includes, after electrochemical metal removal from one substrate, sequentially electrochemically removing metal from a plurality of semiconductor substrates in the same electrochemical metal removal apparatus while improving metal uniformity and while maintaining a concentration of metal ions in the electrolyte solution at a target level, such that the concentration of metal ions does not fluctuate by more than about 5% from the target level during the course of electrochemical removal of the metal from the plurality of substrates.

The diffusion coefficient for the metal to be removed is one of important parameters for determining the general behavior and for controlling the electrochemical metal removal processes described herein. The diffusion coefficient influences both the rate of metal removal and the potentials for the electropolishing transition. The diffusion coefficient of an ion, and the solution viscosity, are strongly related, as illustrated by the Stokes-Einstein equation as described in more detail below. From that relationship, it can be seen that there is generally an inverse relationship between viscosity and diffusivity. For example, increases in viscosity cause diffusivity to decrease. The diffusion coefficient (and the related ionic species mobility) are important physicochemical properties that determine the diffusive mass transfer inside a feature and in a mass transfer boundary layer. Viscosity is also the physicochemical property that determines the distribution and intensity of electrolyte flow velocity, and therefore is important for determining size of mass transfer boundary layers and the intensity of flow inside a feature, as well as the general mass transfer convection to and from a wafer undergoing processing.

In some embodiments electrochemical metal removal comprises controlling electrolyte viscosity, which is one of the key physicochemical properties in this process. In some embodiments, the viscosity control is performed by measuring the viscosity directly (e.g., using a viscometer), and adjusting the viscosity (e.g., by adding or removing electrolyte fluid). In some embodiments viscosity is controlled by measuring other macroscopic variables that correlate with viscosity and can be easily and reliably monitored. Such macroscopic properties include but are not limited to solution conductivity, density, optical absorption, visible spectra, UV spectra, IR spectra, solution refractive index, or speed of sound. The measured properties can be correlated to viscosity or the measured values can be kept close to the target values without performing the correlation to viscosity after each measurement. In some embodiments, a combination of these approaches can be used, or both In some embodiments, the electrolyte control methods include measuring the concentration of each of the electrolyte species and keeping their values at the target value (e.g., within about 10% or within about 5% of the target value), such that the viscosity is on target. In some embodiments electrochemically removing the portion of the exposed metal comprises maintaining the viscosity of the electrolyte solution at a target level, such that the viscosity does not fluctuate by more than a pre-determined amount from the target level during the course of electrochemical removal of the metal from the substrate. The viscosity is dependent on the water content, acid content, and/or metal ion content of the electrolyte solution. More water tends to decrease the viscosity, while higher acid or metal tends to increase the viscosity. In some embodiments where the electrolyte viscosity is low, the methods involve removing water (e.g. by evaporation) to restore the viscosity to target levels. In some cases the electrolyte viscosity is maintained by keeping the concentrations of all constituents constant over time (e.g. by replacing electrolyte constituents that have a concentration below the target concentration, and by replacing electrolyte with having off-target properties with an electrolyte having component concentrations within the target specifications). In other cases, acid and/or metal ions can be added to maintain the viscosity of the electrolyte using two separate solutions, where the first solution has a higher concentration of acid than the second solution, and the second solution has a higher concentration of metal ions than the first solution. The cathode material used during electrochemical metal removal and metal removal conditions, in some embodiments, leads to generation of hydrogen ($H_2$) at the cathode during electrochemical metal removal. In some embodiments, the cathode material and metal removal conditions lead to electrodeposition of metal on the electrode, due to reduction of metal ions from the electrolyte. In some embodiments, both $H_2$ generation at the cathode and electrodeposition of metal onto the cathode are present during electrochemical metal removal from the substrate. In one implementation the anodically biased substrate and the cathode are separated by an ionically permeable separator that prevents hydrogen bubbles and/or metal particles generated at the cathode from contacting the substrate. In some embodiments electrochemically removing the portion of the metal comprises generating $H_2$ at a cathode of the electrochemical metal removal apparatus, and separating $H_2$ from the electrolyte without allowing $H_2$ to contact the semiconductor substrate. In one implementation the electrochemical metal removal apparatus comprises an ionically permeable separator configured to block $H_2$ bubbles from moving from a cathode chamber to an anode chamber. In some embodiments the method, further comprises diluting the $H_2$ with an inert gas in a stilling chamber and removing the diluted $H_2$ from the stilling chamber. One implementation comprises recirculating the electrolyte during the electrochemical metal removal using one or more recirculation loops, wherein the one or more recirculation loops comprise a stilling chamber configured for separating hydrogen bubbles from the electrolyte and an electrolyte reservoir. In one example the stilling chamber and the reservoir are positioned in one assembly.

In some embodiments the electrochemical removal of a portion of the metal from the anodically biased substrate comprises electrodepositing metal from a metal-containing electrolyte onto the cathode. For example, when copper is removed from the substrate, copper may be electrodeposited onto the cathode from the electrolyte. In some embodiments that involve electrodeposition of metal onto the cathode, the apparatus also employs an ionically permeable separator between the anodically biased substrate and the cathode, creating an anode chamber and a cathode chamber. The apparatus is configured in one implementation to direct electrolyte flow through the cathode or proximate the cathode and to block particles from reaching the wafer substrate. The particles are blocked by an ionically conductive membrane (or membrane that becomes ionically conductive when wetted with electrolyte) that helps in directing the fluid to flow out of the cathode chamber via an outlet from the cathode chamber and/or through the membrane. In one embodiment the provided method also comprises recirculating the electrolyte during the electrochemical metal removal using one or more recirculation loops, wherein the one or more recirculation loops comprise an external bath reservoir, a pump, a filter, and optionally, a degasser (an apparatus for removing dissolved gases such as nitrogen and oxygen).

Provided methods can be useful for improving uniformity on a number of substrates, but are particularly useful for substrates having regions with variable feature density, as well as for substrates having features of variable aspect ratios and/or widths. In one embodiment the semiconductor substrate provided in (a) comprises a plurality of through mask features, wherein the substrate comprises at least one isolated feature and at least two dense features, wherein a first dense feature is spaced apart from its nearest feature by a first distance, and a first isolated feature is spaced apart from its nearest feature by a second distance that is at least two times greater than the first distance. In one embodiment the semiconductor substrate provided in (a) comprises a plurality of through mask features, and comprises a first through mask feature having a first width and a second through mask feature having a different, second width. In one embodiment the semiconductor substrate provided in (a) comprises a plurality of through mask features, and comprises a first through mask feature having a first aspect ratio of a recess and a second through mask feature having a different, second aspect ratio of a recess. In one example the difference in aspect ratios of recesses is a difference in effective aspect ratios, obtained due to a variation of topography in underlying layers. In some embodiments, the semiconductor substrate provided in (a) comprises a plurality of through mask features, and comprises a first through mask feature having a first width and a first aspect ratio of a recess, a second through mask feature having a second width and a second aspect ratio of a recess, a third through mask feature having a third width and a third aspect ratio of a recess and a fourth through mask feature having a fourth width and a fourth aspect ratio of a recess, where the second width is different from the first width and the fourth aspect ratio of the recess is different from the third aspect ratio of the recess.

In another aspect a method for processing a semiconductor substrate is provided, where the method includes: (a) providing a semiconductor substrate having a working surface, wherein the working surface comprises a plurality of through mask metal features, into an apparatus configured for electrochemical metal removal; (b) selecting a regime for the electrochemical metal removal from the group consisting of an electroetching below a critical potential, electropolishing above the critical potential, and electroetching below the critical potential followed by electropolishing above the critical potential; and (c) electrochemically removing a portion of the metal from the through mask metal features in the selected regime while improving the uniformity of the metal.

In another aspect a method for processing a semiconductor substrate is provided, where the method includes: (a) providing a semiconductor substrate having a working surface, wherein the working surface comprises an exposed metal, into an apparatus configured for electrochemical metal removal; (b) anodically biasing the semiconductor substrate and immersing the working surface of the semiconductor substrate into an electrolyte; and (c) electrochemically removing a portion of the metal while improving the uniformity of the metal by removing metal in an electroetching regime below a critical potential, followed by removing metal in an electropolishing regime above the critical potential. In one implementation, the metal is copper, and the electrochemical metal removal comprises electroetching at a potential of between about 0.1 V-0.7 V followed by electropolishing at a potential of between about 0.7 V-2.0 V, wherein the potential is measured relative to a copper reference electrode, and where the potential used during electropolishing is greater than the potential used during electroetching.

In another aspect a method for processing one or more semiconductor substrates is provided, where the method includes: (a) providing a semiconductor substrate having a working surface, wherein the working surface comprises an exposed metal, into an apparatus configured for electrochemical metal removal; (b) anodically biasing the semiconductor substrate and immersing the working surface of the semiconductor substrate into an electrolyte solution; (c) electrochemically removing at least a portion of metal from the semiconductor substrate by electrochemically dissolving the metal into the electrolyte solution while improving uniformity of the metal; and (d) maintaining the concentration of metal ions in the electrolyte solution at a target level, such that the concentration of metal ions does not fluctuate by more than about 5% from the target level during the course of electrochemical removal of the metal from the substrate.

In another aspect, a method for processing one or more semiconductor substrates is provided, where the method includes: (a) providing a semiconductor substrate having a working surface, wherein the working surface comprises an exposed metal, into an apparatus configured for electrochemical metal removal; (b) anodically biasing the semiconductor substrate and immersing the working surface of the semiconductor substrate into an electrolyte solution; (c) electrochemically removing at least a portion of metal from the semiconductor substrate by electrochemically dissolving the metal into the electrolyte solution while improving uniformity of the metal; and (d) maintaining the viscosity of the electrolyte solution at a target level, such that the viscosity of the electrolyte solution does not fluctuate by more than a pre-determined amount from the target level during the course of electrochemical removal of the metal from the substrate.

In another aspect a method for processing one or more semiconductor substrates is provided, where the method comprises: (a) providing a semiconductor substrate having a working surface, wherein the working surface comprises an exposed metal, into an apparatus configured for electrochemical metal removal; (b) anodically biasing the semiconductor substrate and immersing the working surface of the semiconductor substrate into an electrolyte, wherein the electrolyte comprises ions of the same metal that is to be removed from the semiconductor substrate at a concentration of at least about 10 g/L; and (c) electrochemically removing a portion of the metal from the semiconductor substrate by electrochemically dissolving the metal into the electrolyte solution, while improving uniformity of the metal.

In another aspect, a method for processing one or more semiconductor substrates is provided, where the method includes: (a) providing a semiconductor substrate having a working surface, wherein the working surface comprises an exposed metal, into an apparatus configured for electrochemical metal removal; (b) anodically biasing the semiconductor substrate and immersing the working surface of the semiconductor substrate into the electrolyte; and (c) electrochemically removing a portion of the metal from the semiconductor substrate, while improving uniformity of the metal, while generating $H_2$ at a cathode of the electrochemical metal removal apparatus and while blocking $H_2$ bubbles from contacting the anodically biased semiconductor substrate.

In another aspect, a method for processing one or more semiconductor substrates is provided, where the method includes: (a) providing a semiconductor substrate having a working surface, wherein the working surface comprises an exposed metal, into an apparatus configured for electrochemical metal removal; (b) anodically biasing the semiconductor substrate and immersing the working surface of the semiconductor substrate into the electrolyte; and (c) electrochemically removing a portion of the metal from the semiconductor substrate, while improving uniformity of the metal, wherein the apparatus comprises an anode chamber housing the anodically biased substrate and a cathode chamber housing a cathode, wherein the chambers are separated by an ionically permeable membrane. In one embodiment, the method includes electrodepositing metal onto the cathode while metal is being electrochemically removed from the substrate. In another aspect a method for processing a semiconductor substrate is provided, where the method includes: (a) providing a semiconductor substrate having a plurality of through mask metal features, into an apparatus configured for electrochemical metal removal; (b) anodically biasing the semiconductor substrate and immersing the working surface of the semiconductor substrate into the electrolyte; (c) electrochemically removing a portion of the metal from the through mask metal features, such that metal thickness variation within individual through mask features is reduced.

In another aspect a method for processing a semiconductor substrate is provided, where the method comprises: (a) providing a semiconductor substrate having a plurality of through mask recessed features and having an exposed conductive seed layer at a bottom of each through mask feature, into an electroplating apparatus; (b) at least partially filling the through mask recessed features with a metal in the electroplating apparatus using an electrolyte comprising a metal salt, an acid and one or more electroplating additives configured for improving uniformity of electroplating, wherein a ratio of a fill rate in a first through mask feature to a fill rate in the second through mask feature is R1; (c) transferring the substrate to an apparatus configured for electrochemical metal removal; and (d) improving the uniformity of the electroplated metal by electrochemically removing a portion of the metal from the through mask metal features, in an electrolyte that has a viscosity of at least about 4 centipoise and that is different from the electroplating electrolyte, wherein a ratio of an electrochemical metal removal rate in the first through mask feature to an electrochemical metal removal rate in the second through mask feature is greater than R1.

Provided methods can be integrated with the photolithographic techniques used for patterning of layers on a semiconductor substrate. In some embodiments provided methods further include: applying photoresist to the semiconductor substrate; exposing the photoresist to light; patterning the photoresist and transferring the pattern to the semiconductor substrate; and selectively removing the photoresist from the semiconductor substrate.

In another aspect an apparatus for electrochemically removing metal from a semiconductor substrate is provided, where the apparatus includes: (a) a vessel configured for holding an electrolyte and a cathode during electrochemical metal removal from the semiconductor substrate; (b) a semiconductor substrate holder configured to hold the semiconductor substrate such that a working surface of the semiconductor substrate is immersed into the electrolyte and is separated from the cathode during the electrochemical removal of metal from the semiconductor substrate; (c) a mechanism configured to provide a transverse flow of electrolyte contacting the working surface of the semiconductor substrate in a direction that is substantially parallel to the working surface of the semiconductor substrate, wherein the mechanism is different from a mechanism for rotating the semiconductor substrate; and (d) a reference electrode for measuring a potential proximate the semiconductor substrate or an equivalent potential.

In another aspect an apparatus for electrochemically removing metal from a semiconductor substrate is provided, where the apparatus includes: (a) a vessel configured for holding an electrolyte and a hydrogen-generating cathode during electrochemical metal removal from an anodically biased semiconductor substrate, the vessel comprising an anode chamber configured to house the anodically biased semiconductor substrate and a cathode chamber configured to house the hydrogen-generating cathode; (b) an ionically permeable separator between the anode chamber and the cathode chamber, wherein the ionically permeable separator is configured to inhibit or prevent transfer of hydrogen bubbles from the cathode chamber to the anode chamber; (c) a semiconductor substrate holder configured to hold the anodically biased semiconductor substrate such that a working surface of the semiconductor substrate is immersed into the electrolyte and is separated from the gas-generating cathode during the electrochemical removal of metal from the semiconductor substrate; and (d) a stilling chamber fluidically connected with the cathode chamber, wherein the stilling chamber is configured to receive a catholyte from the cathode chamber and to segregate and remove hydrogen bubbles from the received electrolyte.

In another aspect, an apparatus for electrochemically removing metal from a semiconductor substrate is provided, where the apparatus includes: (a) an anode chamber configured to house an anodically biased semiconductor substrate during electrochemical metal removal from the semiconductor substrate, wherein the anode chamber has at least one inlet for introducing a fluid to the anode chamber; (b) a cathode chamber configured to house a cathode, wherein the cathode chamber has at least one inlet for introducing a fluid into the cathode chamber; and (c) an ionically permeable separator between the anode chamber and the cathode chamber.

In another aspect an apparatus for electrochemically removing metal from a semiconductor substrate is provided, where the apparatus includes: (a) a vessel configured for holding an electrolyte and a cathode substrate during electrochemical metal removal from an anodically biased semiconductor substrate, the vessel comprising an anode chamber configured to house the anodically biased semiconductor substrate and a cathode chamber configured to house a cathode onto which the same metal species that is removed from the semiconductor substrate is electrodeposited; (b) an ionically permeable separator between the anode chamber and the cathode chamber; (c) a semiconductor substrate holder configured to hold the anodically biased semiconductor substrate such that a working surface of the semiconductor substrate is immersed into the electrolyte and is separated from the cathode during the electrochemical removal of metal from the semiconductor substrate; and (d) an electrolyte recirculation loop that is fluidically connected with the cathode chamber, and is configured to receive a catholyte from the cathode chamber, and filter the catholyte.

In another aspect an apparatus for electrochemically removing metal from a semiconductor substrate is provided, where the apparatus includes: (a) a vessel configured for holding an electrolyte and a cathode during electrochemical metal removal from the semiconductor substrate, the vessel comprising an anode chamber configured to house the semiconductor substrate, wherein the apparatus is configured to anodically bias the semiconductor substrate during the electrochemical metal removal, and a cathode chamber configured to house the cathode; (b) an ionically permeable separator between the anode chamber and the cathode chamber; and (c) a semiconductor substrate holder configured to hold the anodically biased semiconductor substrate such that a working surface of the semiconductor substrate is immersed into the electrolyte and is separated from the gas-generating cathode during the electrochemical removal of metal from the semiconductor substrate; wherein the apparatus is configured to add fluid to the cathode chamber through an inlet in the cathode chamber. In some embodiments, the cathode is a hydrogen-generating cathode, and the ionically permeable separator blocks hydrogen from coming into contact with the substrate. In some embodiments, the ionically permeable separator blocks particles that can be generated at the cathode from contacting the substrate.

In another aspect an apparatus for electrochemically removing metal from a semiconductor substrate is provided, where the apparatus comprises: (a) a vessel configured for holding an electrolyte and a cathode during electrochemical metal removal from the semiconductor substrate, the vessel comprising an anode chamber configured to house the semiconductor substrate, wherein the apparatus is configured to anodically bias the semiconductor substrate during the electrochemical metal removal, and a cathode chamber configured to house the cathode; (b) an ionically permeable separator between the anode chamber and the cathode chamber; (c) a semiconductor substrate holder configured to hold the anodically biased semiconductor substrate such that a working surface of the semiconductor substrate is immersed into the electrolyte and is separated from the gas-generating cathode during the electrochemical removal of metal from the semiconductor substrate; wherein the apparatus comprises an anolyte recirculation loop and a catholyte recirculation loop, the loops having a shared portion, wherein the apparatus is configured to separately deliver defined amounts of electrolyte from the shared portion of the loops to the anode chamber and to the cathode chamber. In another implementation, the anolyte recirculation loop and the catholyte recirculation loop have a shared portion, but the apparatus is configured to separately deliver defined amounts of electrolyte from non-shared portions of the loop to the anode chamber and to the cathode chamber. For example, anolyte recirculation loop may have a dedicated electrolyte reservoir fluidically connected to the anolyte chamber, and the catholyte recirculation loop may have a separate electrolyte reservoir fluidically connected to the catholyte chamber. Yet, in other embodiments the anolyte recirculation loop and the catholyte recirculation loop do not have shared portions.

In another aspect an apparatus for electrochemically removing metal from a semiconductor substrate is provided, where the apparatus includes: (a) a vessel configured for holding an electrolyte and a cathode during electrochemical metal removal from a semiconductor substrate, wherein the apparatus is configured to anodically bias the semiconductor substrate during the electrochemical metal removal; (b) a semiconductor substrate holder configured to hold the semiconductor substrate such that a working surface of the semiconductor substrate is immersed into the electrolyte and is separated from the cathode during the electrochemical removal of metal from the semiconductor substrate; (c) an inlet in the vessel for adding a diluent to the vessel; (d) an outlet in the vessel for removing the electrolyte from the vessel; and (e) at least two measuring devices for measuring concentrations of metal ions and of an acid in the electrolyte during the electrochemical metal removal.

In another aspect, an apparatus is provided, where the apparatus includes a vessel configured for the electrochemical metal removal and a controller comprising program instructions for performing any of the methods provided herein.

In another aspect a system is provided, where the system includes any of the apparatuses provided herein and a stepper.

In another aspect a system is provided, where the system includes an electroplating apparatus and any of the apparatuses for electrochemical metal removal described herein.

In another aspect a non-transitory computer readable media is provided that includes code for performing any of the methods provided herein.

In another aspect, a cathode for electrochemical metal removal is provided, where the cathode includes: (a) a plurality of channels, where the channels are configured for passing an electrolyte through the body of the cathode; and (b) a plurality of indentations at the edge of the cathode. The cathode, in some embodiments, has a generally disc-shaped body. The channels, in some embodiments, are fitted with non-conductive tubes that extend above the conductive surface of the cathode.

In another aspect, a cathode for electrochemical metal removal is provided, where the cathode has a generally disc-shaped body and includes a plurality of non-conductive fixation elements on a conductive surface of the cathode, wherein the fixation elements are configured for being attachable to one or more handles. Such cathode can be easily removed from the apparatus after metal has electrodeposited on its surface. The non-conductive fixation elements, in some embodiments are disposed at different radial positions of the generally disc-shaped cathode.

In another aspect, an apparatus for electrochemical metal removal is provided, wherein the apparatus includes a vessel holding a cathode as described herein.

In another aspect, a method of making an electrolyte for the electrochemical metal removal is provided. The method involves, in some embodiments, dissolving metal oxide and/or metal hydroxide in phosphoric acid; and then combining a solution obtained after dissolution of metal oxide and/or hydroxide with a more concentrated phosphoric acid and forming an electrolyte having a viscosity of at least about 4 centipoise. These and other features and advantages of the present invention will be described in more detail below with reference to the associated drawings.

DETAILED DESCRIPTION

Figure 1A:
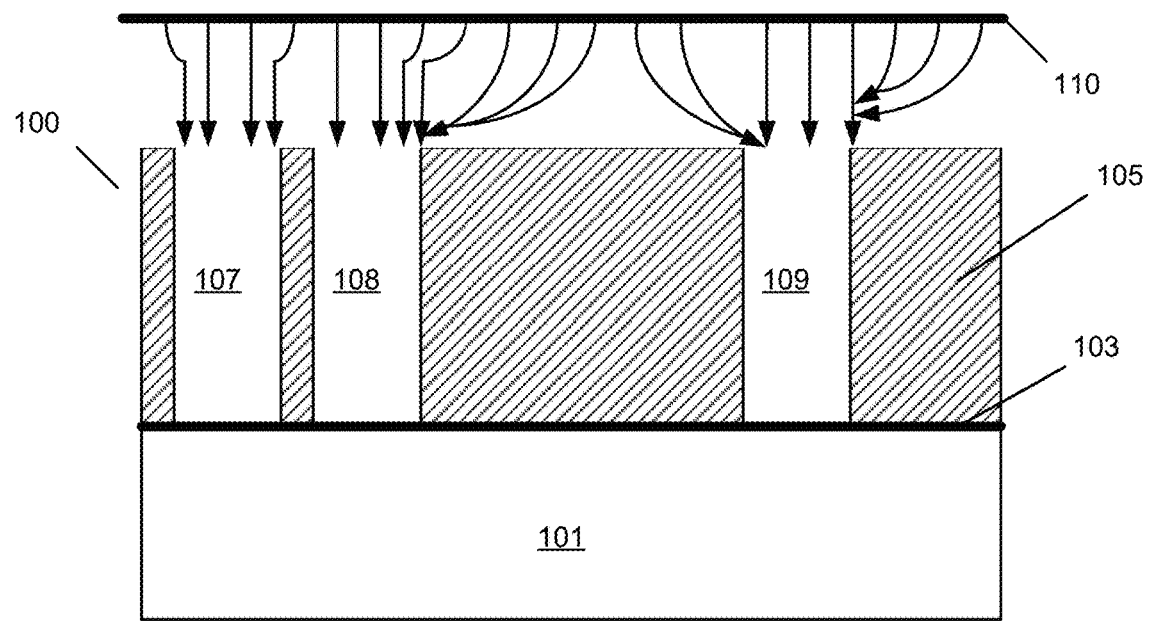
FIGS. 1A-1D are schematic cross-sectional views of a substrate undergoing processing according to an embodiment provided herein.

In the following detailed description, numerous specific implementations are set forth in order to provide a thorough understanding of the disclosed implementations. However, as will be apparent to those of ordinary skill in the art, the disclosed implementations may be practiced without these specific details or by using alternate elements or processes. In other instances, well-known processes, procedures, and components have not been described in detail so as not to unnecessarily obscure aspects of the disclosed implementations.

Methods and apparatuses for improving uniformity of metal layers on semiconductor substrates, are provided. In this description, the term "semiconductor wafer" or "semiconductor substrate" refers to a substrate that has semiconductor material anywhere within its body, and it is understood that the semiconductor material does not need to be exposed. The semiconductor substrate may include one or more dielectric and conductive layers formed over the semiconductor material. A wafer used in the semiconductor device industry is typically a circular semiconductor substrate. Examples include wafers having a diameter of 200 mm, or 300 mm, or 450 mm. The following detailed description describes deposition and etching on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

Methods provided herein can be used to improve uniformity of a variety of metal layers, particularly metals that are easily amenable to electrochemical dissolution, such as Cu, Ni, Co, Sn, and alloys that include these metals. In some embodiments more noble metals and alloys that include these metals, such as Pd, Pt, Ag, Rh, Ru, Ir, and Au, are electroplanarized using provided methods. One example of an alloy that can be electroplanarized using provided methods is a tin silver alloy (e.g., an alloy containing 5 atomic % or less of silver).

Electrochemical dissolution occurs, according to reaction shown in equation (2), when the semiconductor substrate is anodically biased:

$$M^0 \rightarrow M^{n+} + ne^- \qquad (2)$$

The apparatus for the electrochemical metal removal, further includes a cathode electrically connected to a power supply, where the apparatus is configured to be negatively bias the anode during the electrochemical metal removal. The cathode reduces metal from the electrolyte, which typically is then plated on the surface of the cathode and/or generates $H_2$ by reducing protons from the electrolyte. In some embodiments the cathode is selected such as to substantially exclusively generate $H_2$ without significantly reducing metal ions. In other embodiments the cathode is selected such as to substantially exclusively reduce metal ions without generating $H_2$. Yet in other embodiments, both generation of $H_2$ and reduction of metal ions can occur at the cathode in significant amounts. As used herein, the cathodes that predominantly cause other reactions than metal ion reduction (e.g., predominantly generate $H_2$) are referred to as inert cathodes, whereas the cathodes that predominantly reduce metal ions to metal are referred to as active cathodes. Inert cathodes typically include a metal that contributes to catalytic hydrogen generation, such as platinum. An active cathode typically can have any plateable surface, such as stainless steel surface, copper surface, etc. It is noted that the process conditions, such as electrolyte concentration and the power provided to the cathode can affect the balance between hydrogen generation and metal ion reduction reactions. For example, metal ion reduction is more favored when electrolytes having higher concentrations of metal are used.

The terms "electrochemical metal removal", and "electrochemical etch-back" are used herein interchangeably and refer to an electrochemical dissolution of metal from an anodically biased substrate. "Electroplanarization" is used herein as a general term for an electrochemical metal removal accompanied with an improvement in any type of uniformity (i.e. reduction in any type of metal thickness variation, including thickness variation on a wafer level, die level, and feature level). Electrochemical metal removal and electroplanarization can be performed in distinct "electroetching" and "electropolishing" regimes, which will be discussed herein in detail.

The term "feature" as used herein can refer to an unfilled, partially filled, or completely filled recess on a substrate, as would be clear from the context. Through mask features refer to unfilled, partially filled or completely filled recessed features formed in a dielectric mask layer, such as in a photoresist layer, wherein the mask layer is intended to be subsequently removed. Through mask features have a conductive seed layer at the bottom. In other words substrates with unfilled or partially filled through mask features include an exposed discontinuous metal layer and an exposed dielectric layer, where the exposed discontinuous metal layer is electrically connected by a conductive layer underneath the dielectric layer.

In one aspect, apparatuses and methods for improving uniformity of through mask features are provided. While provided methods and apparatuses are particularly advantageous for improving uniformity of discontinuous metal layers (such as through mask metal features), and will be primarily described with reference to through resist features, they can also be used for improving uniformity of continuous metal layers. The methods in some embodiments involve electrochemically removing metal from the semiconductor substrate having a non-uniformity in the metal layer, where the electrochemical etch back improves, for example, at least one of a within-die uniformity, within-feature uniformity and within-wafer uniformity, where uniformity generally refers to metal thickness variation, and improvement involves reducing metal thickness variability of at least one type. Unlike chemical mechanical polishing (CMP), provided electrochemical methods do not rely on the use of a mechanical pad, physical contact with solid polishing instruments, and/or abrasive slurries for uniformity improvement, but use one or more of electrolyte fluid dynamics, electrolyte composition, and specific electrochemical regimes to achieve improvement of uniformity during metal removal. One unique feature of this process is that it can enable improvements in the intra-feature, feature to feature, and global thickness uniformity while the features remain recessed within the masking layer (e.g., in partially-filled features), and therefore while they are inaccessible to the action of CMP-like mechanical abrasion. An additional advantageous feature, in some embodiments, is the absence of physical forces from interaction with solid polishing instruments exerted on the surface or features of the substrate. Abrasive forces exerted on isolated features in the absence of supporting materials between them lead to a large mechanical shear force on the individual pillars and lines, often causing the pillars and lines to be damaged in the polishing process.

Improvement of uniformity of through mask features can be performed during fabrication of a variety of packaging interconnects with features of various sizes, including copper wires, redistribution lines (RDL), and pillars of different sizes, including micro-pillars, standard pillars and integrated high density fanout (HDFO) and megapillars. The feature widths can range widely, with the methods being particularly useful for larger features, such as for features with widths from about 1-300 µm, such as from 5 µm (RDL) to about 200 µm (megapillars). For example, the methods can be used during fabrication of a substrate with a plurality of micropillars having widths of about 20 µm, or a substrate with a plurality of megapillars having widths of about 200 µm. The aspect ratios of features can vary, and in some embodiments are from about 1:2 (height to width) to 2:1, and higher.

Provided methods are highly advantageous for planarizing substrates that contain a plurality of features with different diameters and pitches (also referred to as critical dimensions (CD)). In some embodiments, the substrate contains a first feature having a first diameter and a second feature that has a second, different diameter (e.g., a diameter that is at least 10%, 50%, or 100% greater than the first diameter). In some embodiments the methods are used to electroplanarize a substrate having a plurality of features having different aspect ratios. For example, the substrate may contain a first feature having a first aspect ratio, and a second feature having a second, different aspect ratio (e.g., the second aspect ratio may be at least 10%, 50% or 100% greater than the first aspect ratio). In some embodiments the substrate may include a plurality of features having different effective aspect ratios due to a variation in the underlying topography on the substrate. For example, if the substrate contains two features with 1:1 aspect ratios disposed on a slanted underlying surface, the feature disposed on a thicker part of the surface would be a higher-lying feature and will have a lower effective aspect ratio than the feature disposed on a thinner part of the surface. In some embodiments, the provided electroplanarization methods are used on substrates that have lower-lying and higher-lying features due to variation in topography underlying the features, e.g., a first feature having a first effective aspect ratio and a second feature having a second, different effective aspect ratio (e.g., the second effective aspect ratio may be at least 10%, 50% or 100% greater than the first effective aspect ratio). The term "aspect ratio" as used herein is a general term that encompasses both the actual aspect ratio (height to width ratio) and effective aspect ratio (effective height measured from feature bottom to the lowest plane of the field to width ratio).

In addition, provided methods are uniquely suited for electroplanarizing substrates that contain features with both diameter variability and aspect ratio variability. These substrates are particularly difficult to process, achieving desired uniformity, using conventional methods. In some embodiments the methods are used on a substrate that contains a first feature having a first diameter and a first aspect ratio and a second feature having a second diameter and a second aspect ratio, where the second diameter is different from the first diameter (e.g., at least 10%, 50%, or 100% greater than the first diameter), and the second aspect ratio is different from the first aspect ratio (e.g., at least 10%, 50%, or 100% greater than the first aspect ratio). In some embodiments the methods are used on a substrate that contains a first feature having a first diameter and a first aspect ratio, a second feature having a second diameter and a second aspect ratio, a third feature having a third diameter and a third aspect ratio, and a fourth feature having a fourth diameter and a fourth aspect ratio, where the second diameter is different from the first diameter (e.g., at least 10%, 50%, or 100% greater than the first diameter), and the fourth aspect ratio is different from the third aspect ratio (e.g., at least 10%, 50%, or 100% greater than the first aspect ratio).

In some embodiments, provided methods are particularly useful for substrates having a plurality of dense features and one or more isolated features. For example, in some embodiments the substrate contains a first feature (dense feature) spaced apart by a first distance from its nearest feature, and a second feature (isolated feature) spaced apart by a second distance from its nearest feature, where the second distance is at least 2 times, such as at least 3 times, or at least 5 times greater than the first distance. The distance is measured from a center of a first or second feature to the centers of their corresponding neighboring features. In addition, provided methods are particularly useful for substrates containing features of different sizes. For example, the substrate may contain a first feature having a first width and a feature having a second width that is at least about 1.1 times, such as at least 1.2 times, or at least 2 times greater than the first widths. In more unusual cases, the second width may be at least 20 times greater than the second width, or larger. One example of a substrate having features with different widths is a wafer with a plurality of WLP features, containing a first feature having a first width, and another feature that is about 1.1-1.5 times wider than the first feature. Another example of a substrate with features having variable width is a substrate having an RDL pattern, where the pattern includes a first feature having a first width (e.g., a line) and a second feature having a second width (e.g., a pad), where the second width is up to 20 times greater than the first width (e.g., between about 5-20 times greater). For example, an RDL pattern may include 5 μm wide line and a 100 μm wide pad.

Substrates with a significant variability in the feature density, such as dense regions of features with other regions of largely isolated features, and substrates with features having a range of different widths, particularly benefit from provided methods because in these substrates variability in metal thickness distribution after electroplating is exacerbated due to variability of ionic current distribution during electroplating.

Figure 1B:
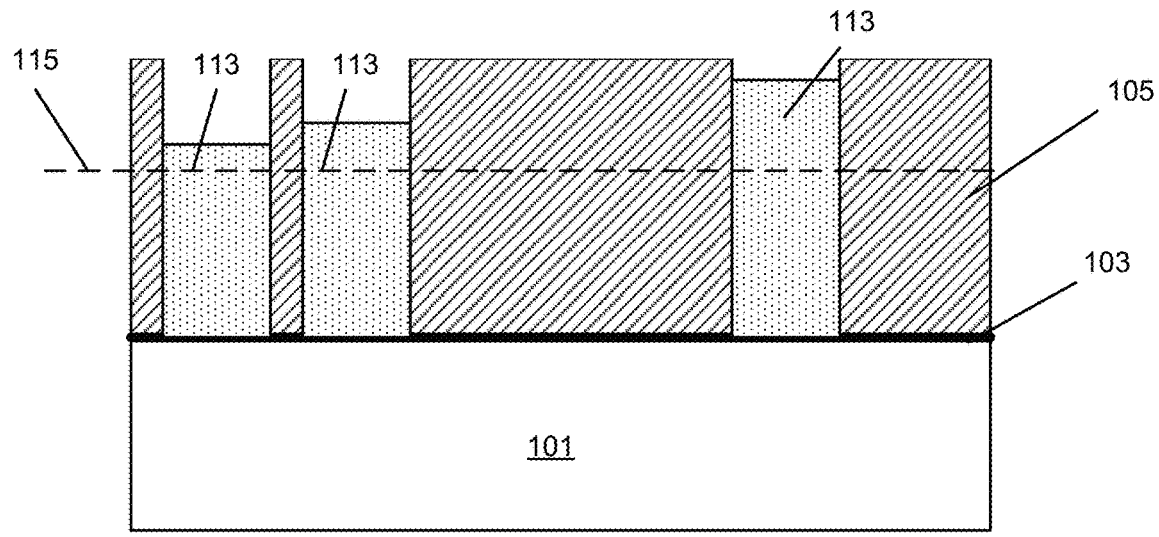

FIGS. 1A-1D illustrate this problem for a substrate having an isolated feature and provide an example of a process flow illustrating one type of non-uniformity that can be encountered in through mask electroplating, and the use of electrooxidative metal removal method to improve this non-uniformity. FIGS. 1A-1D show schematic cross-sectional presentations of a portion of a semiconductor substrate undergoing processing. FIG. 2A is a process flow diagram illustrating several steps of the process depicted in FIGS. 1A-1D. Referring to FIG. 2A, the process starts in 201 by providing a substrate having through mask features. FIG. 1A illustrates a cross-sectional view of a portion of one such substrate 100, where the substrate includes layer 101 (e.g., a dielectric layer, such as silicon oxide), having a conductive seed layer 103, such as a copper layer, disposed thereon. It is understood that layer 101 may reside over one or more other layers (not shown), which may include adhesion or "stick" layers (Ta, TaN, W, WN, Ti, TiN, TiW, etc), and semiconductor material, such as Si, Ge, SiGe, etc. A patterned non-conductive mask layer 105 (e.g., photoresist) resides on the seed layer 103, and has a plurality of recessed features formed in the mask such the conductive seed layer material is exposed at the bottom portions of the recessed features. These features are referred to as through mask recessed features. FIG. 1A shows two recessed features 107 and 108 that are disposed proximate each other and an isolated recessed feature 109 at a greater distance from the closest recess 108. The substrate shown in FIG. 1A can be obtained by providing a semiconductor substrate having an exposed layer 101 (e.g., a dielectric layer); depositing a conductive layer over the exposed layer by any suitable method (e.g., a conductive copper seed layer can be deposited by PVD); depositing a mask layer over the seed layer (e.g., spin-coating a photoresist mask), and patterning the mask using, for example, a photolithographic technique, to define the through mask recessed features 107, 108, and 109. The dimensions of the recessed features will vary depending on an application, and typically have widths of between about 5-250 μm, and aspect ratios of between about 1:2-15:1.

Figure 2A:
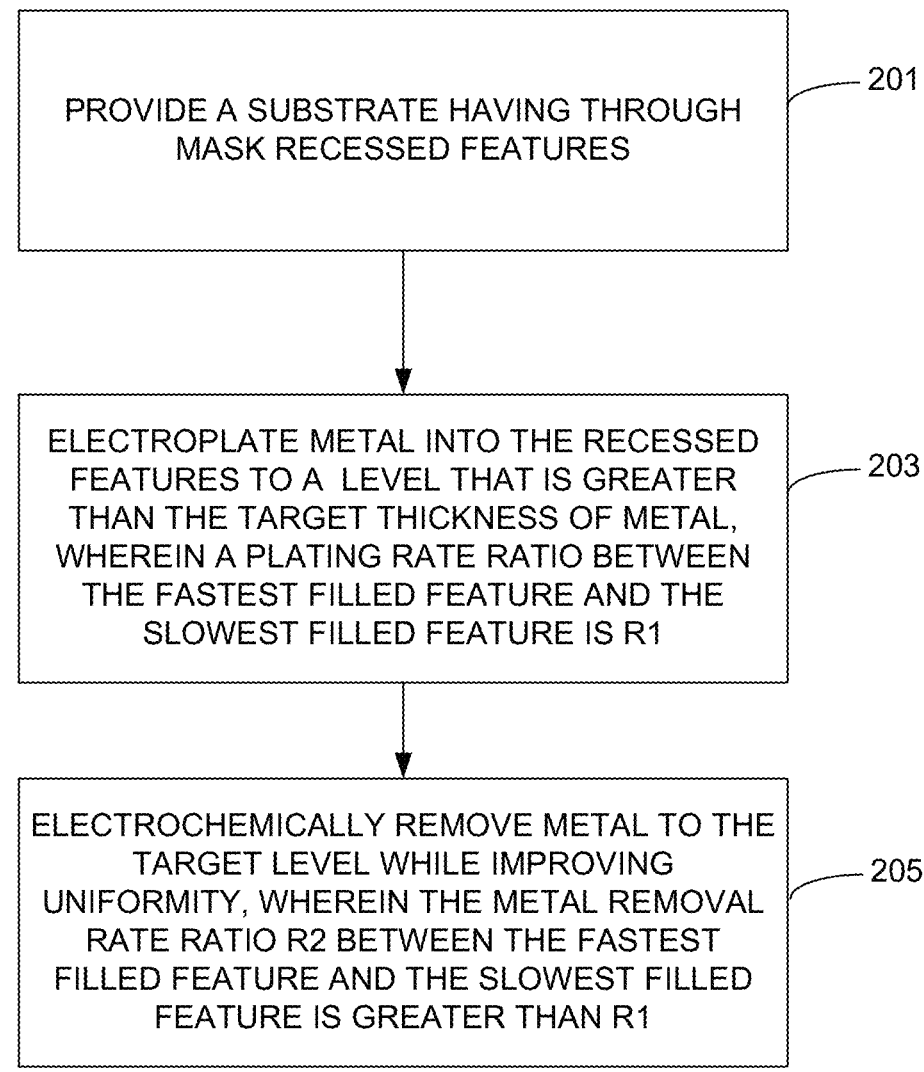
FIG. 2A is a process flow diagram illustrating a process in accordance with an embodiment provided herein.
Figure 2B:
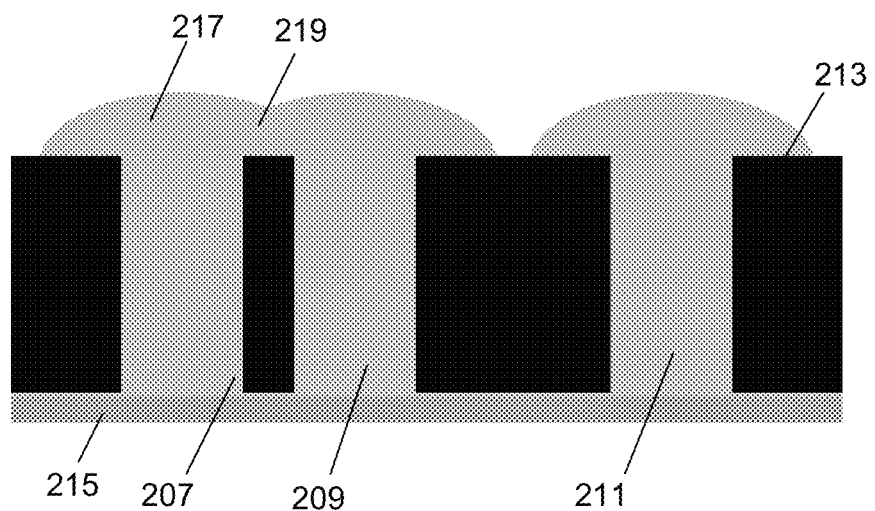
FIG. 2B is a schematic cross-sectional view of the substrate after metal filling with mushroom-like metal protrusions, according to one embodiment.

Next, metal is electroplated into the recessed features to fill the recessed features (partially, completely, or overfilled, where plating with overfill is sometimes referred to as "mushroom" plating illustrated in FIG. 2B). Because the conductive seed layer material connects all of the features with a relatively small resistance to current flow relative to the resistivity of the electrolyte (thereby achieving appropriately a constant potential at the bottom portions of each and all of the recessed features), and because isolated features are more exposed to the 3-dimensional electrolyte environment, isolated features present a lower resistance to the passage of current in the electrolyte, and therefore the isolated recessed features (such as recess 109) tend to be the location of higher ionic current and electrodeposition relative to regions of denser recessed features 107 and 108. This effect, referred to as the "primary current distribution loading effect", is schematically shown in FIG. 1A. During electroplating, the substrate 100 is cathodically biased via the seed layer 103 that is exposed at the side of the wafer and is electrically connected to a power supply. The substrate is placed into an electroplating cell opposite an anode 110, and the working surface of the electrolyte is immersed into the electrolyte containing ions of the metal to be plated, and, optionally, an acid increasing the electrolyte conductivity.

The plating solution typically will contain plating additives which modify the surface reaction kinetics and often are useful in improving the current distribution (feature shape and thickness distribution) relative to that which occurs in their absence (improved relative to the primary or electrolyte-resistance-driven current distribution). The distribution of the ionic current field is schematically shown by arrows in FIG. 1A. Because the mask layer 105 is not conductive, the ionic current distribution will be primarily governed by the distribution of the exposed portions of the conductive seed layer 103 on the surface of the substrate. While not wishing to be held to any particular model or theory, the current distribution in the absence of surface kinetic, homogeneous reactions, and mass transfer resistances, is referred to as the primary current distribution, and is governed by the Laplace equation (3) for the electric field distribution (where $\varphi$ is the potential in the electrolyte, and $\nabla^2$ is the Laplacian differential operator (divergence of the gradient of a function)).

$$\nabla^2\varphi=0 \quad (3)$$

Thus, for a more isolated recessed feature it is predicted that 109 will experience greater ionic current flux than recessed features 107 and 108. In many cases, plating additives are used with the goal of addressing and counteracting this "loading" effect, though it is typically the case that isolated features plate at a higher rate even in the presence of additives. Consequently, this results in higher plating rate in the isolated recessed features, and in thicker metal layers in more isolated features than in denser features, leading to within die nonuniformity. Plating additives are also used for other purposes as well, including modifying the grain size or modifying the smoothness and brightness of a surface. Even if measures (such as the choice of plating additive) are taken to improve plating uniformity during electroplating, they do not always lead to acceptable or desired levels of uniformity at an acceptable deposition rate (or at even at very low deposition rates), and further improvement of within die uniformity is often desired or required. Furthermore, faster electrodeposition rates typically lead to increased thickness variability, because, among other reasons, the efficacy of the plating additives to impede the charge transfer and their ability to compensate for the above discussed primary current distribution field effect diminishes with current density, and exposed features are also more exposed to the electrolyte's metal ion source, so they offer a lower resistance to mass transfer. Therefore, in order to achieve a target uniformity of the metal layer, one often must electroplate at a slower rate than would be otherwise desirable. In some cases, the target uniformity is unobtainable at any (even very slow) plating rate. One option as disclosed herein is to electroplate at a faster rate and then electroplanarize using the methods described herein. Ultimately, with the use of provided methods, higher net processing rates and tool throughput for a given target uniformity level, can be obtained with electroplating followed by electroplanarization, in many embodiments. In other cases, using the methods and apparatus described herein, one can obtain uniformity levels unobtainable by conventional plating-only methods at any plating rate (including extremely slow plating rate).

Referring to FIG. 2A, in operation 203, metal is electroplated into the recessed features to a level that is greater than the final target metal thickness, where the plating rate ratio between the fastest feature's fill and the slowest feature's fill is R1. The metal deposition and metal removal rates used herein in the description of feature fill ratios refer to time-averaged rates. For example, in the substrate shown in FIG. 1B, the features are filled with metal 113, such as copper, to a level that is greater than the target level 115. In the depicted example the fastest feature fill occurs in the isolated feature 119 and the slowest fill in feature 117. The ratio of the time-averaged plating rates between these features can be determined from a ratio of thicknesses obtained after the fill. The overplating beyond the target level is typically greater than about 10% of the target plated thickness, such as between about 10-50% greater than that of the target thickness. The overplated metal is removed (sacrificed) in the subsequent electrochemical removal step as uniformity is improved during metal removal. The amount of overplating depends on several considerations, including but not limited to target feature to feature uniformity requirement, desired feature flatness, operational cost and/or throughput requirement, and the R1 ratio.

Generally, the electroplating step can be stopped at various levels of the recessed feature fill. In some embodiments, the substrate after electroplating includes partially filled features, as shown in FIG. 1B. In some embodiments, the recessed features are completely filled and may even include all or a portion of metal protruding above the level of the mask. In some embodiments, the protruding metal after electroplating does not merge (lateral growth is not sufficient) to form bridge between adjacent feature, or a continuous metal layer on the field region of the substrate. However, in some embodiments, metal may be deposited to an extent or level when a continuous metal layer is formed on the field region spanning two or more filled features (e.g. bridging between features occurs). This is illustrated in a structure shown in FIG. 2B, where features 207, 209 and 211, residing in photoresist 213, and electrically connected by a seed layer 215, are overfilled with metal such that mushroom-like metal protrusions 217 are formed over each feature. Further, a metal bridge 219 is formed between two adjacent mushroom protrusions 217. In the illustrated example, the bridge does not extend to the more isolated feature 211.

Figure 2C:
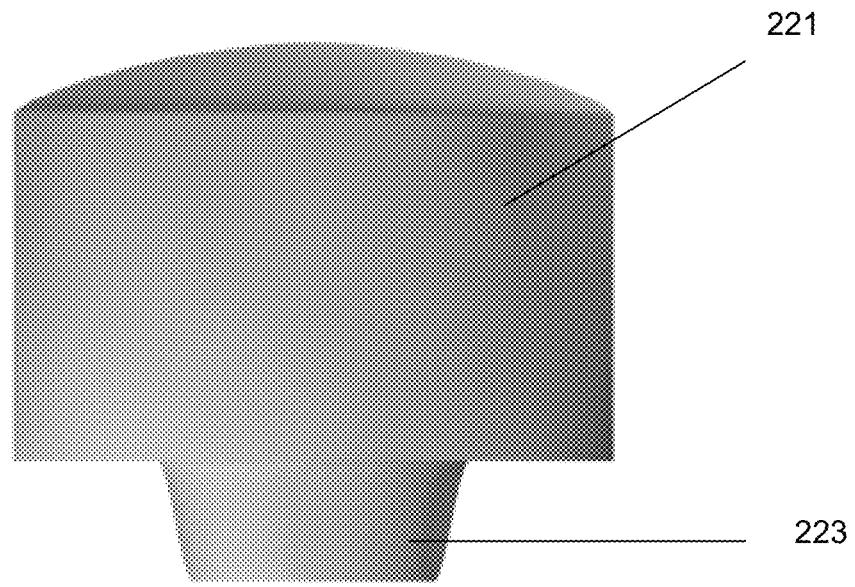
FIG. 2C is a schematic side view of a feature combining a pillar and a via after metal fill and mask removal.
Figure 2D:
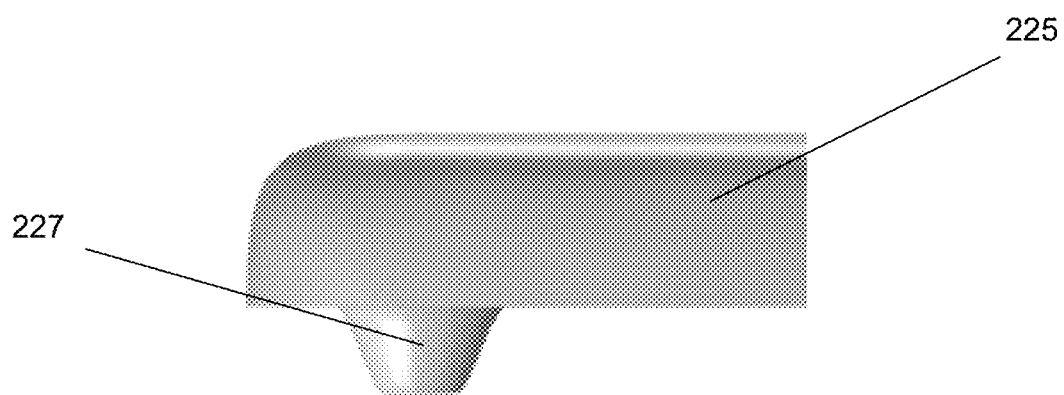
FIG. 2D is a schematic side view of a feature combining a line and a via after metal fill and mask removal.

It is noted that a single substrate may include different types of filled features after electroplating. For example, in some embodiments the substrate may include both partially and completely filled recessed features after electroplating. In other cases, features may be geometrically different from each other (regardless of the amount of filled metal), such as some features having one or more recesses below the general starting substrate plane (e.g. a via inside a pillar-post). FIG. 2C illustrates a feature that combines a pillar 221 with a via 223 disposed below the pillar. In addition, some features may include a combination of a line with a pillar. Such combined feature is illustrated in FIG. 2D, where a line 225 is disposed over a via 227. FIGS. 2C and 2D provide schematic side views of filled features after photoresist removal.

Most typically, each feature is filled to at least about 50% of its initial recessed depth in the electroplating step. Irrespective of the amount of fill, the process follows in operation 205 by electrochemically removing metal in each feature and the electrochemical removal is stopped at a point where the average of feature thicknesses approaches the target thickness level. The electrochemical removal process improves uniformity (reducing thickness variation) in comparison with a plating-only process, and the electrochemical metal removal process is configured such that the metal removal-rate-ratio, referred to as R2, between the fastest plated/filled feature and the slowest plated/filled feature, is greater than R1, the metal deposition (plating) ratio between that same pair. This relationship of R2>R1 is significant for the success of the planarization process, which we now explain. If R2 were equal to R1, then the relative thickness of the fastest plated feature to the slowest one would be substantially unchanged (and the added processing would be of no utility, as it would not accomplish any thickness uniformity improvement). As a simple example proving this, one can imagine that the rate of plating of the fastest feature is twice that of the slowest feature (R1=2), and that the target thickness is 20 µm. In this case the fastest feature would plate to a thickness of 2×20=40 µm and the slowest feature would be plated 1×20=20 µm (we are allowing the thinner feature to arrive at the target thickness in this example). Now if one plated the features longer, e.g., to 2×25=50 µm and 1×25=25 µm respectively, and if R2=R1=2, then removal of metal from these features would occur at the same 2 to 1 relative rate. Specifically, one would remove 5 µm from the thinner feature down to 20 µm, and 2×5=10 µm would be removed from the faster plated feature. Then the final features obtained after electrochemical removal will be unchanged compared to the plating-only case (40 and 20 µm respectively). When R2 is smaller than R1, the relative thickness difference of the features diverges (gets worse or larger) by employing the plating followed by electrochemical metal removal process. Only when the metal removal ratio R2 in the electrochemical metal removal process is greater than the R1 for the preceding plating process, will the net process result in improved thickness uniformity. Thus, for the process to be useful, the ratio of R2/R1, should be greater than 1, for example R2/R1 should be greater than about 1.1, for example greater than about 1.15. In some cases, where high process efficiency is required, R2/R1 should be greater than about 1.25. The required relationship between R1 and R2 ratios can be achieved by configuring one or more parameters so as to minimize R1 to as close to 1.0 as possible, and/or to maximize R2. For example, as described above, in some embodiments, it is possible to reduce R1 by employing certain plating additives in the electroplating solution that can counteract the effects of the primary current distribution or ohmic-field-distribution by modifying the kinetics of deposition on different surfaces of the features. In some embodiments, electroplating is conducted in a solution containing one or more of an electroplating suppressor and/or one or more of an electroplating leveler that are configured to reduce R1, relative to a R1*, where R1* is a ratio that is obtained in an absence of such additives or other measures taken for the purpose of reducing R1*. While not wanting to be bound to any model or theory, R1* can viewed as the result of what is known as the "primary current distribution", an electric field distribution and plating current distribution solely regulated by the relative ionic resistances to, and exposures of and among the various exposed features. More isolated features tend to be more exposed to the solution and have more ionic paths for current to plate to them, and therefore tend to have lower resistance and higher plating rates. The primary current distribution is governed by Laplace's equation in certain limiting electrochemical cases, as provided herein in equation 3.

The importance of reducing R1* to R1 (or making the current distribution more uniform than the primary current distribution by adding additives in the electroplating step) can be illustrated as follows. If in the substrate that is subjected to electroplating R1* is 2 and is primarily determined by the distribution of the ionic current field, as described above, then during subsequent electrochemical removal, R2 (determined by the distribution of the same field, but in the opposite direction) would also be about 2 (if no measures are taken or capable of being taken to increase it). In this case, no improvement in uniformity will be achieved. As can be seen from Laplace's equation, the primary current distribution does not depend on the specific conductivity or other properties of the electrolyte. Therefore the primary current distribution (or for this example R1*) would invariably not be less than R2. As provided herein, it is needed to reduce R1* to R1, for example, by employing surface resistance adding additives. The current distribution that is governed by the combined resistance of the solution and interface is referred as the secondary current distribution. It is understood that exceptions will exist where R1* could be reduced to R1 by methods other than by adding plating additives. For example, one such method is by modifying conditions where the diffusion or convective resistances in the otherwise fastest plating feature become substantial or dominant (referred as the tertiary current distribution) and so those features that would otherwise plate more rapidly due to electric field exposures have more equivalent total resistance, or even higher resistances mass transfer than the less exposed features. If, however, due to addition of suppressing and/or leveling additives during electroplating or other methods, R1 is reduced relative to R1*, e.g., to 1.5, then an etch back with R2 of 2 will result in faster etch of thicker isolated structures, and will lead to improvement of uniformity.

Figure 1C:
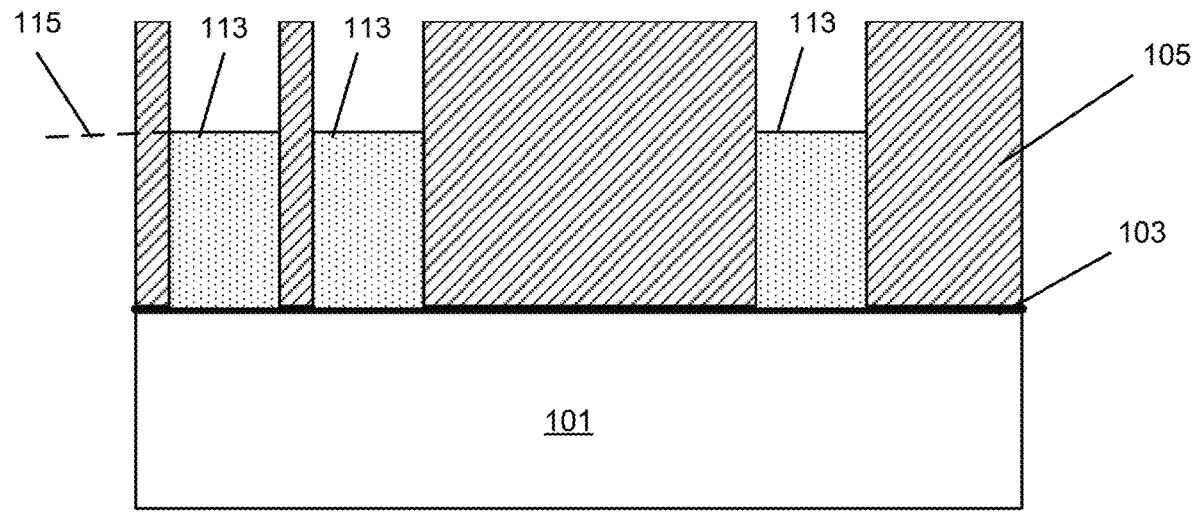

The structure formed after operation 205 is shown in FIG. 1C, where it can be seen that metal fill 113 has been electrochemically etched back in all three features 107, 108, and 109 to the target level 115, such that within die uniformity has improved. The process conditions for the electroplanarization can be configured for improved uniformity control, via utilization of distinct electrochemical regimes, as will be described herein. In some embodiments, the method involves coulometrically determining the termination or endpoint of the electrochemical etch-back process. Coulometric control to terminate plating at a target thickness and etch-back to the final target thickness is most easily and preferably implemented when both the plating and etch-back process have a current efficiency of nearly or equal to 100% (current efficiency is the fraction of the current that results in metal deposition or removal). In the case of copper plating in common sulfuric acid/copper sulfate electrolytes, the current efficiency is 100%, but etching using that same electrolyte is typically much less than 100% (e.g., 53%), with the actual value varying depending on the etching rate, etching temperature, bulk solution concentrations, flow/convection conditions and time. Therefore, preferred plating and electrochemical removal electrolytes are used that have a parametrically constant and near 100% current and etch/polish efficiency (e.g., at least about 90% current efficiency, such as at least about 95% current efficiency), as laid out hereafter. The coulometric method involves measuring the charge that passes through the metal removal cell during metal removal and comparing this charge to the charge that passed through the electroplating cell during overplating over the target level. When both the plating process and the etching process form the same electronic state cation (e.g. plating reduces copper from $Cu^{+2}$ to Cu, and etching oxidizes Cu to $Cu^{+2}$ in a two electron step process), the etch-back can be stopped once the charge passing through the metal removal cell exceeds a pre-determined value (e.g., the charge that was passed in overplating over the target level).

Figure 1D:
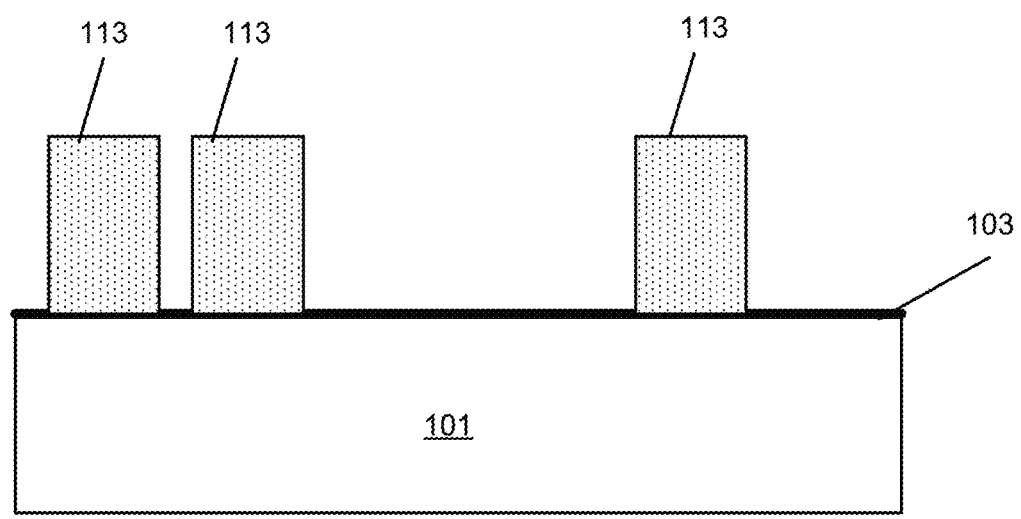

Once the electrochemical etch-back is completed, the mask layer 105 is removed (e.g., photoresist can be removed by photoresist stripping), and the substrate having a plurality of metal bumps and/or pillars 113 is obtained, as shown in FIG. 1D. The seed layer 103 can be removed in a subsequent etching operation.

Figure 3A:
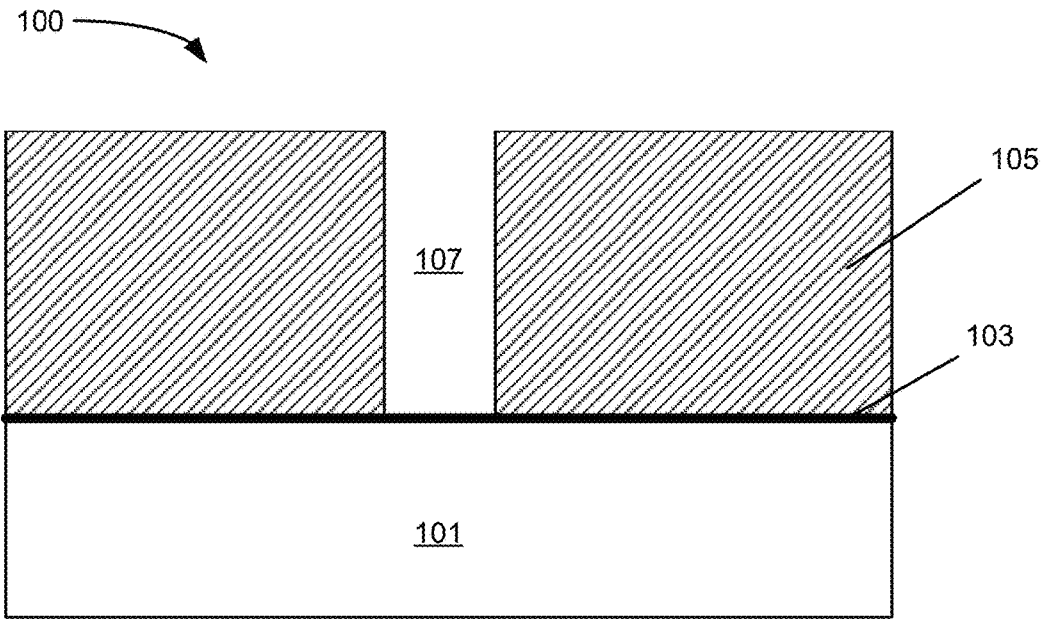
FIGS. 3A-3D are schematic cross-sectional views of a substrate undergoing processing according to an embodiment provided herein.
Figure 3B:
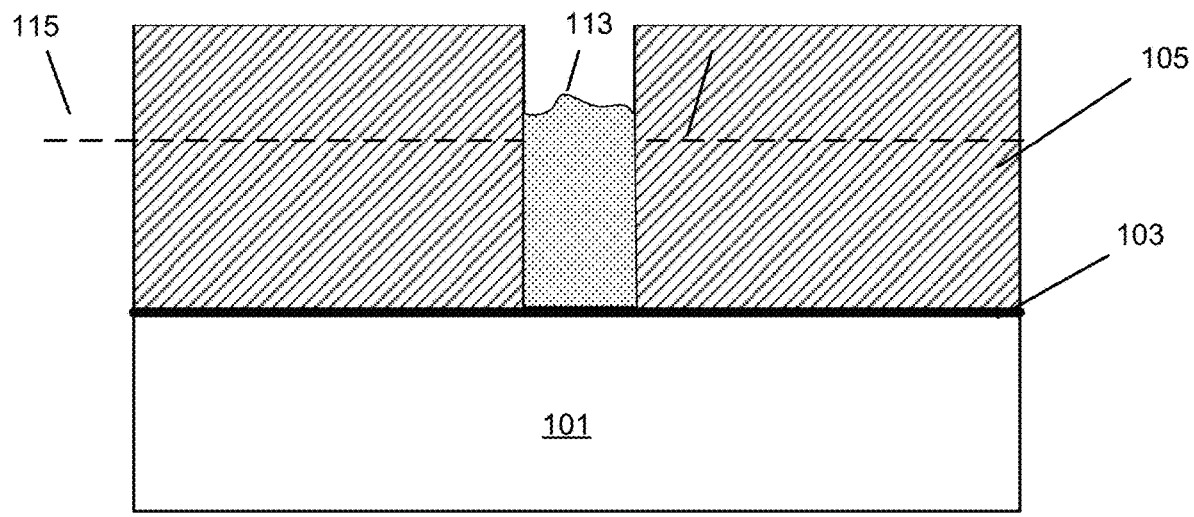
Figure 3C:
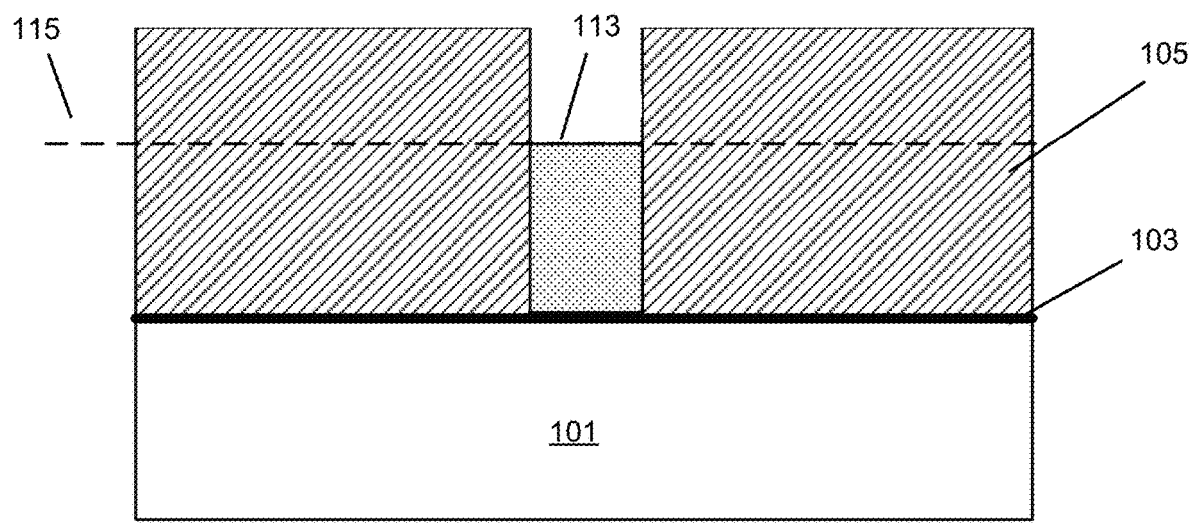
Figure 3D:
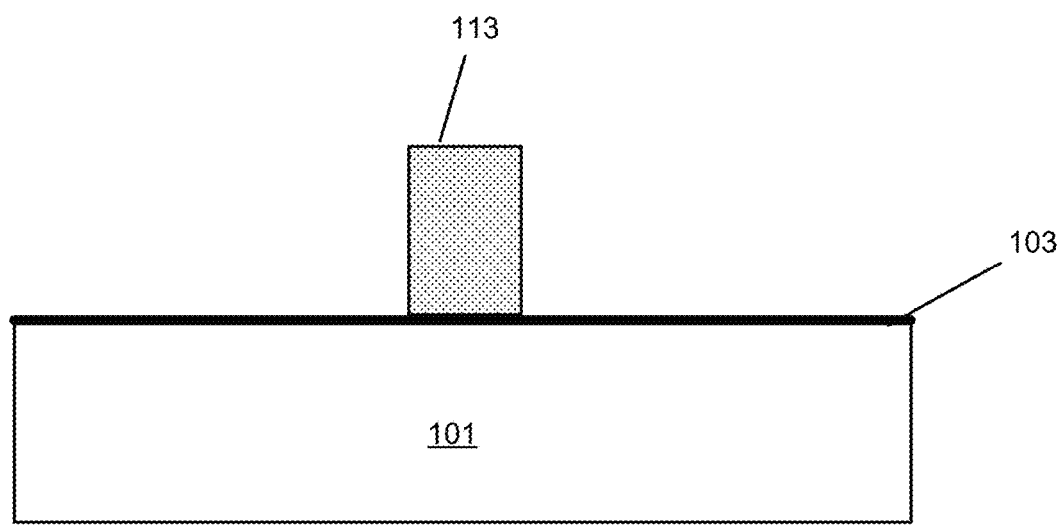
Figure 4:
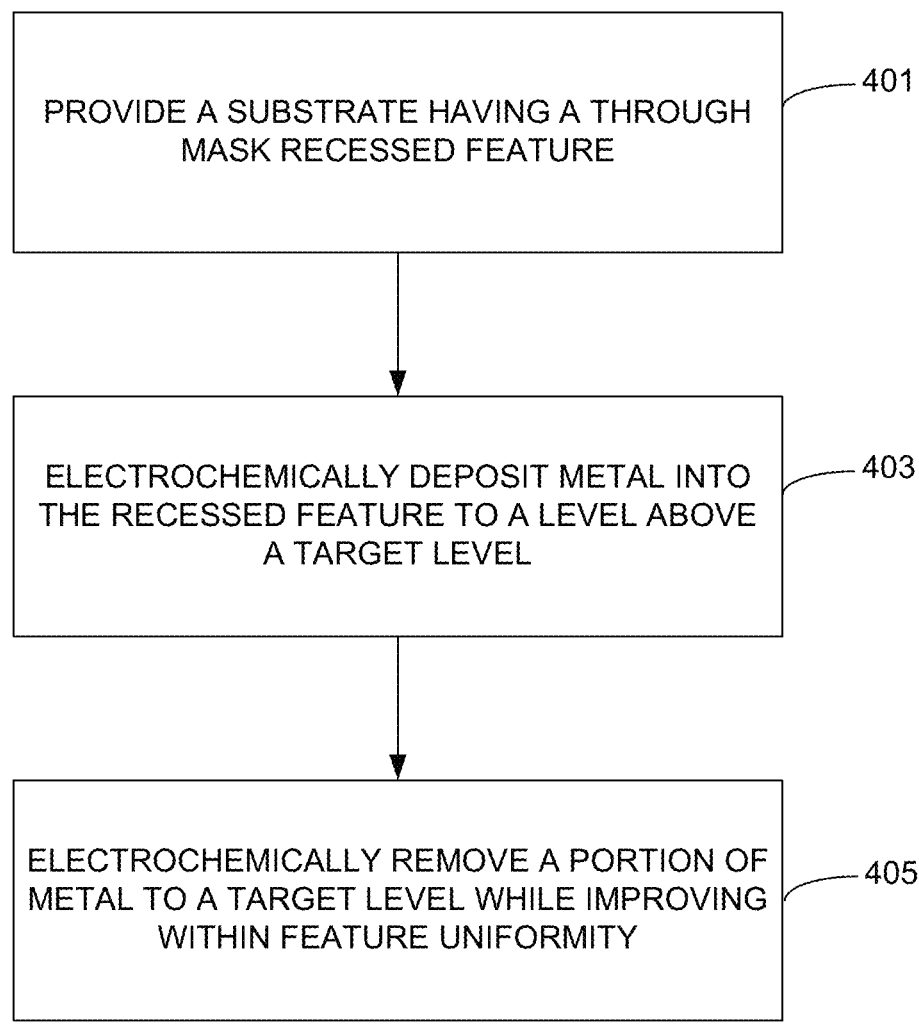
FIG. 4 is a process flow diagram illustrating a process in accordance with an embodiment provided herein.

Another type of uniformity that can be improved by the methods provided herein is within-feature uniformity. This process is illustrated by schematic cross-sectional structures shown in FIGS. 3A-3D and by the process flow diagram shown in FIG. 4. The process starts in 401 by providing a substrate having a through mask feature. This substrate is illustrated in FIG. 3A, where a through-mask recessed feature 107 resides in a photoresist layer 105. Next, in 403 of FIG. 4, metal is electrochemically deposited into the recessed feature above a target level 115, as shown in FIG. 3B. In this case the metal fill 113 is uneven within a feature as there are thicker and thinner portions across the diameter of the feature. Generally, within feature non-uniformity may manifest itself in a variety of shapes, including but not limited to convex domed features (where the center of the plated feature is thicker than the peripheral portion of the feature), concave dished features (where the center of the plated feature is thinner than the peripheral portion of the feature), and rough features, which may include a plurality of small protrusions and recesses. The underlying causes of the non-uniform shapes within features include many of the same factors that lead to feature to feature variance (e.g. primary field effects, and non-uniform within feature flow circulations). The process follows in operation 405 by electrochemically removing a portion of metal to the target level while improving within-feature uniformity. The resulting structure is shown in FIG. 3C, where the feature's shape is improved and the metal fill 113 is planarized at the target level 115. The process may then continue with the removal of the photoresist, providing a structure shown in FIG. 3D illustrating a single pillar 113 having a flat planarized top portion.

Figure 5A:
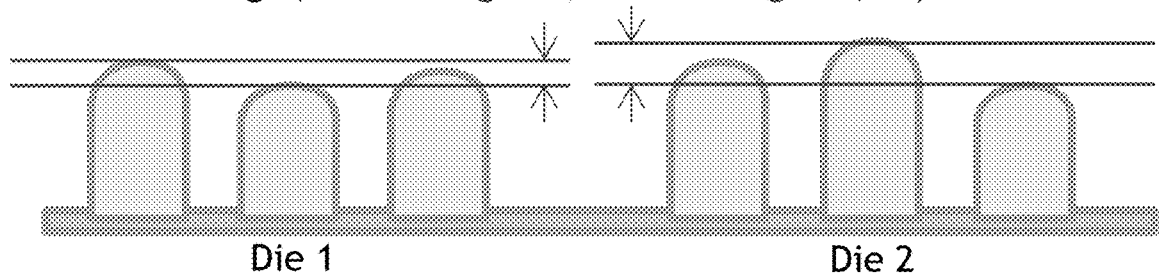
FIGS. 5A and 5B are schematic cross-sectional view of substrates illustrating determination of within die nonuniformity and within-feature nonuniformity respectively.
Figure 5B:
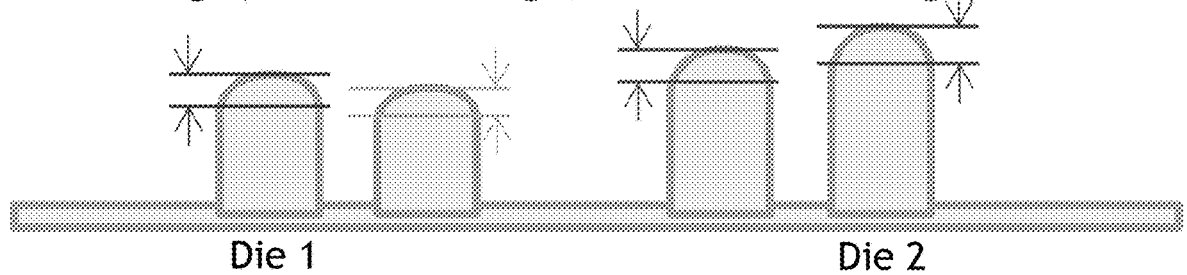

Formal calculation of within-die nonuniformity and within-feature nonuniformity is illustrated in FIGS. 5A and 5B respectively. FIG. 5A illustrates within-die (WID) non-uniformity. On a wafer having a plurality of die, a range of feature heights (the difference between the tallest and shortest feature) is calculated for each die, and is divided by 2. The average of these half ranges for all die on the substrate provides a measure of WID non-uniformity. FIG. 5B illustrates calculation of within-feature (WIF) nonuniformity. On a substrate having a plurality of features, a range is calculated for each feature as a difference between the thickest part of the feature and the thinnest part of the feature. The average of these ranges is the within-feature non-uniformity. While these calculations are illustrated in FIGS. 5A and 5B as applied to the features after removal of the mask, it is understood that one can similarly calculate and/or estimate non-uniformity prior to mask removal.

Advantageously, the methods provided herein can be employed not only to improve within-die uniformity alone or within-feature uniformity alone, but also both in combination. For example, the developed electrochemical etch back methods can be used to planarize substrates with filled features having different heights, where the features themselves can have thickness irregularities, such as concave or convex shapes or rough surface.

Further, the methods provided herein can be used to improve within-wafer non-uniformity (WIW). In some embodiments, certain areas of the wafer substrate may experience thicker or thinner electroplating than desired. This may occur due to across-wafer variations of seed layer thickness and/or mask layer thickness, or more generally due to a poor or limited capability in designing the plating process or plating apparatus optimally. In addition, this may occur in substrates containing a die (typically located at the edge of the wafer or substrate) and an adjacent to the die region of missing features or missing die or missing partial die. This geometry may result in "loading effects" and in thicker plating near the regions of missing features. Radial and azimuthal WIW non-uniformity is sometimes measured as a thickness half range measured on a single feature type in a die at multiple locations across the wafer's diameter, around a periphery, or across the entire wafer. Provided electrochemical removal methods can successfully improve uniformity of electroplated metal in these cases. In some embodiments provided methods can be used to provide substrates with WIF of less than 2%, WID of less than 3%, WIW of less than 2% and any combination thereof.

Electrochemical Metal Removal Process Conditions

Electrochemical metal removal process provided herein is configured for improving the uniformity of metal layers (both continuous and discontinuous), and is particularly well-suited for improving uniformity of through mask plated features, especially those with discontinuous exposed metal layer (when plating ends before a continuous metal layer is deposited on the field). Such substrates contain areas of exposed metal and areas of exposed dielectric (e.g., mask, such as photoresist) and this discontinuity of metal layer on the surface presents certain challenges for both electroplating and for electrochemical metal removal. The methods provided herein, in some embodiments, configure the electrolyte hydrodynamics at the surface of the wafer for improving uniformity during the electrochemical etch back. In some embodiments, the methods configure the electrochemical regime (via controlling potential and/or current at the substrate) for improved uniformity. In some embodiments, the methods configure the composition of electrolyte for improving the uniformity of the etch-back. In some embodiments, methods are provided for maintaining the electrolyte components at substantially constant concentrations during continuous use of the electrochemical metal removal apparatus, such that a large number of wafer substrates (e.g., greater than about 50, such as between about 100-5000) can be processed sequentially using a substantially identical electrolyte, thereby improving the wafer to wafer reproducibility of the etch-back. The methods may further involve segregating, removing and diluting hydrogen that is formed at the cathode or plating metal onto the cathode during metal removal. These features of the methods can be used separately or in combination with each other.

Electroplanarization, as provided herein, generally involves immersing the working face of the substrate having an exposed metal layer (continuous or discontinuous) into an electrolyte contained in an electroplanarization apparatus, and anodically biasing the substrate, such that the metal is electrochemically dissolved into the electrolyte, as shown by equation (2), while configuring the process conditions for improving the uniformity of the exposed metal layer, e.g., for improving within die, within wafer and/or within feature uniformity. The substrate is anodically biased using electrical contacts that are connected to the conductive portion of the substrate and which are electrically connected to a power supply. When the substrate contains through mask features, the contacts are made to the conductive continuous seed layer that underlies the dielectric mask layer. The contacts are typically (but not necessarily) made at the periphery of the substrate. The electroplanarization apparatus will also include a cathode counterelectrode, which can be an active cathode, or an inert cathode. Examples of active cathodes include stainless steel, iron or nickel cathodes, which are easily plateable during the process by reducing the metal ions in the electrolyte. For example, when copper is removed from the substrate and is dissolved into the electrolyte, copper metal layer will be deposited on the active cathode. For the inert cathode, all or a part of the reduction process results in an electrochemical reaction other than the reduction of the metal being removed by the electroplanarization process on the substrate, such as proton reduction to produce hydrogen gas in an aqueous electrolyte. Metal deposition and/or hydrogen gas evolution can occur at the cathode during the substrate metal removal process at the anode. For example, when the removed metal is copper, reactions (4)-(5) occur at the anodically biased substrate, and reactions (6)-(8) occur at the cathode.

Anode Reactions:

$$Cu^0_{(s)} - e \rightarrow Cu^+ \quad (4)$$

$$Cu^+ - e \rightarrow Cu^{2+}_{(aq)} \quad (5)$$

Cathode Reactions:

$$Cu^+ + e \rightarrow Cu^0_{(s)} \quad (6)$$

$$Cu^{2+} + e \rightarrow Cu^+ \quad (7)$$

$$2H^+_{(aq)} + 2e \rightarrow H_{2(g)} \quad (8)$$

Figure 6:
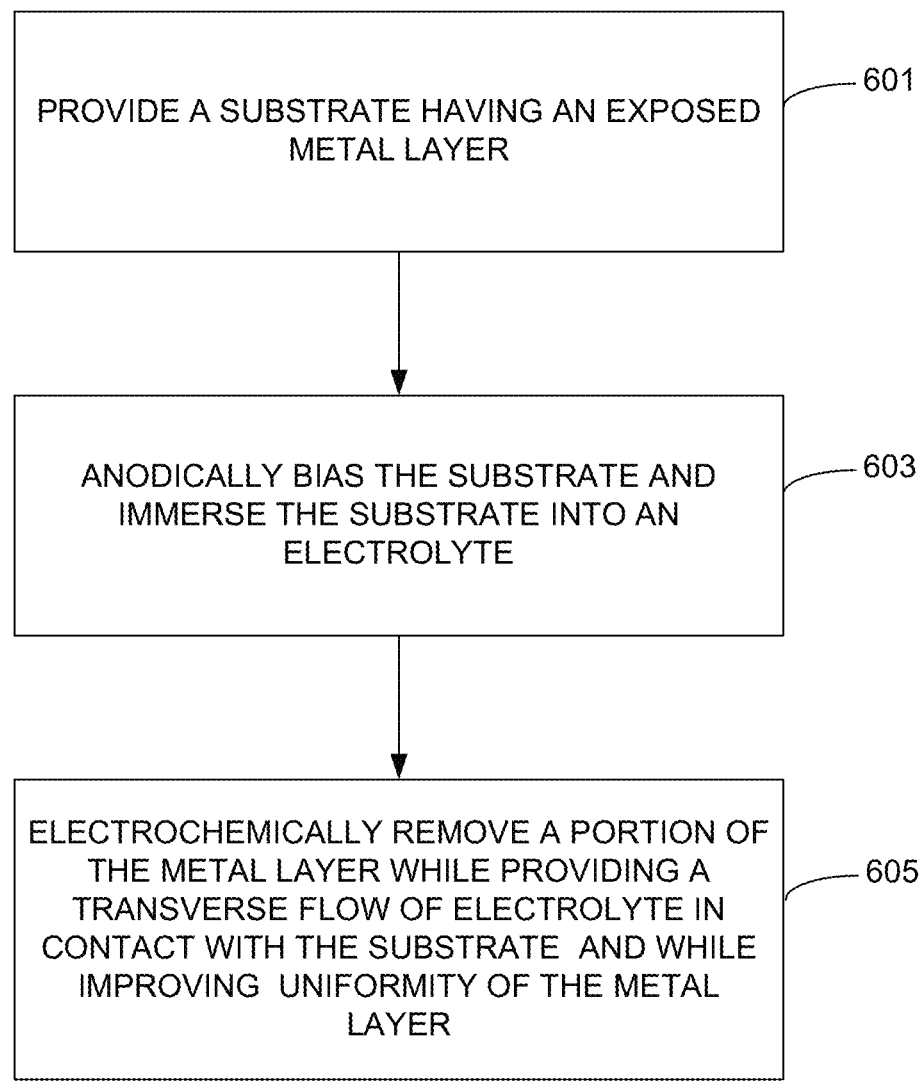
FIG. 6 is a process flow diagram illustrating an electrochemical metal removal process in accordance with an embodiment provided herein.

According to one embodiment of provided methods, the flow of electrolyte at the surface of the substrate during metal removal is configured, such that there is a transverse flow of electrolyte contacting the working surface of the substrate. The use of transverse flow during electrochemical etch-back allows for improving the uniformity of the metal layer during the etch-back, as it facilitates the mass transfer of the electrolyte to and from the features. The process diagram for this method is shown in FIG. 6. The process starts in 601 by providing a substrate having a metal layer. This method can be generally used on a variety of substrates including substrates having continuous and discontinuous metal layers. However, it is particularly useful for the etch-back of through mask plated features, where the substrate has both exposed metal (discontinuous) and exposed dielectric, and where the metal features are electrically connected underneath the exposed dielectric by a continuous seed layer, e.g., as shown in FIG. 1B. This is largely because of the dominance of the feature density variability of field loading and exposure effect differences for features separated by dielectric material. Recessed features that are part of a continuously conductive and interconnected plateable or etchable field (such as is typical in damascene plated wafers) do not experience the same degree of variable electric field concentrations or variability in diffusion exposure, due to the presence of the field metal. Plating or etching occurs simultaneously between the features, with those processes occurring upon the entire general surface. Features that are embedded and separated from each other in a dielectric have a much greater degree of contrast in field and environmental exposure between regions of dense and less dense feature concentrations. In addition to or in combination with etch-back of through-mask features, the transverse flow embodiment is particularly useful for through resist plating and etch-back with fast and spatially uniform removal rates (e.g., with average metal removal rates of at least about 5 μm/minute) and for etch-back from larger features (e.g., with widths of greater than about 100 μm), and higher aspect ratio features (e.g., with aspect ratios of greater than 2:1) due to high demands for electrolyte mass transfer in these situations.

Referring again to FIG. 6, the process follows in 603 by anodically biasing the substrate and immersing the substrate into the electrolyte, and in 605 by providing a flow, preferably a spatially uniform flow, most preferably uniform transverse flow of electrolyte in contact with the substrate and by electrochemically removing metal from the substrate while improving the uniformity of the metal layer. The transverse flow of the electrolyte is a flow of the electrolyte in a direction that is substantially parallel to the working surface of the substrate. While not wishing to be bound by any particular model or theory, it is believed that when metal features are recessed below the plane of a dielectric (such as employed with masked through-resist plating where the feature is plated up below the plane of the photoresist), transverse flow in the region above the surface creates a circulatory irrigating flow patterns inside the mask opening recessed cavities, which leads to enhanced mass transfer and processing rates. The transverse flow of the electrolyte provided herein is provided by a method other than rotation of the substrate. There should be a method other than rotation that contributes to the flow as well, and preferably to a larger degree than rotation. Generally, rotation-only does not provide radially uniform transfer flow, for example it does not provide any transverse flow across the center of the substrate, and this is detrimental to wafer level process uniformity. Of course, substrate rotation may contribute to a portion of the transverse flow, but it is primarily used to create a time average uniform flow field and to increase flow near the wafer periphery. The methods provided herein provide a transverse flow such that the flow velocity across the center of the substrate (referring to a flow vector parallel to the substrate surface, immediately near the substrate working surface and crossing the central point of the substrate), is at least about 3 cm/second, (e.g., at least about 5 cm/s, at least about 10 cm/s, or at least about 20 cm/s). In some embodiments, the transverse flow is provided during the entire electrochemical metal removal process. For example, in some embodiments the transverse flow should be provided for at least 50% or at least 80% of the time that the electrochemical metal removal process is conducted. For example, in some embodiments, the transverse electrolyte flow can be generated by a reciprocating paddle mechanism that may involve short idle time between change in directions of paddle motions.

The transverse flow of electrolyte can be generated using a variety of methods, including but not limited to lateral injection of electrolyte such that the electrolyte enters the cell proximate the substrate in a direction that is substantially parallel to the working surface of the substrate; diversion of the flow to generate or increase a transverse component of the electrolyte flow using a variety of flow diverting techniques, generation of transverse flow within the cell using moving elements, such as a reciprocating paddle or paddlewheel movement, and any combination of these approaches.

Figure 7A:
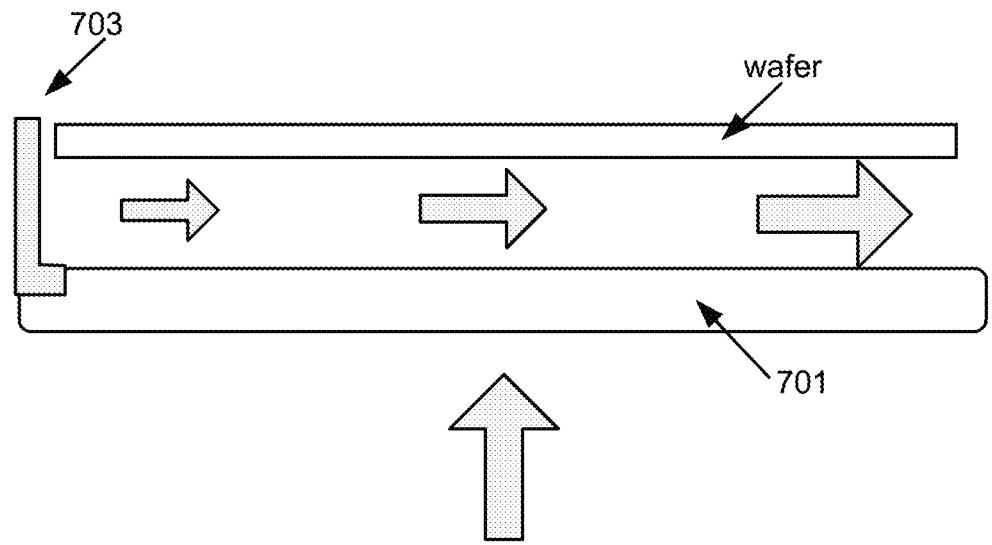
FIGS. 7A and 7B are schematic cross-sectional view of the portions of metal removal apparatus proximate the substrate illustrating electrolyte flow patterns in accordance with two different embodiments.

FIG. 7A illustrates a flow diversion approach for generating transverse flow. In this example the electrolyte flow is directed upwards towards the wafer substrate. The electrolyte passes in an upwards movement through an ionically resistive ionically permeable element 701, positioned in close proximity of the wafer (e.g., within about 10 mm), and enters a pseudochamber defined by a substrate-facing surface of the element at the bottom, a working surface of the wafer on top and by a wall of a flow diverter element 703 on the sides. The wall of a flow diverter element generally follows the circumference of the element and has a vent region having one or more openings that allows the electrolyte to exit the pseudochamber, as shown by the arrows. The vent region is azimuthally asymmetrically positioned, thereby resulting in the diversion of the electrolyte flow emanating from the element into a transverse flow of electrolyte with a non-zero velocity across the central point of the wafer.

Figure 7B:
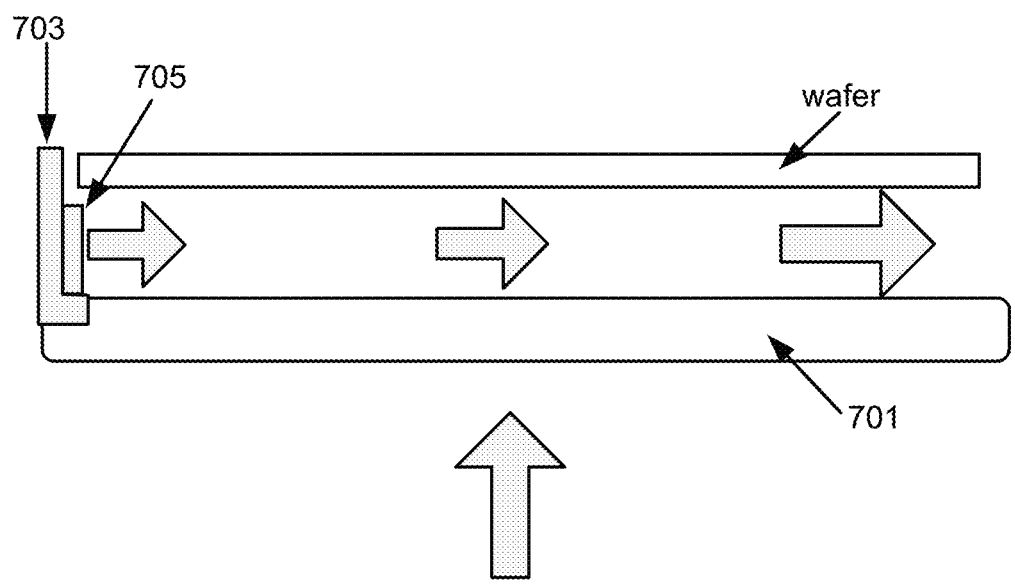

FIG. 7B illustrates an example, in which the transverse electrolyte flow is obtained using a combination of lateral electrolyte injection and flow diversion. As in the example shown in FIG. 7B, electrolyte flows upward through the element 701 and is diverted into a transverse flow by a flow diverter 703, but in addition there is an electrolyte injection port 705, which injects electrolyte substantially parallel to the surface of the substrate in a direction generally towards the vent region of the flow diverter These examples provide illustrations of transverse flow generation, but it is understood that other methods for transverse flow generation can be used. For example, the presence of the ionically resistive ionically permeable element may not be required in some embodiments.

In some embodiments it is preferable to rotate the wafer during electrochemical metal removal with transverse flow. Rotation would change the transverse flow vector direction during the course of metal removal (if a point on a wafer is taken as a point of reference) and therefore would improve within feature uniformity. It was discovered that the rotation rate should preferably be slow, and, in some embodiments, the angular rotation rate should be such that the linear velocity $V_\theta$ tangent to the substrate's edge does not exceed the rate of transverse flow at the edge of the substrate. The linear velocity relates to the angular rotation rate by equation (9)

$$V_\theta = \pi D \omega \tag{9}$$

where D is the diameter of the substrate (e.g. 30 cm) and $\omega$ is the angular rotation rate, in fractional revolutions per second). For example, if the transverse flow rate across the edge is 10 cm/second and the wafer is 30 cm in diameter, the angular rotation rate should be less than $\omega < 10/(\pi \times 30) = 0.106$ revolutions per second or less than about 6.4 rotations per minute (rpm). Preferably, the angular rotation rate should be substantially less than the rate derived in this manner, e.g. 2 rpm in the above example, such that the angular rotation rate does not provide a significant contribution to the relative linear velocities of the wafer edge and the transverse electrolyte flow. The wafer is rotation rate in some examples is between about 0.5-30 rpm, such as between about 0.5-12 rpm.

Electrolyte Composition

The electrolyte that is used during metal removal is an electrically conductive liquid, which typically contains an acid, preferably an acid having moderate to high viscosity (e.g. with a viscosity of greater than about 4 cP), such as a phosphoric acid ($H_3PO_4$), 1-hydroxyethylidene-1,1 diphosphonic acid (HEDP), and and/or alkanesulfonic acid (e.g., methanesulfonic acid, ethanesulfonic acid or propanesulfonic acid). The electrolyte may contain mixtures of these acids with each other as well as with other acids such as with sulfuric, or acetic acids. In some embodiments a non-acidic viscosity thickening agent, such as glycerol or ethylene glycol can be used in the electrolyte. Concentrated solutions of methanesulfonic acid have been found particularly useful for removal processing of certain metals such as tin, silver, lead, and alloys of these metals, e.g. SnAg alloys. While a variety of acids may be used, phosphoric acid and HEDP are preferred for electrochemically removing copper, nickel, and cobalt, because of their low cost and because the use of these acids minimizes or does not result in precipitation of metallic copper, nickel or cobalt particles from solution during the electrochemical metal removal. In contrast, for example, the use of sulfuric acid during electrochemical copper removal can result in formation of substantial amounts of metallic copper particles, which are believed to be formed due to the oxidation of the metal only to the +1 state, $Cu^+$, and the subsequent disproportionation of the cuprous ion into $Cu^{2+}$ and $Cu^0$ metallic particles. Particle formation can lead to defectivity on the substrate and other equipment and process difficulties, and should preferably be avoided. The viscous removal electrolyte may include complexing agents, including chelating agents, e.g., organic phosphonates.

Generally, the acids that can be used in combination with the phosphoric acid and/or HEDP in the electrolyte include sulfuric acid, methanesulfonic acid, acetic acid, perchloric acid, etc. Mixtures of these acids can also be used. These acids are more suitable for removing other metals than copper, such as nickel, cobalt, tin silver alloys, etc. The concentration of acid in the electrolyte and the viscosity of the solution should preferably be high. For example, in some embodiments, the electrolyte contains phosphoric acid at a concentration of greater than 40% by weight, such as greater than 45% by weight, e.g., between about 40-65% by weight and the viscosity of the electrolyte is greater than about 4 cP, such as 5 cP.

Certain glycols, such as glycerol, propylene glycol and ethylene glycol, and various other water soluble organic and viscous compounds can be used as a high viscosity generating base solvent or additive in a variety of potentially suitable electrolytes. These materials are not conductive and are typically used in combination with water and a salt or a weak acid. Such solutions are primarily useful for but not limited to applications where weakly acidic (pH>1) or non-acidic electrolyte solutions are preferred (including those with complexing and chelating agents). Other elements of this class of electrolyte include conductive acids or salts (e.g., sulfamic acid, sodium or ammonium sulfate, sodium thiosulfate, sodium tetrafluroborate) and are useful for etching metals such as Pd, Pt, Ag, Rh, Ru, Ir, and Au.

In some embodiments, the electrolyte composition is selected such that its viscosity increases rapidly and significantly with an increase in metal ion concentration (e.g. increases more than 20%, for example more than 30% for each twofold increase in metal ion content). As the electrochemical metal removal proceeds, the concentration of the metal ion in the electrolyte will increase near the working surface of the substrate. If the electrolyte is configured such that the viscosity of this layer also increases with the increase in metal ion concentration, as discussed above regarding the relationship between viscosity and diffusivity, the diffusion in this layer near the surface will appreciably decrease and the process will lead to better uniformity within and between features of different depths or heights.

A relationship between the diffusion coefficient of a molecule and viscosity is given by the Stokes-Einstein equation (10), where D is the diffusion coefficient, $k_B$ is the Boltzmann constant, T is the temperature, $\mu$ is the dynamic viscosity (units of length squared over time) of the solution, and r is the hydrated atomic radius of the atom.

$$D = \frac{k_B T}{6 \pi \mu r} \tag{10}$$

Thus, as the viscosity increases, the diffusion would slow down according to the equation (11)

$$D(T) \propto \frac{T}{\mu(T)} \tag{11}$$

Without wishing to be bound by a particular theory, it is believed that when electropolishing is performed in a solution where viscosity increases with the concentration of polished metal, the rate of diffusion will decrease with increasing metal content near the metal surface, until a mass-transfer limiting layer is formed in the electrolyte near the interface with the metal surface, limiting the mass transfer rate of the polishing process. The mass transfer layer also is formed more completely or effectively in less exposed area and confined regions of space. The electrolytes based on phosphoric acid and HEDP, described herein, fulfill the requirement for the metal concentration dependent viscosity change.

The target viscosity of the electrolyte during metal removal process in many embodiments is preferably at least about 4 centipoise, such as between about 5-12 centipoise. Higher viscosities (e.g., 7-12 centipoise) are preferred in some embodiments for electroplanarization of smaller features (such as features with widths of less than about 100 µm, e.g., 2-60 µm) and/or for improving within-feature uniformity. Relatively lower viscosities, (e.g., 4-7 centipoise) can be used during electroplanarization of larger features, particularly when higher rate of metal removal is desired.

Figure 8:
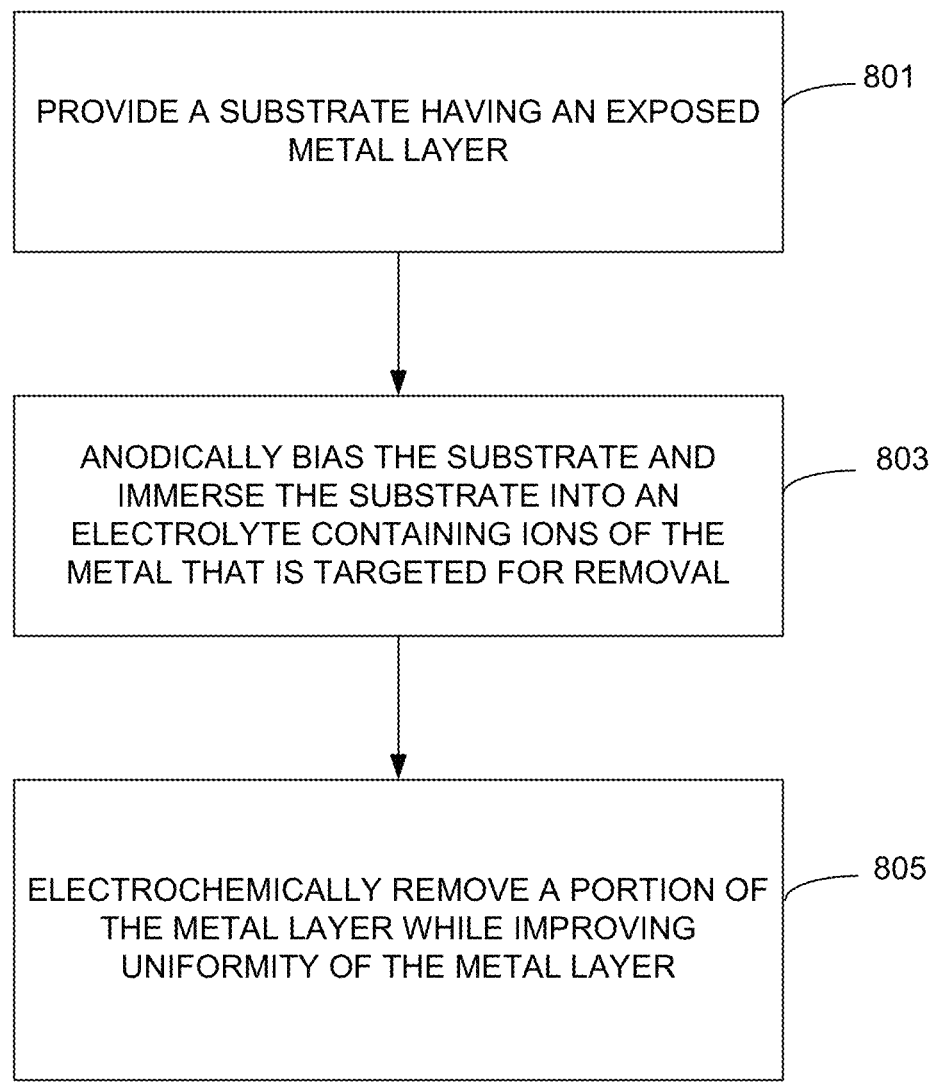
FIG. 8 is a process flow diagram illustrating an electrochemical metal removal process in accordance with an embodiment provided herein.

While in some embodiments, in the beginning of the metal removal process, the electrolyte is substantially metal-free, it was found that it is advantageous to include metal ions of the metal that is being removed as part of the electrolyte from the start of each metal removal process. When metal ions are included in the beginning of the process, the stability and reproducibility of the process is greater because large fluctuation in metal ion concentration (and in associated viscosity and diffusion coefficients as linked via the above discussion and equations) at the start of the process can be avoided. This is particularly suitable for embodiments, where the composition of the electrolyte is maintained substantially constant during the course of metal removal on one substrate and on successively processed substrates. Furthermore, if metal is not included in the beginning of the metal removal process, it may take longer time to reach desired electropolishing conditions. The process flow that utilizes metal-containing electrolyte is illustrated by the diagram shown in FIG. 8. The process starts in 801 by providing a substrate having an exposed metal layer. A variety of substrates can be used including but not limited to substrates having through mask features as described herein. The substrates with relatively smaller features, and substrates that are in need of within feature uniformity improvement, particularly benefit from this method. In 803 the substrate is biased anodically and is immersed into an electrolyte containing metal ions that are targeted for removal. For example, if the substrate has a copper layer that needs to be electroplanarized, the electrolyte will contain copper ions; if the metal to be removed is nickel, the electrolyte will contain nickel ions etc. In some embodiments, in the beginning of copper removal (at the time of substrate immersion), the concentration of copper ions is in a range of between about 0.1-2 moles/liter, and more preferably between about 0.2-1.5 moles/liter. In one implementation the electrolyte contains or consists essentially of an aqueous solution of copper (II) phosphate (including all types of phosphates, such as biphosphate) and phosphoric acid. In another implementation the electrolyte contains or consists essentially of an aqueous solution of a copper salt of HEDP, and HEDP In some embodiments, the electrolyte is prepared by dissolving a metal oxide or hydroxide, for example copper (II) oxide or copper (II) hydroxide, in an acid (e.g., in phosphoric acid). For example, a copper phosphate solution can be prepared by dissolving copper (II) hydroxide in an aqueous phosphoric acid. The acid reacts with the oxide or hydroxide to form the metal salt of the acid, and water. In some embodiments, a method of preparing electrolyte includes dissolving metal oxide and/or hydroxide (e.g., copper oxide or copper hydroxide) in an acid, and then combining the formed solution with a more concentrated acid. For example, copper oxide and/or hydroxide may be dissolved in a dilute phosphoric acid, and then combined with a more concentrated phosphoric acid. Next, additives, such as methanesulfonic acid, chloride, and a plating suppressor may be optionally added.

In some embodiments, particularly those, which utilize a cathode configured for reducing metal ions from the electrolyte, the electrolyte includes a plating suppressor, such as a compound from the class of polyalkylene oxides or from the class of polyalkylene glycols. For example, the electrolyte may include a substituted or unsubstituted polyethylene oxide and/or polyethylene glycol. These additives improve the morphology of the metal layer deposited on the cathode. Further, morphology can be improved by using very concentrated electrolytes, such as electrolytes with copper concentration (referring to copper ion concentration) of greater than 30 g/L and phosphoric acid at a concentration of greater than 625 g/L. In some embodiments supersaturated electrolytes may be used. Once the substrate is immersed into the electrolyte, the electrochemical metal removal process proceeds, as shown in 805, and the uniformity of the metal layer is improved. In some embodiments, the copper concentration in the electrolyte falls within the 0.1-2 moles/liter range during the entire metal removal process. In some embodiments the process is controlled such that the concentration of metal ions in the electrolyte is maintained at a substantially constant level throughout the metal removal process and between the processing of multiple wafers, as will be described herein.

Another parameter that can be used to modulate the metal removal conditions, is electrolyte temperature. Changes in temperature change both the heterogeneous reaction processes, as well as the properties of the electrolyte (e.g. conductivity and viscosity). The temperature ranges in some embodiments from about 20 to about 45 degrees C. In some embodiments it is preferable to conduct metal removal using heated electrolyte at a temperature that is greater than about 25 degrees C. For example, in some embodiments the process is conducted at an electrolyte temperature from a range of between about 27-40° C. Higher temperature can result in higher electroetching and polishing rates, and also results in greater water evaporation rates (if the process is operating in an open atmosphere condition). Because wafers are often pre-wetted prior to entering the plating cell and bath, and because wafers are typically rinsed after processing and some of the rinse water can get into the cell and bath during rinsing, the rate of evaporation that is greater than the rate of water uptake by other processes is advantageous. Prewetting of the wafer can also be performed using a pre-wetting liquid which has the same or similar composition as that of the electroetching/electropolishing electrolyte, minimizing water influx to the processing electrolyte. Processing at higher temperature can allow for that incoming water to be removed faster than it is added, and can be employed in a process which keeps the water content within desired limits by periodically measuring (or calculating and predicting) the water content changes, and periodically adding water to the bath/cell.

Table 1 provides several examples of electrolyte compositions and temperatures that were used to improve uniformity on a substrate having through mask features.

TABLE 1

| Feature diameter, μm | Target Viscosity (cP) | Target Phosphoric Acid concentration (wt %) | Target Cu$^{2+}$ concentration (wt %) | Target temperature (° C.) |
|---|---|---|---|---|
| 30-50 | 11 | 48 | 60 | 30 |
| 100-300 | 5 | 48 | 60 | 45 |
| 100-300 | 6 | 60 | 0 | 45 |

In many embodiments, the electrolyte that is used during metal removal is substantially different from the electrolyte that is used during electroplating. For example, in some cases electroplating is conducted on a substrate using an electroplating electrolyte comprising an acid such as sulfuric acid, metal ions such as copper sulfate, and one or more additives, such as suppressors) e.g., polyethylene glycol of average molecular weight about 1000), levelers (e.g., a polyamine leveler for example a quaternary polyamine), accelerators (such as bis(sodiumsulfoproply)disulfide) or a combination thereof, whereas electroplating is followed by an electroplanarization step, where in some cases the electroplanarization electrolyte does not include any additives. In some embodiments the primary type of acid used during electroplating and electroplanarization is different, or the acid used in plating (e.g. sulfuric acid) is completely absent in electroplanarization. In some embodiments where the same primary acid is present in both the plating and electroplanarization electrolytes (e.g. methanesulfonic acid is used in the electrolytes for both plating and electroplanarization), the concentration of the acid in the plating solution is less than 20% by weight, for example 15% by weight, and the concentration of the acid in the electroplanarization electrolyte is typically greater than 45% by weight, for example, 50% by weight or more. Highly concentrated acid solutions can have lower conductivities than solutions having lower acid concentrations. The concentrations of acid corresponding to the maximum conductivity vary depending on the nature of the acid. In order to achieve highly uniform plating it is typically desirable to use a solution with maximum conductivity and greatest additive impact and stability. Highly concentration acid solutions can have lower conductivity and decompose organic plating additives rapidly. In one implementation, electroplating is conducted in an electrolyte containing sulfuric and/or methanesulfonic acid, containing surface polarizing additives (suppressors and/or levelers compounds), which is followed by electroplanarization in an electrolyte containing phosphoric acid and/or HEDP as the main acids. In another implementation, a solder film of tin or a tin alloy (e.g. SnAg, PbSn) is plated in a methanesulfonic acid electrolyte (100 to 200 g/L) further containing tin methanesulfonate (30-70 g/L) and containing plating additives, and solder the electroplanarization is conducted in a methanesulfonic acid electrolyte (40-65 wt %) that also contains tin methanesulfonate (30-70 g/L) and is substantially additive free.

Electroetching and Electropolishing Regimes

It was discovered that electrochemical metal removal can be conducted in two distinct electrochemical regimes, each having its unique process behaviors and characteristics and effect on relative metal removal rates. The regimes are referred to herein as electroetching and electropolishing.

Figure 9A:
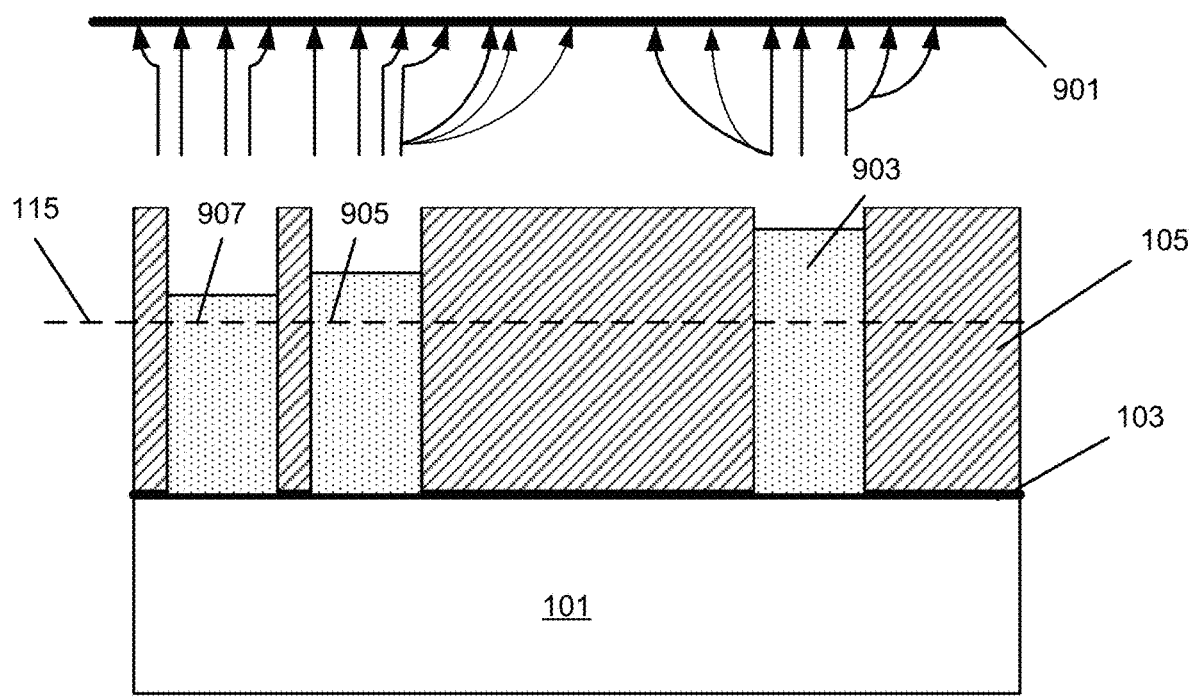
FIG. 9A is a cross-sectional view of an illustrative substrate undergoing electroetching.

In the electroetching regime the rates of metal removal are primarily governed by ohmic resistances in the electrolyte; that is, by how the distribution of current arranges itself due to the resistance in the electrolyte and the associated spatial distribution of the electric field. Surface reaction resistances and mass transfer (convective) resistances are not determining factors in this regime. Thus, for example, in an electroetching regime those features that are more exposed have a greater number of three dimensional current paths emanating from them from the electrolyte, have a lower ionic resistance, and therefore experience greater ionic current and will etch at faster rates than those that experience a larger ionic resistance (e.g. those close to a number of other features) and smaller ionic current. This is illustrated in FIG. 9A, which shows a two dimensional projection of a portion of a substrate having three metal-filled through mask features 903, 905, and 907 exposed to a cathode 901. In an electroetching regime, the more isolated feature 903 will experience greater ionic current (the path and magnitude shown schematically by lines, with the amount of current flowing being the same in each space between each adjacent set of lines) than denser features 905 and 907, and will be etched at a greater rate than these features. While the primary factor in determining the current distribution for electroetching is the relative feature spatial distribution, it should be noted that the electroetching rate and relative rates of etch can change with the depth of metal recess in the feature, because, as given feature becomes more recessed, a greater portion of the total ionic resistance to that feature will lie below the plane of the mask-electrolyte boundary 909 and within the recess of the feature; this tends to minimize the spatial distribution impact. While not wishing to be bound to any particularly model or theory, generally the electroetching rate is substantially constant and dependent on the feature's relative proximity to other features, as long as the depth of the feature is less than or equal to about half its width (aspect ratio less than 1:2). In many cases of interest, features are processed under these physical constraints. With that reservation, in many instances where etching is occurring at an aspect ratio of less than about 1:1, the etch rate of a selected feature will remain substantially constant throughout the electroetching process, even though the feature becomes deeper and deeper as the metal is being removed. For example, referring to the substrate shown in FIG. 9A, in the electroetching regime the etch rate for the isolated feature 903 will be greater than the etch rate for less isolated feature 905, which would be greater than the etch rate for the even less isolated feature 907, where the etch rate for each feature is substantially constant.

Figure 9B:
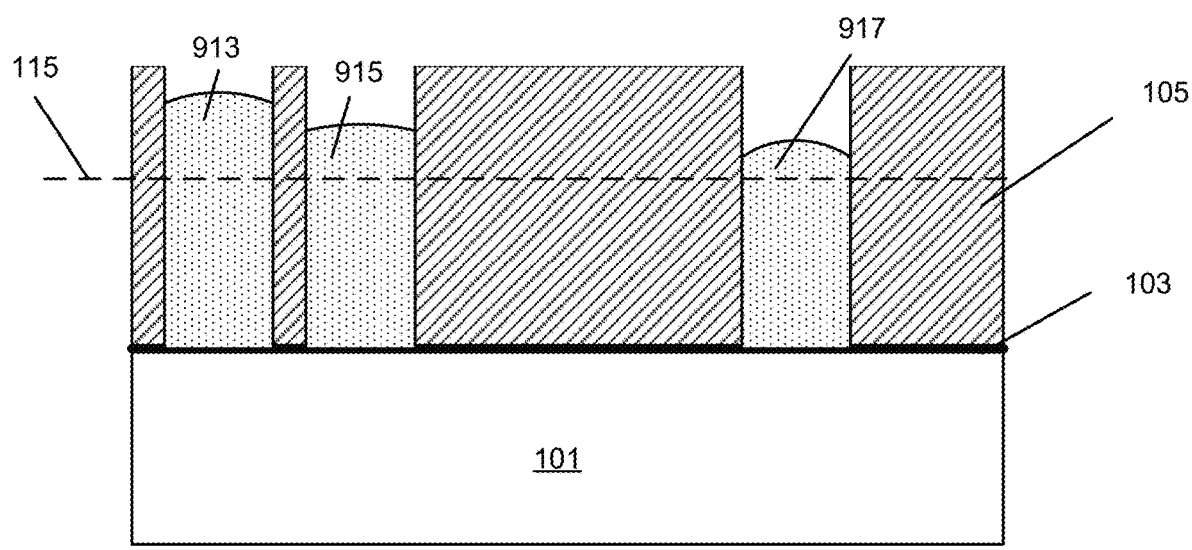
FIG. 9B is a cross-sectional view of an illustrative substrate undergoing electropolishing.
Figure 9C:
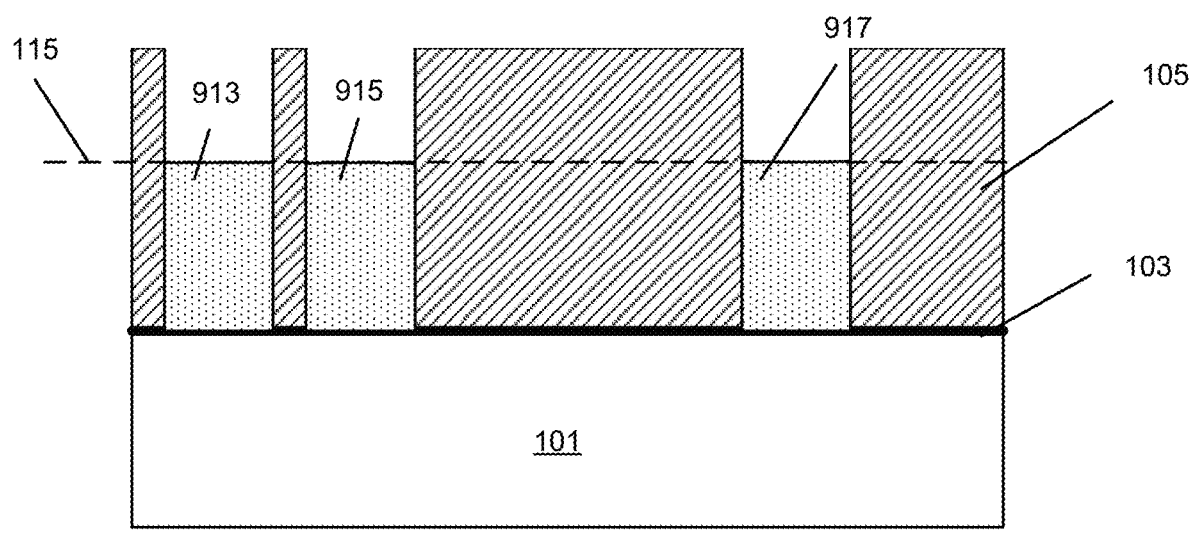
FIG. 9C is a cross-sectional view of the substrate shown in FIG. 9B after electropolishing.

Electropolishing regime is primarily governed by mass transport limitations related to the formation of a highly viscous film and the associated mass transport-resistant layer formed at the feature-electrolyte interface and in the features recess at sufficiently high potentials and suitable convection conditions. In the electropolishing regime the metal removal rate is not significantly dependent on the applied potential or electric field distribution in the electrolyte to and around the feature, but is dependent on an exposure of a particular feature to mass transfer limiting diffusive and convective processes. Thus, in the electropolishing regime, metal removal rate in less recessed features that are more exposed can be greater than in more recessed, less exposed features. Further, within a single feature, thicker (higher-lying), more exposed portions of a feature experience in some embodiments greater rates of metal removal than relatively thinner (lower-lying) portions. While electropolishing of relatively well exposed feature can occur at a stable metal removal rate, if electropolishing continues until the feature becomes significantly less exposed, the metal removal rate from the feature would be reduced. Thus, in some embodiments electropolishing comprises electrochemically removing metal from a feature or a protrusion within a feature, where the metal removal rate from this particular element is greater in the beginning of the electropolishing than towards the end of the electropolishing process. Electropolishing removal rates can be illustrated, for example, with reference to FIGS. 9B and 9C. FIG. 9B illustrates a schematic cross-sectional view of a substrate before electropolishing, the substrate having three through-mask features 913, 915, and 917. In this example feature 913 is the highest-lying, thickest feature; feature 915 is thinner than feature 917, and feature 913 is the thinnest and lowest-lying of all three features. The features are also domed, with a thicker central portion and thinner portions at the edges. In an electropolishing regime, metal removal rate from the highest lying feature 913 would be initially greater than from the lower lying feature 915, which in turn would be greater than from the lowest lying feature 917. As electropolishing proceeds, and the features get deeper and less exposed, the metal removal rates would decrease, which eventually would result in a decrease of the feature height difference, and, consequently, in planarization. Further, the doming is also reduced by electropolishing because the more exposed central part of the dome would etch at a higher rate than less exposed lower lying portions of the dome near the sidewalls. As a result of electropolishing, a structure shown in FIG. 2C may be obtained, where the thickness differences between the features are reduced and the within-feature shape becomes substantially flatter.

It is noted that electropolishing is significantly less sensitive to feature exposure and ionic current environment than electroetching, and allows for metal removal from a feature which is less recessed (even if it is not the most isolated one), to occur at a faster rate than from the one that is more recessed. If the more recessed feature were the more isolated feature (as shown in FIG. 9B), such a trend of removal rates would not be possible in the electroetching regime (in electroetching it is the isolated feature which etches faster, and not necessarily the one that is least recessed). Electropolishing, however, can be successfully used to planarize both the substrates, where the isolated feature is more recessed (lower-lying) than other features (as in shown in FIG. 9B), and where the isolated feature is less recessed (higher-lying) than other features (as in the substrate shown in FIG. 9A). Further, it was discovered that metal removal in the electropolishing regime provides generally a smoother and flatter metal feature surface than metal removal in an electroetching regime.

Electropolishing and electroetching regimes provide a unique set of tools for improving different types of uniformity (e.g. within feature, within die and within wafer), for reducing feature surface roughness, for optimizing planarization rates and, consequently, for improving substrate processing throughput. In some embodiments metal removal is carried out such that the process is configured to be in a particular regime. Electroetching and electropolishing differ in the potential at which they occur, where the potential refers to the substrate potential during electrochemical metal removal. Electroetching occurs when the substrate potential is maintained below a critical potential during metal removal (preferably at least 50 mV, such as 100 mV below the critical potential), and electropolishing occurs when the substrate potential is maintained above the critical potential during metal removal (preferably at least 100 mV, such as 200 mV above the critical potential), where the critical potential can be determined as described herein. While not wishing to be bound by any particular model or theory, it is believed that for electropolishing to occur, one must drive a sufficient metal removal rate (and therefore apply a sufficiently large potential) so that a mass transfer inhibiting resistive film forms near the interface due to a rapid reduction in diffusion coefficient with increasing metal content in the electrolyte. It is noted that the critical potential can be dependent on the distribution of features on a substrate, electrolyte chemistry, and the rate of transverse electrolyte flow, but can be estimated based on data obtained from substrates that are similar to the substrate-to-be-processed, and treated under conditions that are similar to the anticipated processing conditions. It can also be determined more precisely using a substrate having feature distribution that is identical to one on the substrate to-be-processed, where the substrate used for critical potential determination is treated under the same conditions as anticipated for the substrate-to-be-processed. It is understood that when one conducts electroetching or electropolishing, one is aware of the critical potential and takes steps to conduct the process in the desired regime, e.g., by monitoring the potential using a reference electrode. It is useful to have the reference electrode located close to the wafer surface or at a point in the cell where the voltage drop to the wafer surface is small (e.g. in a plane where little or no current is flowing to or from the wafer). However the step of conducting electroplating or electropolishing does not itself involve the step of determining the critical potential. The critical potential can be provided to the user in the form of written or programmed instructions, or it can be estimated or determined by the user or a service provider prior to metal removal using the estimation, computational modeling, and/or determination methods provided herein, or by another suitable method.

Figure 10:
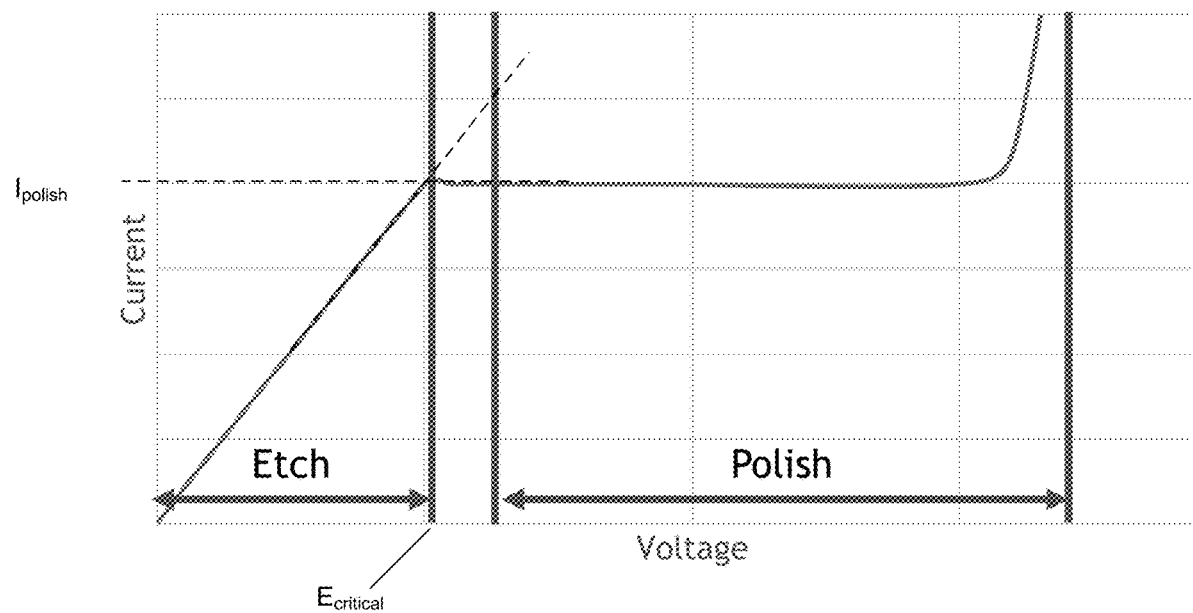
FIG. 10 is an experimental I-V diagram for estimating a critical potential used in determination of electroetching and electropolishing regimes.

FIG. 10 illustrates a current-voltage plot that can be used for estimating the critical potential. Etch and polish regimes can be identified from FIG. 10 by examining the current-voltage (I/V) behavior of the electrode (wafer)/electrolyte system. The etch regime is the regime starting anodic of the particular metal (e.g. copper) equilibrium potential in the electrolyte. In this regime the current increases with applied potential (in the case shown in FIG. 9 linearly). Further increases in potential lead to a transition into the polish regime. The polish regime is the regime in which current remains substantially constant over a range of applied potentials (e.g. 500 mV). The critical potential can be estimated as the potential corresponding to an intersection of two tangent lines, where the first tangent is drawn to the current plateau region, and the second tangent is drawn to the fast current growth region.

At an interface between the etch and polish regimes there may be is a small transition region, sometimes accompanied by a peak in current (depending on voltage ramp rate). The size and breadth of this peak can depend on the voltage ramping rate or time at a sequence of potential steps. At voltages above the polish regime, oxygen evolution from the electrolyte begins and causes the current to again increase with voltage. In addition to sweeping the potential continuously, the curve shown in FIG. 10 can be constructed, for example, by electrochemically removing metal from a series of wafers, where each wafer is processed at a pre-determined voltage; measuring the resultant currents, and plotting the voltage-current relationship for the wafer series.

Figure 11:
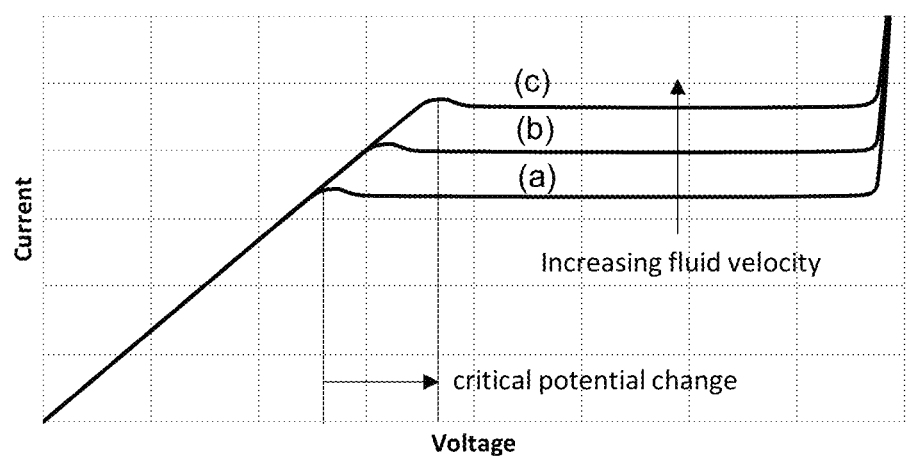
FIG. 11 is a series of experimental I-V curves illustrating dependence of critical potential on the electrolyte cross-flow rate.

As it was previously mentioned, the critical potential depends not only on the electrolyte composition, but also on electrolyte temperature and the transverse flow rate of the electrolyte. FIG. 11 illustrates how the critical potential changes with the changing transverse flow rate. FIG. 11 illustrates three I-V curves for substrates processed under identical conditions, where the only difference is the transverse flow rate. As the transverse flow rate increases from curve (a) to (b) and to (c), the critical potential shifts to higher values. It is also noted that the polishing current increases with the increasing flow rate. It is believed that with higher flow, material from the upper portion of the diffusion-resistive film is more rapidly removed, and so the film is generally thinner and less resistive. The shift in the critical potential can be utilized in some embodiments for controlling the transfer between the etch and polish regimes using changes in electrolyte transverse flow.

Figure 12:
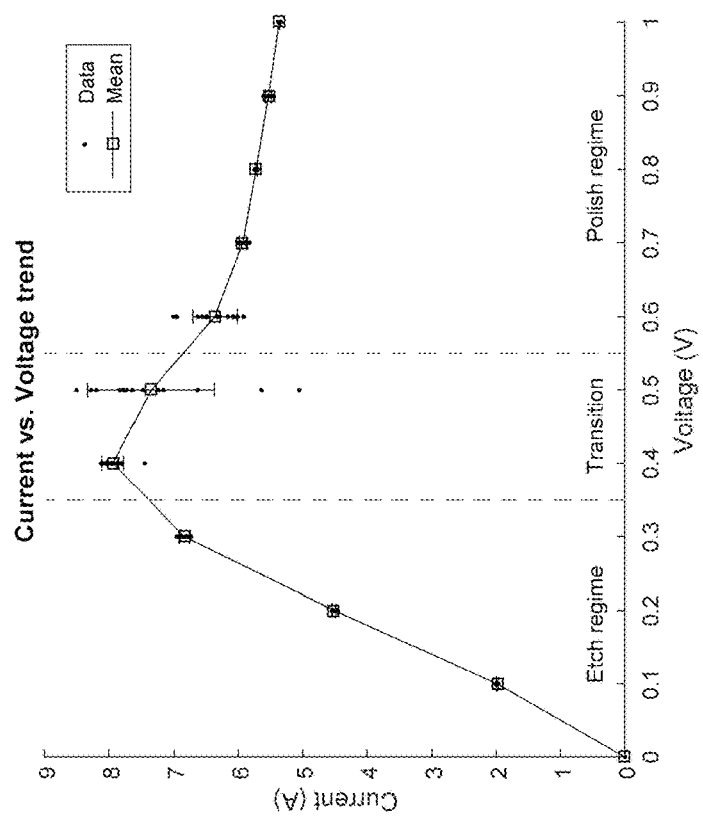
FIG. 12 illustrates two experimental plots used in determination of a critical potential.
Figure 12:
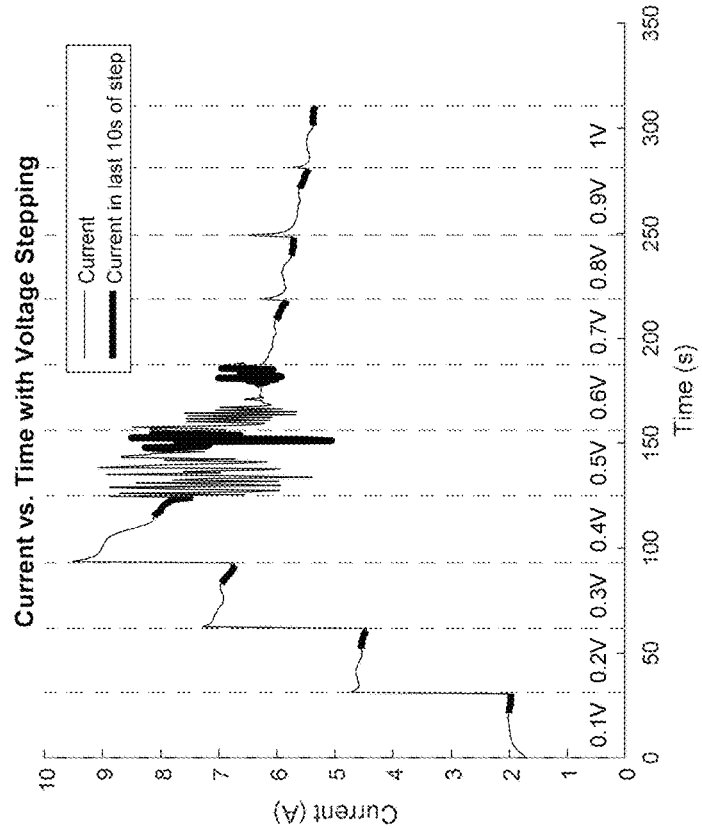

A more precise determination of the critical potential can be carried out using a single wafer substrate that is identical to the wafer substrate that will be processed (i.e., has the same distribution of features on the substrate), with the utilization of the same electrolyte and electrolyte flow rate that will be used during actual processing. The substrate is immersed into an electrolyte, and a set potential is applied to the substrate and current is measured continuously. The potential is increased in a stepwise manner for the same substrate and current is measured over time. The resulting diagram 1201 is shown in FIG. 12, which illustrates current dependence on time, where voltage was increased in a stepwise manner from 0.1 V to 1 V in 0.1 V increments with about 30 seconds per increment. The steady state current was taken as the mean of the current obtained in the last 10 seconds of each increment. Alternatively, the mean current value over the entire increment or the current value at the end of each increment can be taken as the steady state current value. Next, the steady-state current values are plotted as a function of voltage, resulting in the plot shown in plot 1203 shown in FIG. 12. Steady state current is shown as squares, the actual measured current is shown as dots. Error bars show one standard deviation of current values at each voltage. The critical potential in this plot corresponds to the voltage, at which the current peaked −0.4 V in this example. The etch regime corresponds to potentials of less than 0.4 V, and preferably less than 0.35 V (to account for a transition region, since current at 0.35-0.4 V may be relatively unstable), and the polish regime corresponds to potentials greater than 0.4 V, and preferably greater than 0.55 V (to account for a transition region, since current at 0.35-0.4 V may be relatively unstable). In those cases, where current does not have a peak, but simply has an inflection from a positive slope region to a zero slope region, the voltage of the inflection point will correspond to the critical potential. If a more precise determination of the critical potential is desired, or if voltage steps are relatively larger, the critical potential can be determined by drawing two tangents to the plot—one through the last experimental point from a region showing positive slope and one through the first experimental point from a region showing a negative or a zero slope. The voltage of the intersection of the two tangents would correspond to the critical potential.

Figure 13:
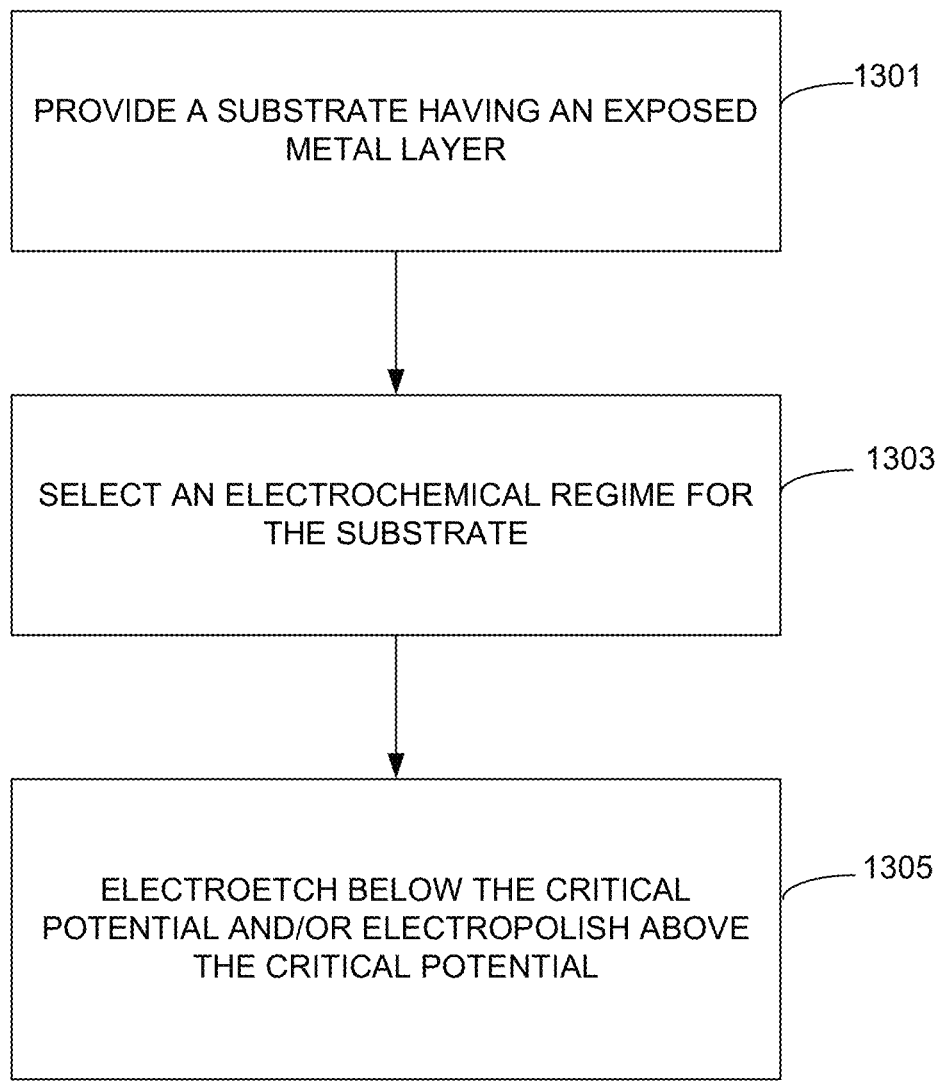
FIG. 13 is a process flow diagram illustrating an electrochemical metal removal process in accordance with an embodiment provided herein.

FIG. 13 provides an illustrative process flow diagram for an electroplanarization process with the use of specific electrochemical regimes. In 1301 a substrate having an exposed metal layer is provided. Next, in 1301 an electrochemical regime is selected for the substrate. The selection can be governed by the specific type of uniformity that needs to be improved, and/or by throughput considerations. Electroetching process is well-suited for improving within die uniformity on substrates having dense and isolated through resist features, as well as for substrates having through resist features of different diameters. Electroetching can also be used to improve within wafer uniformity, and can be applied to planarize concave or convex shapes within features. Electropolishing can also be used to improve these types of non-uniformity, but in addition can be employed to minimize surface roughness. It can also be used to reduce the height range of features when the thickest feature is not an isolated feature. While electroetching metal removal rates are typically lower than electropolishing metal removal rates, electroetching can often achieve desired target uniformity faster than electropolishing. Therefore, for throughput considerations electroetching is used in some embodiments either alone or before electropolishing. In operation 1305 the metal layer of the substrate is electroetched below the critical potential and/or electropolished above the critical potential. Preferably, a reference electrode configured for measuring the potential in the proximity of the substrate is used to ensure that the metal removal is conducted in the desired electrochemical regime. In some embodiments, the entire electroplanarization step is performed in the electroetching regime. In some embodiments, it is preferable to conduct electroetching under current-controlled conditions. Referring to FIG. 10, it can be seen that maintaining the current below the relatively stable current value of the "plateau" electropolishing region ($I_{polish}$) will lead to electroetching. Thus, in some embodiments, electroetching is conducted below the critical potential but without active potential control, where control over the regime is performed by maintaining a current at a lower level than the electropolishing current. In some embodiments, the current is maintained at a constant level during electroetching. In other embodiments, the current is changed during electroetching but still remains below the polishing current. It is also possible to perform electroetching under potential-controlled conditions, but current-controlled conditions are preferred in some embodiments because it is often easier to accurately control current, because implementation hardware can be less expensive, and because it is easier to predict how much material will be removed at a given current (which is directly proportional to the removal rate) than at a given voltage (where the removal rate can vary throughout the process).

In some embodiments electroetching of copper is conducted at a potential of between 0.1-0.7 V, and electropolishing of copper is conducted at a potential of between about 0.7-2.0 V versus copper electrode, where the potential used during electropolishing is greater than the potential used during electroetching.

When electropolishing regime is selected, in some embodiments the electropolishing is performed using potential control. For example, the substrate potential can be directly controlled to be greater than the critical potential (e.g., at least about 0.1 V greater than the critical potential) using a reference electrode positioned in the proximity of the substrate or at an equivalent position. Typically the current will change during the course of the electropolishing operation, so integration of the charge passed and comparing that charge to a target end point removed charge is useful.

Figure 14:
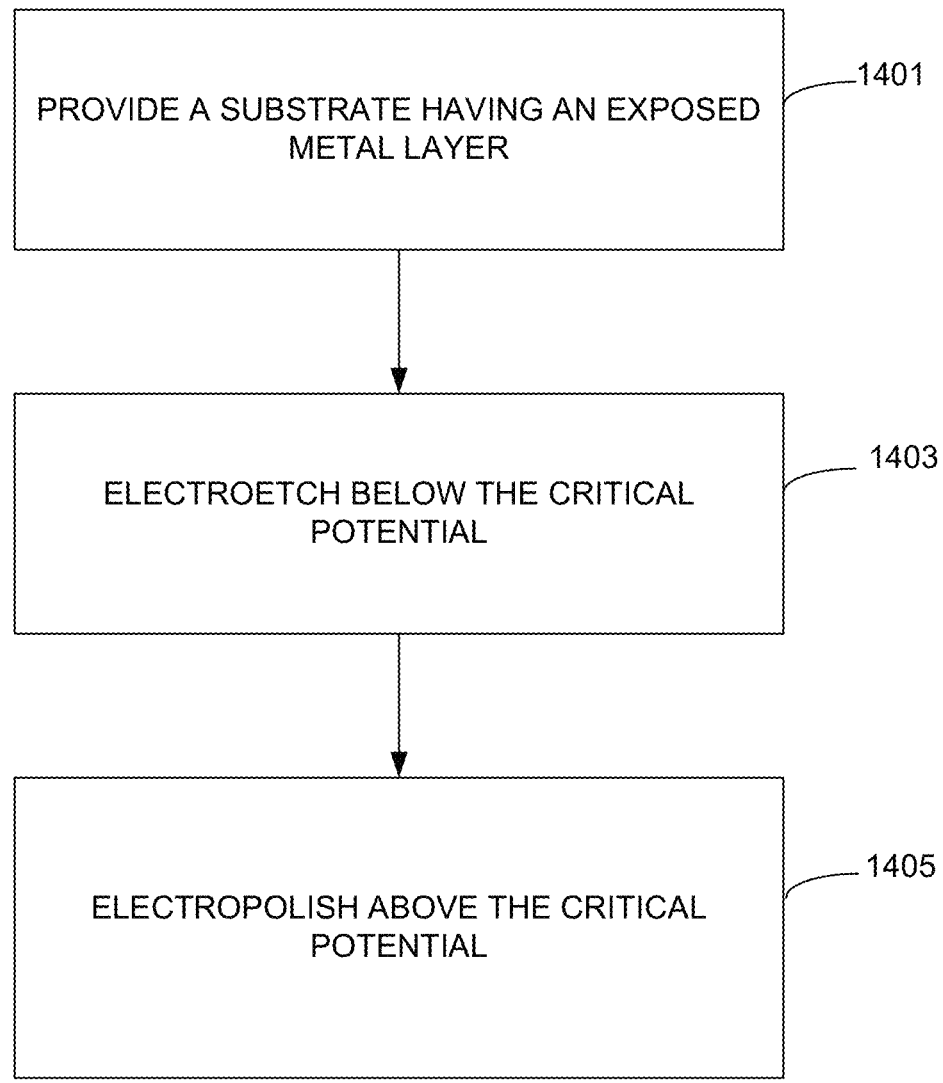
FIG. 14 is a process flow diagram illustrating an electrochemical metal removal process in accordance with an embodiment provided herein.
Figure 15A:
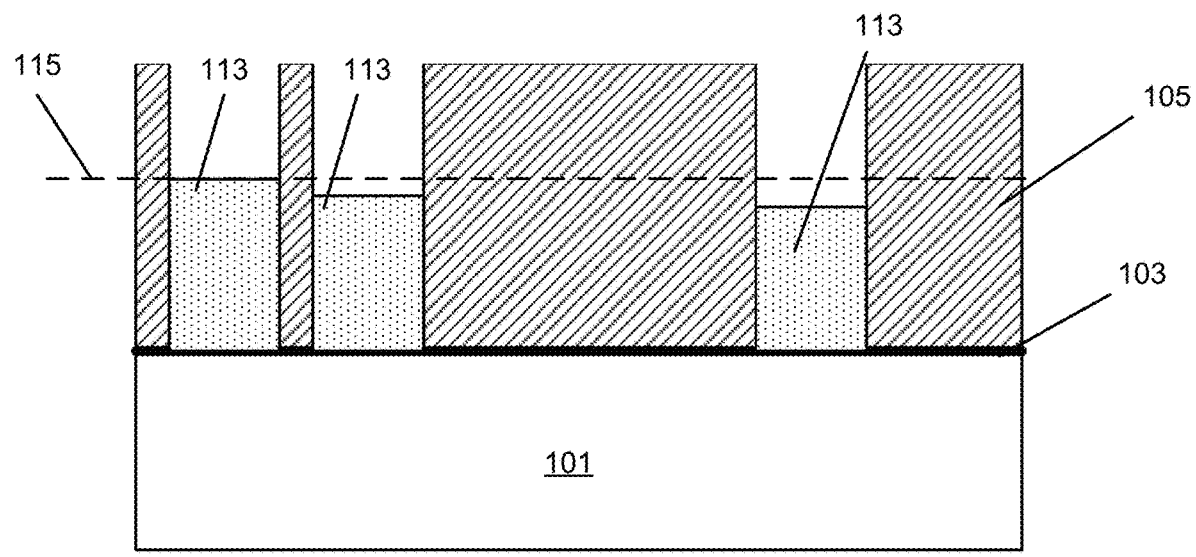
FIG. 15A is a schematic cross-sectional view of a substrate after electroetching, illustrating an overetching problem.
Figure 15B:
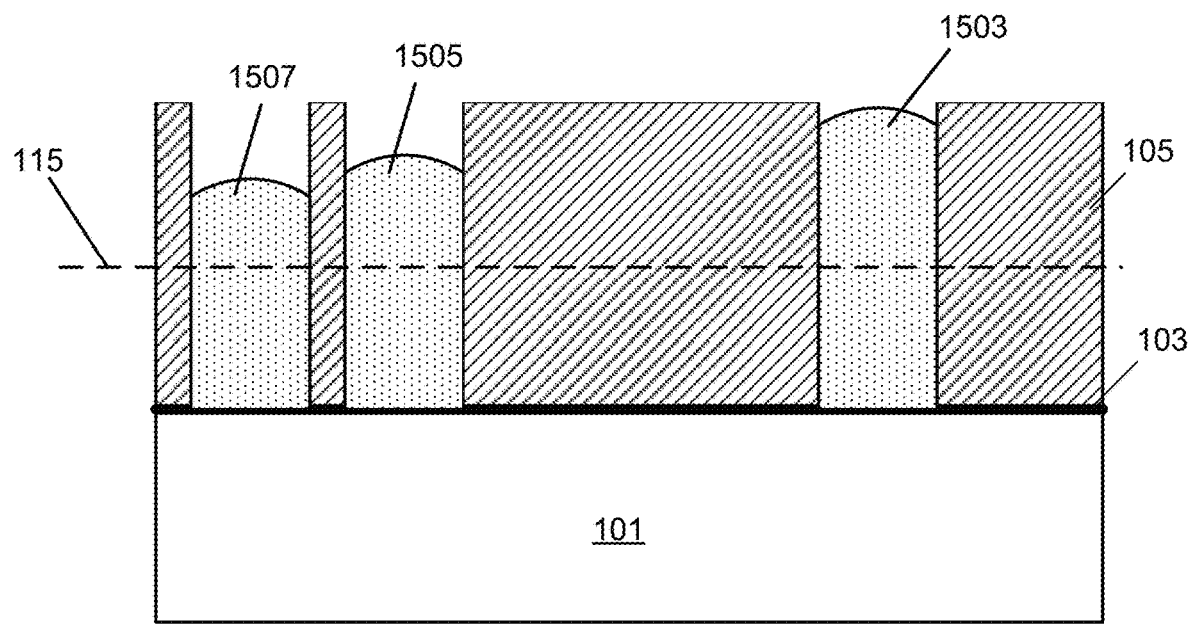
FIGS. 15B-15E are schematic cross-sectional views of a substrate undergoing electroetching followed by electropolishing, according to an embodiment provided herein.
Figure 15C:
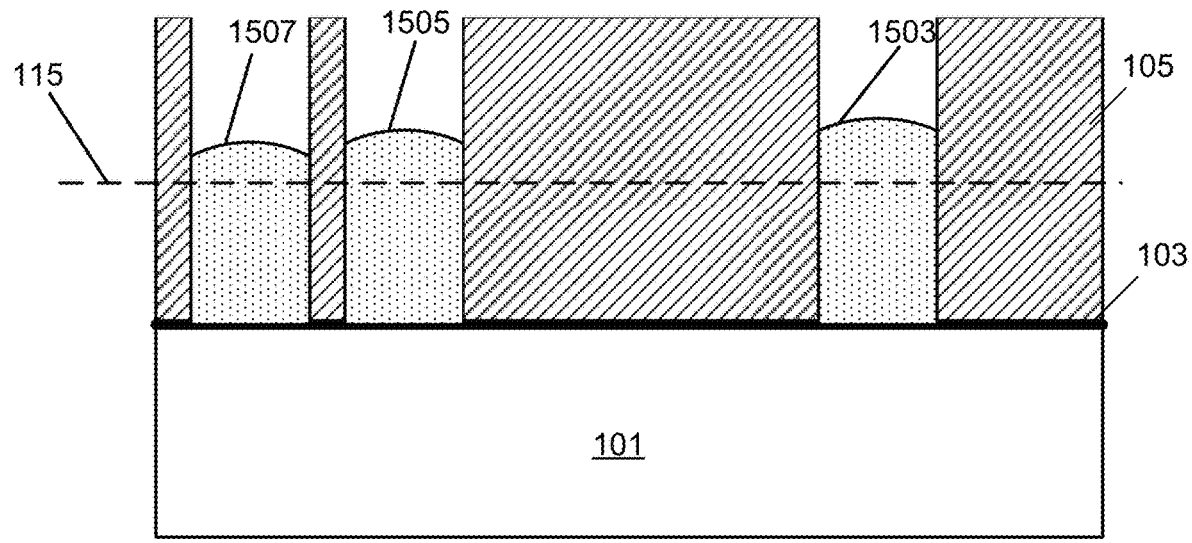
Figure 15D:
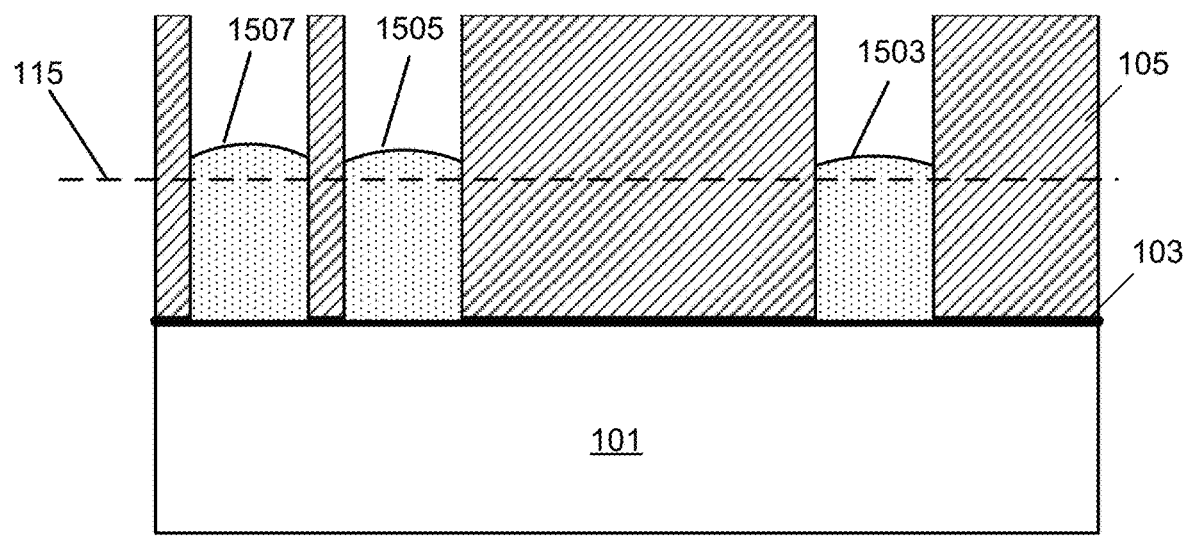
Figure 15E:
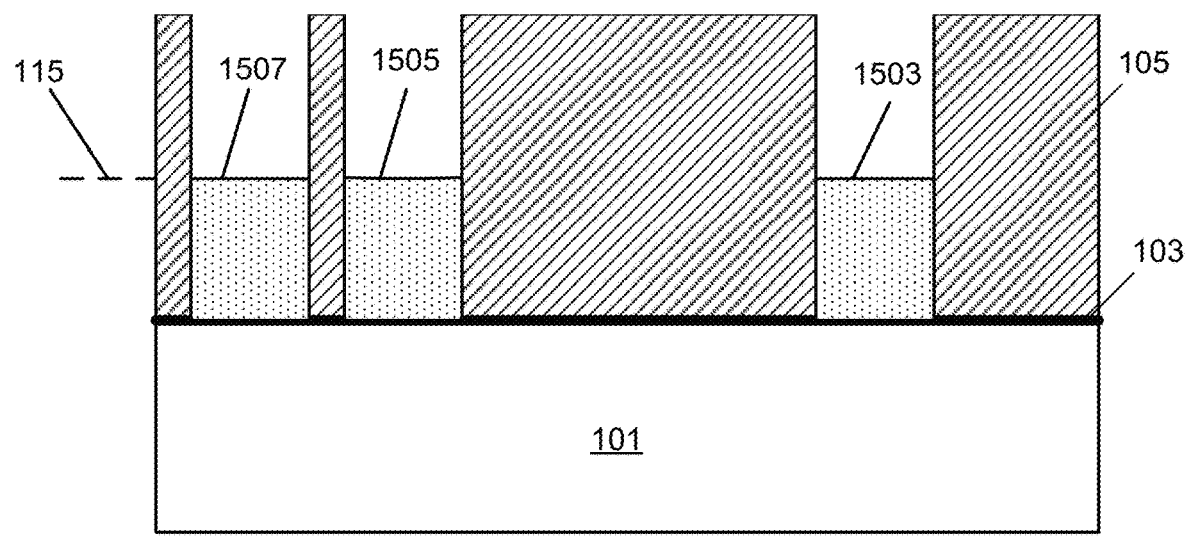

While electroetching regime provides for fast improvement of uniformity, in some implementations it may be desired to sequentially perform electropolishing after electroetching. This is because electroetching may lead to a relatively rough surface on metal features. Furthermore, in some cases electroetching can lead to overetching of features that were initially thicker than others, which would impact the uniformity. Electropolishing process tends to be more self-regulating; less deep features are removed faster than more deep features, but as the depth of the features becomes similar, the rates of removal between the two features become similar. For example, if the starting substrate such as shown in FIG. 1B is processed, the electroetch rate in the isolated feature would be greater than electroetch rates in denser features throughout the electroetching process, which may eventually lead to a structure shown in FIG. 15A, where the isolated feature is overetched below the target level, while the denser features are just reaching it. This process may be avoided by plating thicker before performing the electroetching step, though this process doesn't have the potentially desirable attributes that electropolishing offers such as smooth and as flat features surfaces. Therefore, alternatively, this problem may be avoided if electroetching is stopped before any of the features reaches the target level, and the metal removal regime is switched to electropolishing. Whether this happens depends on the relative removal rates of the isolated versus dense features for the electropolishing process used. Since electropolishing is capable of removing metal with a variable speed that can decrease over time and which depends on exposure of a selected feature to convection, eventually the planarized structure can be obtained, using this two step method. This method is illustrated by the process flow diagram shown in FIG. 14 and by structures shown in FIGS. 15B-15E. The process starts in 1401 by providing a substrate having an exposed metal layer (e.g., a substrate having a discontinuous metal layer and an exposed dielectric layer, such as a substrate with through mask plated features). An illustration of such substrate is provided in FIG. 15B. In this example, the substrate contains three features, 1503, 1505 and 1507, where the more isolated feature 1507 is filled with metal to a higher level than the remaining denser feature 1503 and 1505. In addition, in this illustration all three features 1503, 1505, 1507 have domed metal fill within the features. The process follows in 1403 by electroetching metal below the critical potential. Electroetching significantly reduces thickness variation between the features, as it proceeds faster in the more isolated feature 1507 than in the remaining two feature. However electroetching in this example does not substantially reduce the doming within the individual features. The resulting structure is shown in FIG. 15C. As electroetching proceeds further, an inversion in the thicknesses of individual features may occur as illustrated in FIG. 15D, which shows that the isolated feature 1507 now became the feature with the smallest metal thickness. Next, the conditions are changed in 1405 and a portion of metal is removed in the electropolishing regime above the critical potential. The structure obtained after electropolishing is shown in FIG. 15E. Electropolishing significantly reduces within-feature thickness variation and substantially flattens the doming in addition to reducing thickness variation between the features. Preferably, a reference electrode is used to monitor the potential at least during a portion of the process or for the entirety of electroetching and electropolishing. In some embodiments electroetching is performed while controlling the current to be lower than the polishing current (which will indirectly keep the potential below the critical potential), and then transitioning to active potential control (e.g., increasing the applied potential) to transition to the electropolishing process, and directly controlling the potential to be above the critical potential throughout the electropolishing process.

It is noted that while the method involves electroetching below the critical potential, and electropolishing above the critical potential, the critical potential itself is dependent on process conditions, such as on transverse electrolyte flow rate, and temperature. In some embodiments transitioning from the electroetching to electropolishing includes decreasing the transverse flow rate of electrolyte in addition to an increase in applied potential or even without increasing the applied potential, where the magnitude of transverse flow decrease is configured to shift the process from the electroetching to the electropolishing regime. For example, in one embodiment the substrate is electroetched at a controlled current corresponding to a potential that is below the critical potential for these conditions, while supplying electrolyte at a first transverse flow rate. Next, the electrolyte flow rate is decreased to transfer the process into the electropolishing regime without changing the applied potential, where the potential is now above the critical potential for the low transverse flow rate conditions.

Figure 16A:
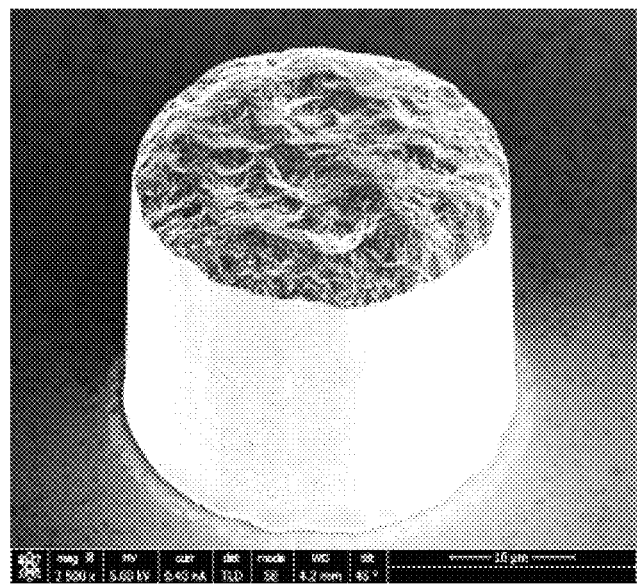
FIG. 16A is an SEM photograph of a copper feature obtained without electrochemical metal removal.
Figure 16B:
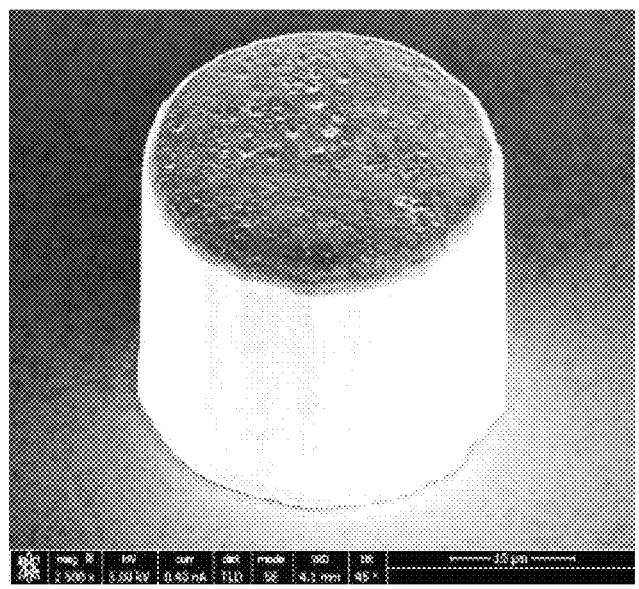
FIG. 16B is an SEM photograph of a copper feature electroplanarized in the electropolishing regime.
Figure 16C:
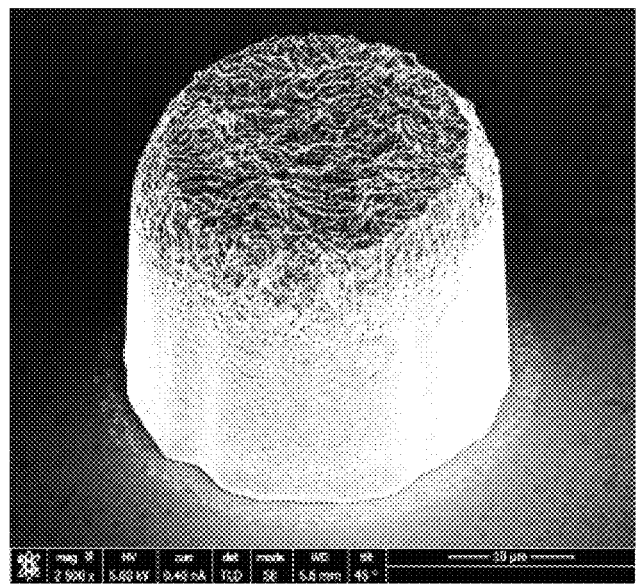
FIG. 16C is an SEM photograph of a copper feature electroplanarized in the electroetching regime.
Figure 16D:
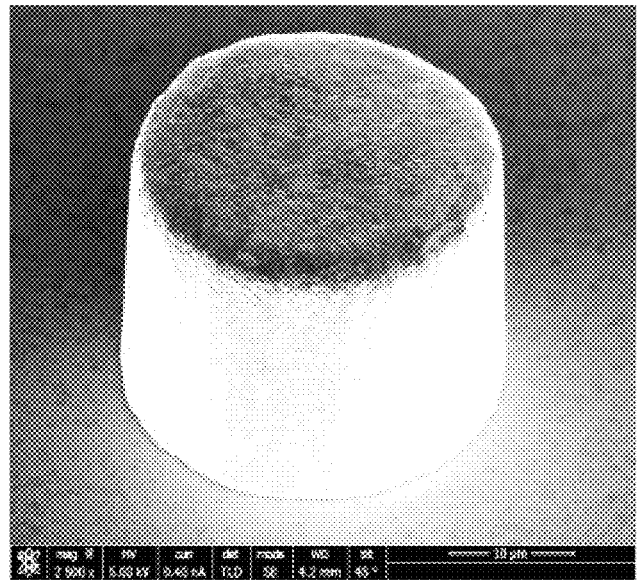
FIG. 16D is an SEM photograph of a copper feature electroplanarized by electroetching followed by electropolishing.

FIGS. 16A-16D are SEM photographs of 50 μm wide and approximately 30 μm tall copper pillars (shown after photoresist strip) that were obtained after various processing sequences from four different wafers. All pillars were obtained after recessed features were electrofilled under the same conditions in a high speed plating electrolyte that yields a generally rough metal surface. FIG. 16A is a control example, which shows the pillar after copper electroplating and without any electroetching or electroplanarization steps. It can be seen that the top surface is very uneven and domed in shape. FIG. 16B shows a copper pillar obtained after electroplating followed by electropolishing only. It can be seen that almost all height variation is removed by electropolishing. FIG. 16C shows a copper pillar obtained after electroplating followed by electroetching only. The larger thickness differences were somewhat improved by this method, but the surface roughness obtained after electroetching was significant. FIG. 16 D shows a copper pillar which was processed using electroetching (80% of metal removal time) followed by electropolishing (20% of metal removal time). It can be seen that a smooth surface was obtained.

Homeostasis of Electrolyte Components—

In some embodiments, electrochemical metal removal is conducted while maintaining a homeostasis of electrolyte components during the course of electrochemical metal removal on a substrate, or during the course of sequential electrochemical metal removal on a plurality of substrates. Maintaining homeostasis is important so as to maintain a predictable and constant set of wafer processing results (e.g. wafer-to-wafer consistency in WIF, WID and metal removal rates) and involves controlling concentrations of one or more components of the electrolyte, such that the concentrations do not fluctuate from a target concentration by more than a small defined amount. In an alternative embodiment a substantially constant electrolyte viscosity is maintained during the course of electrochemical metal removal on a substrate, or during the course of sequential electrochemical metal removal from a plurality of substrates. In this embodiment the viscosity is controlled using one or more viscosity sensors and is not allowed to fluctuate from a target viscosity by more than a defined amount. Viscosity can be modulated by adding a less viscous fluid (e.g., by adding water to acid-based electrolyte) and/or raising temperature if viscosity is higher than desired, to thereby keep the viscosity at a desired level. While maintaining homeostasis of electrolyte components' concentrations is preferred in many implementations, maintaining a substantially constant viscosity can be similarly used to keep the process rate and processing characteristics substantially invariant. In some embodiments, concentrations of metal ions, and/or anions, and/or protons in the electrolyte are controlled such that they do not deviate from the target concentrations by more than defined tolerable amounts. The term "maintaining concentration at a target level" refers to maintaining the concentration in a range within the allowed deviation from the target concentration. For example if the target concentration of copper ions is 50 g/L and the allowed deviation (fluctuation) is 5%, the concentration of copper is maintained at a target level if the concentration of copper is within a range of between 5% less than 50 g/L and 5% more than 50 g/L or 47.5-52.5 g/L. Generally the allowable deviations are determined with respect to the impact the change in the target species has on the processing rate, average feature removal rates, relative removal or planarization rates between features (contrast), feature shape planarization characteristics or rates, etc.

Figure 17:
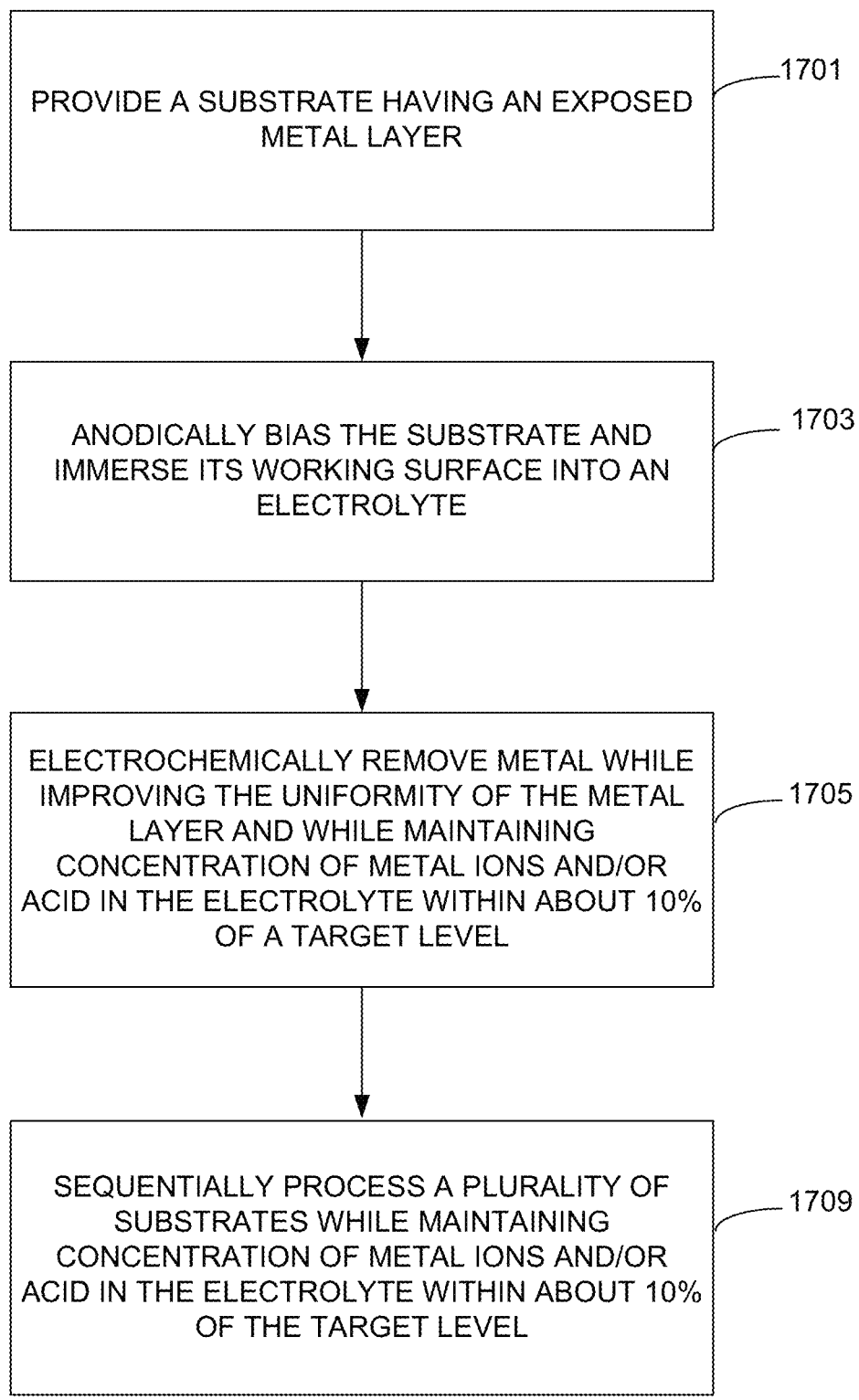
FIG. 17 is a process flow diagram for a process in accordance with an embodiment provided herein.

This process is illustrated in FIG. 17. After a substrate having an exposed metal layer is provided in 1701, the substrate is anodically biased and is immersed into an electrolyte in 1703. Next, in 1705, the substrate is processed such that the metal is electrochemically removed, and the uniformity of the metal layer is improved, while maintaining concentration of metal ions and/or acid (protons) in the electrolyte within about 10% of the target level. In this example the allowed deviation is 10%. In some embodiments, the concentrations of the metal ions and/or acid are maintained within about 5% of the target level, e.g., within about 2% of the target level. In one of preferred embodiments, the concentrations of both metal ions and acid are controlled. For example in one implementation during electrochemical copper metal removal, the concentration of copper ions is maintained such that it does not fluctuate by more than 5%, or, more preferably, by more than 2.5% from the copper target level, and concentration of acid does not fluctuate by more than 2%, or, more preferably, by more than 0.5%, from the acid target level. For example in a system, where the target concentration of copper ions is 60 g/L and the target concentration of phosphoric acid is 48 weight %, the homeostasis can be achieved by maintaining copper concentrations in a range of about 57-63 g/L (within about 5% of the target level), and, more preferably, in a range of about 58.5-61.5 g/L (within about 2.5% of the target level), while maintaining the phosphoric acid concentration in a range of about 47.04-48.96 weight % (within about 2% of the target level), and, more preferably, in a range of about 47.76-48.24 weight % (within about 0.5% of the target level). In some embodiments, the substrate is initially immersed into the electrolyte containing metal ions and acid at concentrations that do not deviate from the target levels of metal ions and acid by more than a small defined amount, and during the course of the electrochemical metal removal the concentrations of metal ions and acid are controlled such that they do not fall outside the defined ranges (e.g., within 10%, or within 5% of target amounts). In other embodiments, the substrate may be initially immersed into an electrolyte, where one or more components deviates from the target concentration by more than 10%, but during the course of the electrochemical metal removal, the concentrations of this one or more components, are brought to the desired ranges (within 10% of the target level of each of the components) and are maintained throughout the duration of the electrochemical metal removal on the substrate.

Next, after a first substrate has been processed, the process follows in 1709 by sequentially processing a plurality of substrates while maintaining the concentrations of metal ions and/or acids within about 10% of the target level. For example, at least 2, at least 5, at least 10, or at least 50 substrates may be sequentially processed, such that metal is electrochemically removed from their surfaces such that the uniformity of metal layers is improved, while maintaining concentrations of metal ions (e.g., copper ions) within 10% of the metal ion target concentration, and while maintaining acid concentration within 10% of the acid target concentration. More specific ranges for maintaining homeostasis over the course of processing of several substrates can be the same as those described for a single substrate above.

In addition to maintaining homeostasis of metal ion concentration and/or acid concentrations, the methods may further involve controlling electrolyte temperature during the course of electrochemical metal removal from a single substrate or during sequential processing of a plurality of substrates such that the temperature deviates by no more than about 1° C. from a target temperature, preferably by no more than about 0.5° C. from the target temperature. In some embodiments, viscosity of the electrolyte is also controlled such that the viscosity does not deviate from a target viscosity by more than a small defined value. The viscosity may be controlled indirectly through control of acid and copper concentrations and/or through control of the temperature.

In an alternative embodiment, viscosity is maintained at a substantially constant level without specifically measuring concentrations of electrolyte components, and without deliberately keeping the concentrations of electrolyte components at a constant level. In this embodiment the viscosity of the electrolyte may be measured directly, e.g., using an Anton Paar L-Vis 510 or Emerson FVM viscometer, and may be adjusted if it deviates from a target viscosity by more than a pre-determined value. The viscometer in some embodiments is used in combination with a thermometer that is configured for measuring electrolyte temperature. Viscosity can be increased in response to a too low viscometer sensor reading, for example, by evaporating water from the electrolyte, reducing temperature of the electrolyte, adding a more viscous fluid to the electrolyte (e.g., an acid-containing and/or metal ion containing solution of higher viscosity) or by a combination of these methods. Viscosity can be decreased in response to a too high viscometer sensor reading, for example, by adding a less viscous fluid to the electrolyte (e.g., by adding water), increasing temperature of the electrolyte or by a combination of these methods. Viscosity changes in response to these changes can be accurately predicted using empirically pre-determined correlations. In some embodiments, the viscosity of the electrolyte is maintained such that it does not deviate by more than a pre-determined amount from the target value.

Maintaining homeostasis of electrolyte components while processing one or several substrates has a number of important advantages. When several substrates are sequentially processed, the maintenance of desired concentrations leads to high wafer-to-wafer reproducibility of electrochemical metal removal and is a significant factor for obtaining similar uniformity improvements and predictable and constant removal rates and processing times for a plurality of similar wafers. Further, during electrochemical metal removal from a single wafer, it is preferable to maintain metal ions and acid concentrations within a desired narrow range, as described, because stable concentrations allow for a more precise identification of a critical potential and selection of electrochemical regime, and lead to more predictable results. In addition to having each wafer processed under substantially identical sets of conditions, monitoring for problems or variances in the cell's performance is simplified because contribution of a variable electrolyte composition (e.g. its conductivity or density) is small and therefore the reactor voltage or power, heat generation, and other parameters. are not convoluted with the ever changing electrolyte conditions.

Figure 18:
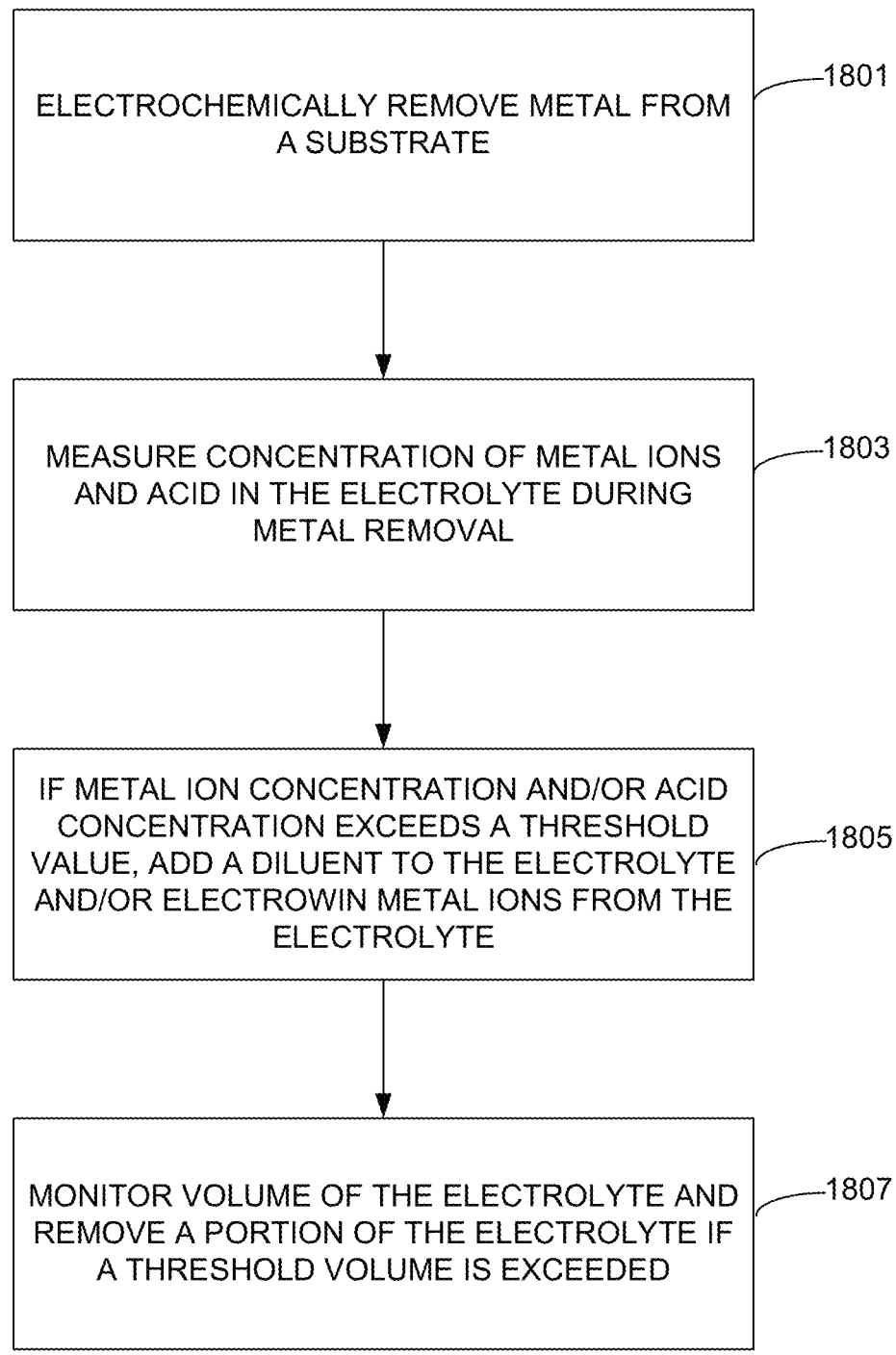
FIG. 18 is a process flow diagram for a process in accordance with an embodiment provided herein.

FIG. 18 provides an illustrative process for maintaining homeostasis of metal ions and of an acid in the electrolyte.

The process involves electrochemically removing metal in 1801, and measuring the concentrations of metal ions and acid during the electrochemical metal removal in 1803. "Concentration measurement" as used herein can involve measurement of electrolyte properties that correlate with the concentrations of metal ions and acid, and which allow for separate determination of acid concentration and metal ion concentration. In one of the preferred embodiments, two electrolyte properties are measured, where the first property correlates more strongly with the concentration of an acid than with the concentration of metal ions, and the second property correlates more strongly with the concentration of the metal ions than with the concentration of the acid. An example of the first property is electrolyte conductivity, which shows strong dependence on the concentration of acid. Examples of the second property include electrolyte density and optical absorbance of the electrolyte (for optically active metal ions, such as $Cu^{2+}$, $Ni^{2+}$, $Co^{2+}$, etc.). In one implementation, the concentrations of acid and metal ions are derived from combined readings on conductivity and density of the electrolyte. In another implementation, the concentrations of acid and metal ions are derived from combined readings on conductivity and on optical absorbance of the electrolyte. In another embodiment, titration for acid, or a titration for both acid and metals can be use. The embodiments in general are limited to a particular method of deriving the chemical bath composition. A range of combinations of two or more physio-chemical property measurements can be used and are envisioned, examples including but not limited to: density, conductivity, viscosity, optical absorbance (at one or more wavelengths), Raman spectroscopy, chemical titration, voltammetry (e.g. for example linear sweep voltammetry using limiting current of metal deposition to correlate to metal concentration), refractive index, or the speed of sound in the electrolyte. In addition, temperature of the electrolyte is typically monitored using a temperature sensor, because correlations of electrolyte parameters with acid and metal ion concentrations typically depend on temperature. The concentrations of metal ions and of the acid can be determined using empirical equations that link the concentrations with the measured parameters. Examples of such empirical equations for dependencies of each of copper ion concentration and phosphoric acid concentration on conductivity, electrolyte density and electrolyte temperature are provided in Example 1 below.

In some embodiments the concentrations of metal ions and of the acid are measured continuously throughout the electrochemical metal removal process. For example, density, conductivity, and temperature of the electrolyte can be continuously measured and communicated to a system controller, where these parameters are processed for making decisions on electrolyte management. In other embodiments the concentrations are measured at pre-determined intervals (e.g., every 300 seconds) and are transmitted to the controller for processing. If metal ion concentration and/or acid concentration is above the target level, or if it exceeds a pre-determined tolerance or threshold value, a diluent is added to the electrolyte and/or the concentration of metal ions is reduced by electrowinning. The diluent is added in such an amount as to bring the concentration of metal ions and/or acid below a pre-determined threshold concentration and closer to the target concentration. If metal ion concentration and/or acid concentration decreases below a pre-determined threshold value, a concentrate is added to the electrolyte. The concentrate is added in such an amount as to bring the concentration of metal ions and/or acid above a pre-determined threshold concentration and closer to the target concentration. For example, if metal content is low, a certain amount of metal-containing solution which has a larger metal content that is larger than the target metal content in the cell/bath is added. Analogously, if the acid level is low, concentrated acid is added. The pre-determined threshold concentration is within a range of allowed fluctuation from the target concentration level. For example if the concentration of metal ions is allowed to fluctuate by 5% from the target level, the pre-determined threshold concentration that triggers the dilution or electrowinning may be 3% greater than the target concentration, and the pre-determined threshold concentration that triggers the addition of a concentrate may be 3% lower than the target concentration.

The diluent for reducing metal ion concentration can be water, an aqueous solution of acid, or an aqueous solution comprising metal ions at a concentration that is lower than the pre-determined threshold concentration for the metal ions. In one of the embodiments, the diluent is an aqueous solution of acid that does not contain metal ions. The diluent for reducing acid concentration can be water, or an aqueous solution of an acid, or a metal-containing solution, each having the concentration of the acid in the diluent lower than the pre-determined threshold concentration for the acid. In some embodiments, a single diluent from a single diluent source is added to the electrolyte both when the threshold concentration for the metal is exceeded, and when the threshold concentration for the acid is exceeded. In one implementation, this diluent is an aqueous acid solution that contains very little (e.g. <1 g/L metal) or does not contain any metal ions. The concentration of metal ions in the electrolyte can be reduced, in some implementations, by electrowinning a pre-determined amount of metal from the electrolyte in a separate electrowinning apparatus. The electrowinning apparatus typically contains a cathode where the metal ions from the electrolyte are reduced and deposited as metal, and an inert dimensionally stable oxygen evolving electrode. Electrowinning can bring the concentration of metal ions in the electrolyte below the pre-determined threshold value. The amount of electrowinning can be controlled by controlling the charge that passes through the electrowinning device (using coulometry). In some implementations, the concentration of metal ions is reduced by both adding a diluent to the electrolyte and by electrowinning a portion of metal ions from the electrolyte, where, in combination, these methods bring the metal ion concentration to a desired range.

The concentrate for increasing metal ion concentration can be an aqueous solution comprising metal ions at a concentration that is higher than the pre-determined threshold concentration for metal ions, or a similar solution that also contains acid at a concentration that is higher, lower, or equal to the pre-determined threshold concentration for acid. The concentrate for increasing acid concentration can be a concentrated acid, or an aqueous solution of acid at a concentration higher than the pre-determined threshold concentration of acid, or a similar solution that also contains metal ions at a concentration that is higher, lower, or equal to the pre-determined threshold concentration for acid. In some embodiments, the counter electrode of the cell is a hydrogen evolving counter electrode where the amount of metal dissolved from the wafer exceeds the amount of metal deposited on the hydrogen evolving counter electrode. In this case, if the metal content were lower than the target, further wafer processing will tend to increase the electrolyte metal content and no additions would be needed. Further, in operation 1807, the volume of the electrolyte is monitored, and, if the volume of the electrolyte exceeds a pre-determined threshold volume value, a portion of the electrolyte is removed from the system to bring the volume below the threshold value. The volume of the electrolyte is, in one embodiment, continuously monitored by an electrolyte level meter.

Figure 19A:
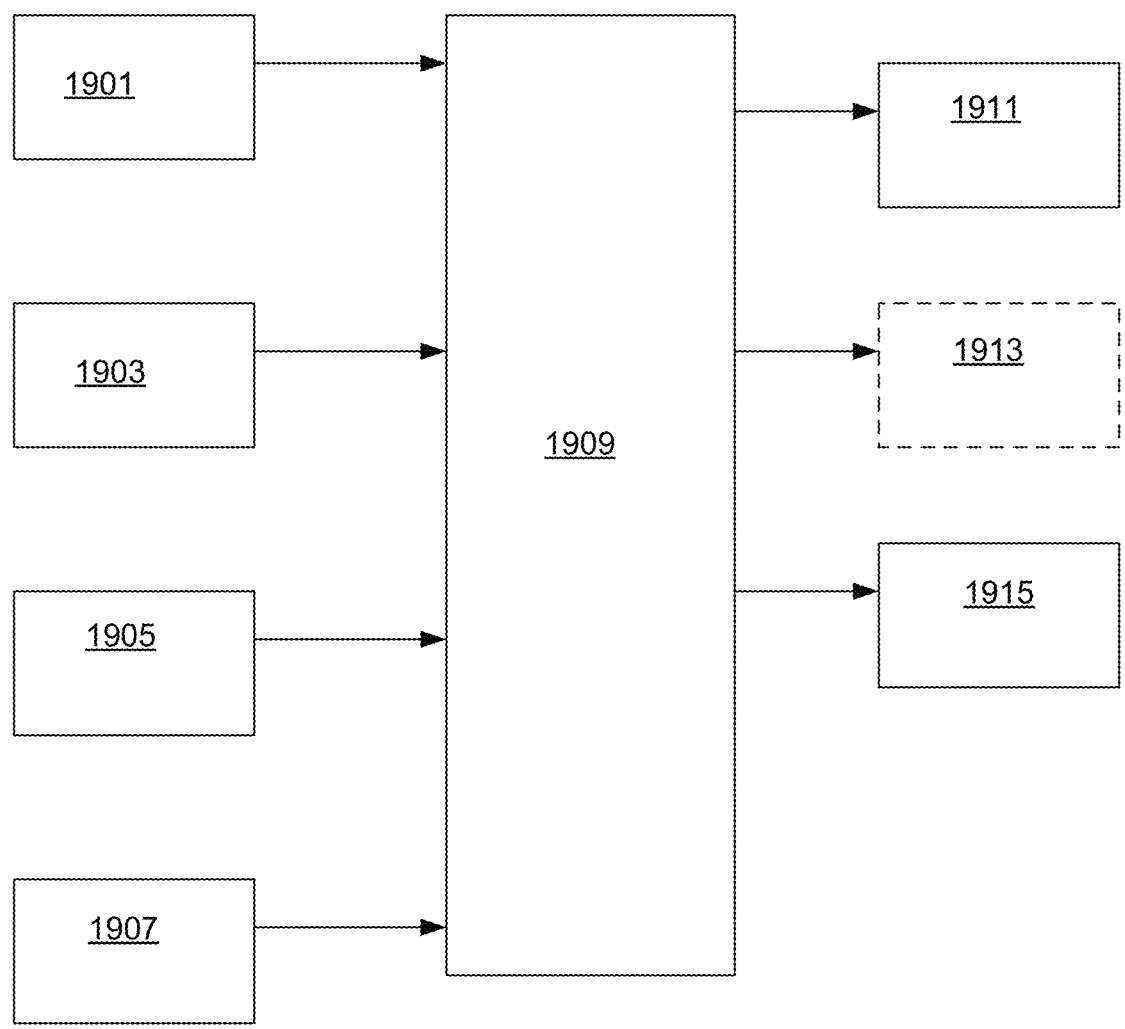
FIG. 19A is a schematic presentation of a controller connectivity in accordance with an embodiment provided herein.

It is noted that in some embodiments a first diluent (e.g., metal ion free acid solution) is added to an electrolyte reservoir in fluid communication with the deplating cell. After dilution in the reservoir, the reservoir electrolyte becomes more dilute relative to the electrolyte in the deplating cell, and it in turn acts as a second diluent, when added from the electrolyte reservoir to the deplating cell. FIG. 19 shows an illustrative system that can be used for controlling electrolyte composition, for example in an electrolyte containing $Cu^{2+}$ ions and an acid. The system includes a plurality of sensors 1901, 1903, 1905 and 1907 that are configured to provide information about the electrolyte to controller 1909. Specifically, the system includes a densitometer 1901, which provides data on electrolyte density to the controller, a conductivity meter 1903, which measures electrolyte conductivity and provides this information to the controller, a thermometer 1905, which provides electrolyte temperature to the controller, and an electrolyte level meter 1907, which monitors the volume of the electrolyte and supplies this data to the controller. The controller 1909 is configured to process the information provided by the sensors and, in response to the received information, is configured to activate one or more of hardware associated with electrolyte dilution or concentration, electrolyte removal, and, optionally, copper electrowinning. In other cases, (not shown) controller 1909 can operate hardware that can modify the rate of water removal from the cell and/or cell reservoir (through for example evaporation or reverse osmosis), such as opening or closing an exhaust damper or running the processing fluids through a reverse osmosis apparatus. For example, in response to the combined data received from the densitometer, conductivity meter, and a thermometer, the controller can activate the dilution hardware 1911, which may include opening a valve and activating a pump configured to add a diluent to the electrolyte. Optionally, in response to the combined data from these sensors the controller may activate an electrowinning system 1913 that is configured to convert $Cu^{2+}$ ions to copper metal and thereby reduce $Cu^{2+}$ concentration in the electrolyte. In response to the signal from the electrolyte level meter, the controller may activate hardware 1915 associated with electrolyte removal. This may include opening a valve associated with an outlet in a vessel housing the electrolyte and allowing a portion of electrolyte to flow out from the vessel.

The sensors (e.g., a conductivity meter, a densitometer, and a temperature probe) may be positioned at any location of the apparatus, where the measured parameters are substantially the same as near the wafer substrate. In some embodiments, the sensors are positioned directly in the deplating cell. In other embodiments, the apparatus includes one or more electrolyte recirculation loops, and at least some of the sensors are positioned outside of the deplating cell, within the recirculation loop, where the measured parameters in the recirculation loop are substantially the same (e.g., do not deviate by more than 1%) as in the deplating cell. In one embodiment the recirculation loop includes the deplating cell itself, an electrolyte reservoir positioned outside of the deplating cell, and fluidic lines that allow the electrolyte to circulate from the deplating cell to the reservoir, and from the reservoir back to the deplating cell. The recirculation loop may include one or more filters for filtering the electrolyte, one or more pumps that move the electrolyte in the recirculation loop, flow meters, cell isolation valves (valves configured to stop flow from the reservoir to the deplating cell), and dissolved gas addition or removal apparatus (e.g. for removing dissolved oxygen, such as using a gas-liquid "contactor" such as the Liqui-Cell Superphobic membrane contactor). Preferably, the electrolyte in the recirculation loop is quickly mixed such that it has substantially the same concentration at different portions of the loop (e.g., in the deplating cell, in the reservoir, and in the fluidic lines). In this embodiment, it is preferable, in some implementations, to place the sensors in the recirculation loop outside of the deplating cell, e.g., in the reservoir, or in association with a fluidic line leading to or from the deplating cell. Similarly, addition of a diluent and/or electrowinning of copper may be conducted directly in the deplating cell, or, in some embodiments, it can be conducted in the recirculation loop outside of the deplating cell. For example, the diluent may be added to the electrolyte that is located in the reservoir, and the diluted electrolyte is then quickly directed to the deplating cell, allowing for fast mixing of the electrolyte components throughout the recirculation loop.

In some embodiments, the electrolyte composition is controlled using two electrolyte startup/makeup solutions which are also used as concentration control solutions. This approach is generally useful and can be implemented in apparatuses equipped with a hydrogen-generating cathode and in apparatuses that employ an active cathode. When a hydrogen-generating cathode is used and when metal plating on the cathode is absent or minimal, the electrolyte will need concentration adjustment (e.g., dilution) due to dissolution of metal from the anodically biased substrate into the electrolyte. However even in the case where an active cathode is used and where the metal and acid contents are not modified by the reactions within the cell itself, electrolyte concentration adjustment can be employed. In the active cathode case the electrolyte composition can still drift over time due to materials coming into and leaving the cell/bath system, or due to less than 100% anodic (substrate metal removal) and cathodic (counter electrode plating) efficiencies.

The first solution "M" has a high metal (e.g. copper) concentration and a low acid concentration, and the second solution "A" has a high acid content and a low metal (e.g. copper) content. The concentration of metal in solution "M" is higher than the concentration of metal in solution "A". Conversely, the concentration of acid in solution "M" is lower than the concentration of acid in solution "A". For example, solution "M" may contain about 50 to 80 g/L $Cu^{+2}$ as copper phosphate, and about 150 to 400 g/L phosphoric acid. Lower copper concentrations within this range are used in conjunction with lower acid concentrations (e.g., 50-75 g/L copper and 150-200 g/L phosphoric acid), whereas higher copper concentrations within this range are used in conjunction with high acid concentrations (e.g., 75-80 g/L copper and 200-400 g/L phosphoric acid). Solution "A" in this example may contain about 0 to 10 g/L (e.g., 5-10 g/L) $Cu^{+2}$ as copper phosphate, and about 800 to 1350 g/L of phosphoric acid. In general, the concentration of metal/acid should be as high as possible while avoiding precipitation of the metal salts during the lowest temperature the solutions are expected to be exposed to, e.g., temperatures encountered during shipment of solutions.

Figure 19B:
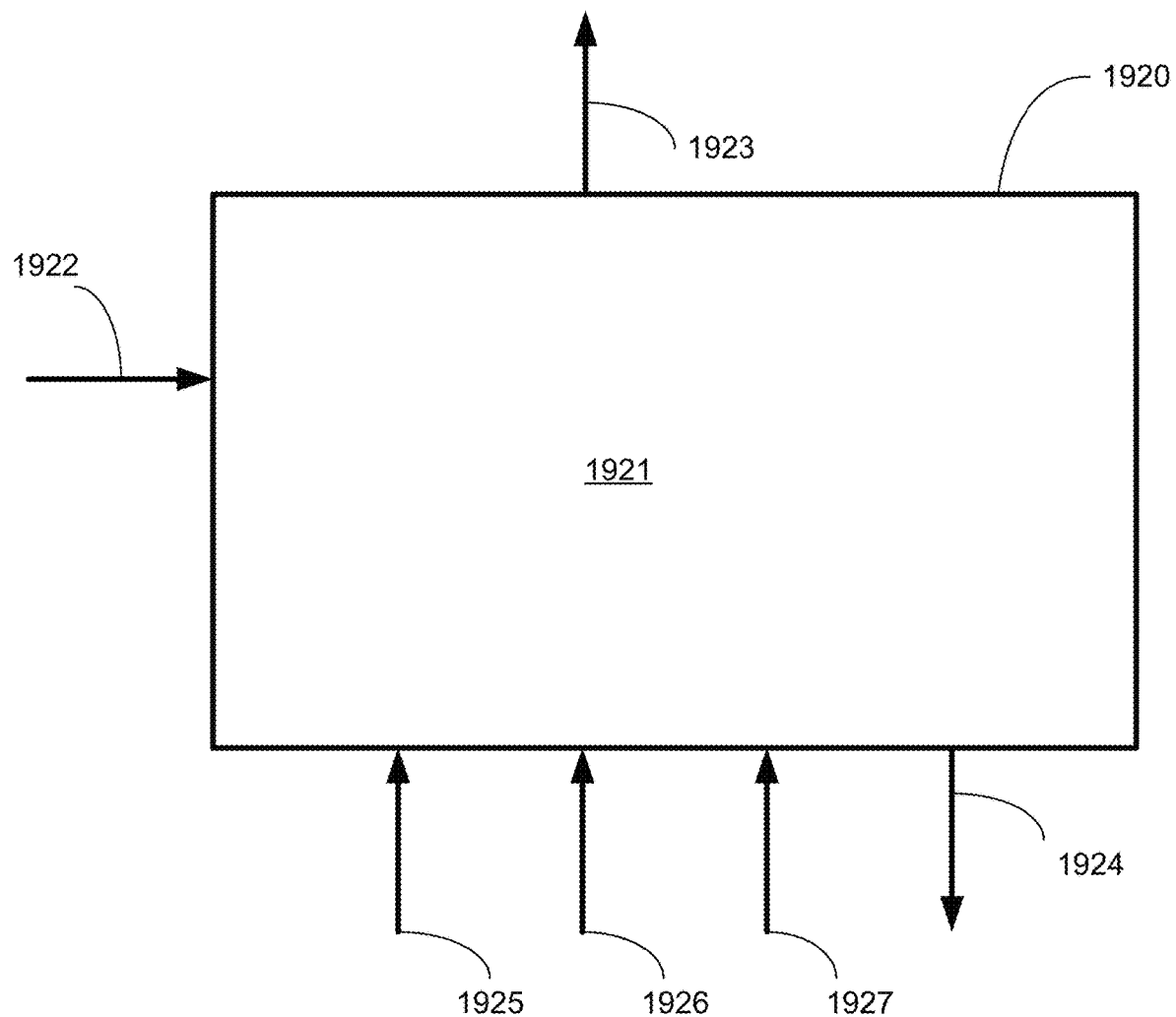
FIG. 19B is a schematic presentation of incoming and outcoming materials in the cell in accordance with an embodiment provided herein.

FIG. 19B illustrates the plating module mass balance 1920, according to one embodiment. When a wafer enters the plating cell module 1921, depending on the wafer's prior history, it may bring into) the module water, acid, metal ions, or other contaminants entrained on its surfaces from its prior processing steps. The wafer may also leach material into the system from the mask/photoresist layer. These incoming materials from the wafer are referred to as wafer drag-in 1912. Water is removed from the system by evaporation 1903 at a substantially constant rate. In some embodiments mechanisms for modifying the rate of water removal may be built into the system. For example, a speed control fume flow or mechanically controlled damper may be used to modify water removal rates. Material (such as electrolyte containing acid and metal salts) can be removed in controlled amounts from the system to the waste drain outlet. This outflow of material from the system is shown as flow 1924. Pure deionized water 1925, metal-rich solution "M" 1926 and acid-rich solution "A" 1927 can be added (dosed) in controlled amounts to the system. The method further includes removing a controlled amount of electrolyte material (e.g., from a reservoir located in an electrolyte recirculation loop) that may be high in metal or acid or impurities, as needed to maintain the concentrations of acid, metal, and water at the target levels and concentrations of impurities at an acceptably low level. A set of sensors (as described herein) can be used to monitor the concentrations of electrolyte components. A system controller along with property/concentration correlations and predictive and feedback logic are used to maintain the concentration. On startup of the system, the startup (new) electrolyte is made by combining solution M, solution A, and water in controlled amounts to create a solution having the necessary target concentrations of components.

Apparatus

The electrochemical metal removal methods described herein can be implemented in an apparatus having a vessel configured for holding an electrolyte and a cathode; and a semiconductor substrate holder configured to hold the semiconductor substrate such that the working surface of the semiconductor substrate is immersed into the electrolyte and is separated from the cathode during the electrochemical metal removal. The apparatus includes a power supply and electrical connections configured for negatively biasing the cathode and positively biasing the substrate during electrolytic metal removal. In some embodiments, the apparatus further includes a mechanism configured to provide a transverse flow of the electrolyte contacting the working surface of the substrate in a direction that is substantially parallel to the working surface of the substrate during the electrochemical metal removal. In some embodiments, the apparatus includes a reference electrode configured for measuring a potential in the vicinity of the semiconductor substrate (e.g., within about 5 mm of the substrate) or an equivalent potential. The apparatus in some embodiments preferably includes a separator positioned between the cathode and the substrate holder, thereby defining an anode chamber and the cathode chamber, where the separator is configured for blocking any $H_2$ bubbles or particles formed at the cathode from crossing the separator and reaching the substrate. The separator is permeable to ionic species of the electrolyte and allows for ionic communication between the anode and cathode chambers. The apparatus is preferably configured for safely segregating the $H_2$ or particles in the cathode chamber and removing them through one or more openings in the cathode chamber proximate the separator membrane.

Figure 20:
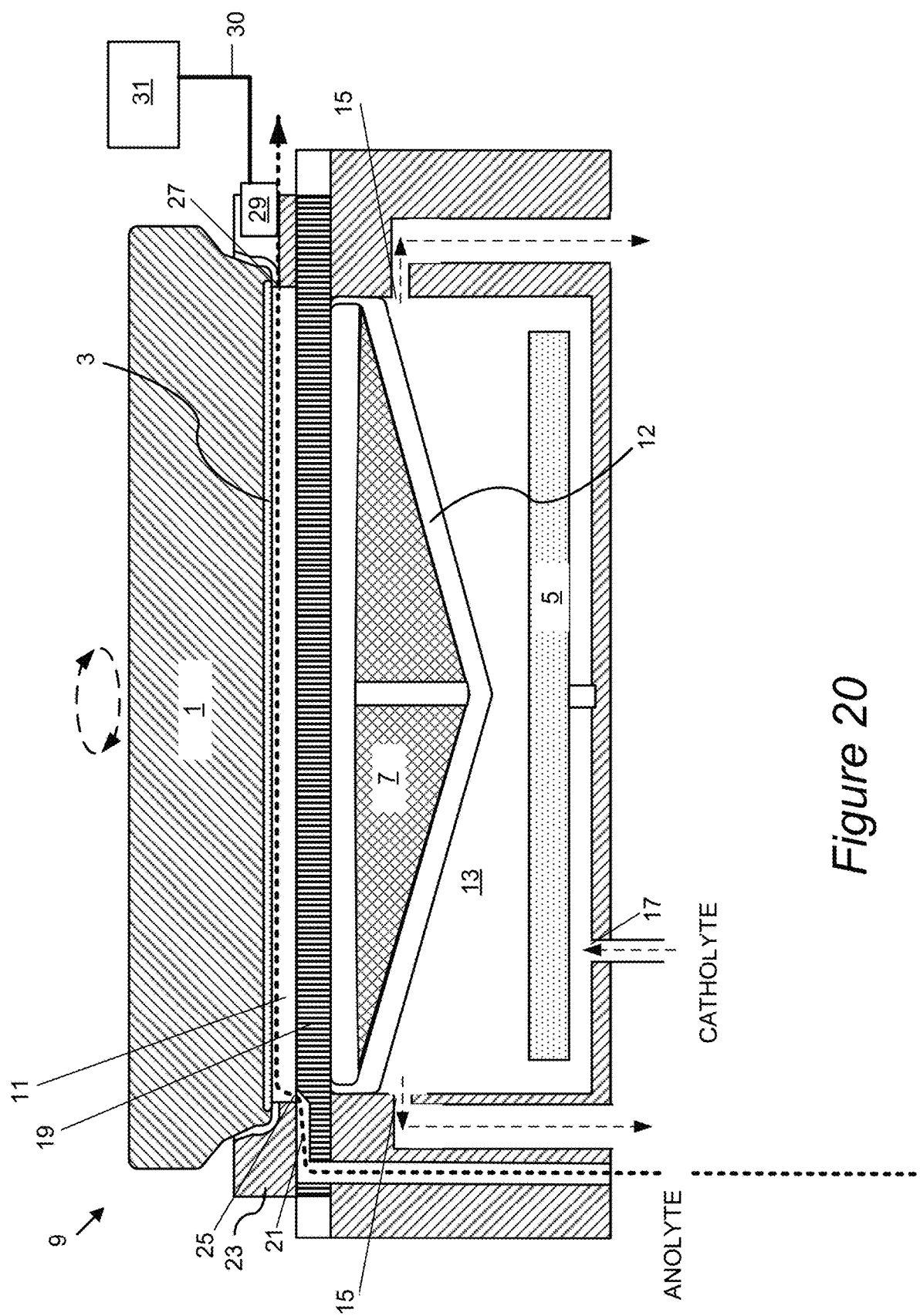
FIG. 20 is a schematic cross-sectional view of a deplating cell of an electrochemical metal removal apparatus according to an embodiment provided herein.

An example of a portion of an electrochemical metal removal apparatus that includes a mechanism for transverse flow, a reference electrode, and a cathode chamber configured for segregating and removing $H_2$ gas is illustrated in FIG. 20. It is noted that this apparatus can also be used for segregating and removing particles generated at the cathode in addition to (or instead of) $H_2$ gas. The apparatus includes a semiconductor substrate holder 1 configured to hold and rotate the semiconductor substrate 3. A plurality of electrical contacts are made around the circumference of the substrate. The contacts are electrically connected to a power supply (not shown), that positively (anodically) biases the semiconductor substrate during the electrochemical metal removal. A cathode 5 is positioned below the substrate 3 and is electrically connected to the power supply (not shown) that negatively biases it during the electrochemical metal removal. Different types cathodes can be used, including cathodes made of the same metal that is being removed (e.g., a copper cathode during copper metal removal), plateable metals (e.g. stainless steel) and inert cathodes. Inert hydrogen generating cathodes are used in some embodiments because an active cathode may react with or dissolve in some electrolytes or plate a non-adherent or dendritic particle-generating layer of metal, leading to an unavoidable increase in the metal ion concentration of the electrolyte or formation of a metal-containing sludge. In other embodiments an active cathode does not react with the electrolyte chemically and is preferred because the metal removed from the substrate is plated onto the active cathode, and the overall cell chemical reactions are balanced and the cost of the process is thereby reduced as there would be little or no demand for solution replacement based on metal depletion). Examples of inert cathodes include metal cathodes (e.g., a titanium cathodes) coated with platinum, rhodium, niobium or any combination of these metals.

A conically shaped membrane 7 is positioned between the cathode 5 and the anodic substrate 3 dividing the deplating cell 9 into a cathode chamber 11 and an anode chamber 13. The membrane 7 is mounted on a frame 12 such that the vertex of the cone is closer to the cathode than the base of the cone. The membrane material does not allow $H_2$ bubbles formed at the cathode 5 to cross from the cathode chamber 11 into the anode chamber 13. The membrane is made of an ion-permeable material, such as an ion-permeable polymer. In some embodiments hydrophilic polymers, such as polymers containing —$SO_2$— functional group are preferred. In some implementations, the membrane materials include polyethersulfone (PES), polyphenylsulfone, and other polymers from the polysulfone family. Hydrophilic membrane bubble separating materials are preferred because bubbles adhere less to these materials than to hydrophobic membranes. The conical shape of the membrane allows the $H_2$ bubbles released at the cathode to travel upward and radially outward along the membrane surface and toward the periphery of the cathode chamber, accumulating at the interface between the membrane and the cathode chamber sidewall. An outlet 15 is positioned in the cathode chamber sidewall in close proximity to the junction between the membrane and the sidewall, and is configured for removing the accumulated $H_2$ bubbles in a mixture with catholyte. For example, the outlet is positioned within about 1 mm, and in some embodiments without any gap from the junction of the membrane assembly with the sidewalls of the cathode chamber. The presence of a gap (vertically) between the outlet and the junction is not desired, because the bubbles would tend to accumulate in the gap and would be more difficult to remove from the cell. The outlet, in some embodiments includes a plurality of openings positioned around the circumference of the cathode chamber sidewall at substantially identical small intervals, such as eight openings equally spaced around the chamber at 45° intervals. In some embodiments this outlet is a continuous slot in the wall. In one embodiment, a continuous slot around the perimeter of the cell leads to a plurality of equally spaced holes that act as electrolyte outlets. In general, as long as the cell is designed for removal of the majority of bubbles or substantially all bubbles from the catholyte, the catholyte outlet may take a variety of shapes and forms. For example, a single outlet subtended by less than 360°, or by less than 180° may be used, when the cell is designed to direct the bubbles toward this outlet. The mutual position of the membrane and the catholyte outlet helps achieve efficient and safe hydrogen bubble segregation and removal from the cathode chamber. The cathode chamber further includes an inlet 17, which is configured to receive the catholyte. In the depicted embodiment the catholyte inlet is located below the cathode. Generally, it is preferable to position the catholyte inlet below the catholyte outlet such that catholyte entering the chamber will flow up and around the cathode (or through a perforated or porous cathode), as this will facilitate the movement of catholyte and movement of the bubbles in an upward direction, as well as prevent a large difference in composition between the electrolyte in the chamber and the electrolyte near the cathode. The anode chamber 13 is located above the membrane 7 and houses the anodically biased substrate 3. In the depicted embodiment, an ionically resistive ionically permeable element 19 (the "element") is positioned in the anode chamber between the membrane 7 and the substrate holder 1. The ionically resistive ionically permeable element is preferably substantially coextensive with the substrate and is located in close proximity to the substrate's working surface during electrochemical metal removal. The element has a substrate-facing surface and an opposing surface, and is located such that the closest distance between the substrate-facing surface to the working surface of the substrate during the electrochemical metal removal is about 10 mm or less. In the illustrated embodiment the substrate-facing surface of the element is planar, but in other embodiments, the element may be, for example, convex, with a smaller distance to the substrate at the center than at the periphery. The element is made of a dielectric material having pores, where the porosity of the element is preferably relatively low, such that the element introduces a substantial resistance on the path of ionic current in the system. In some embodiments, the element includes a plurality of non-communicating channels, that allow for electrolyte to travel through the element. In some embodiments, the element includes between about 6,000-12,000 drilled channels. The element is useful for reducing radial non-uniformity that can appear during electrochemical metal removal due to a terminal effect. Terminal effect can manifest itself in increased electrochemical removal of metal near the edges of the substrate, if the electrical contacts to the substrate are made at the substrate periphery, which is typically the case. In this configuration, particularly when thin and/or resistive seed layer is used for making the contact, more metal may be removed at the periphery of the substrate compared to more central portions of the substrate, leading to radial non-uniformity. The ionically resistive ionically permeable element can serve as a high ionic resistance plate for making field distribution more uniform and to reduce the described terminal effect, thereby improving radial uniformity in metal removal. In some embodiments the element further plays a role in shaping the flow of electrolyte in the vicinity of the substrate. It may serve as a flow resistive element defining the region of high electrolyte flow and confining the flow into the cross flow region. For example it may serve to provide a narrow gap (e.g., 10 mm or less) between the substrate-facing surface of the element and the working surface of the substrate into which the electrolyte is laterally injected. This arrangement facilitates the transverse flow of the electrolyte near the surface of the substrate. The electrolyte (anolyte) can be injected into the gap using a cross flow injection manifold 21 that is at least partially defined by a cavity in the element 19. The cross flow injection manifold is arc-shaped and is positioned proximate the periphery of the substrate. A cross flow confinement ring 23 is positioned proximate the periphery of the substrate at least partially between the element 19 and the substrate holder. The cross flow confinement ring 23 at least partially defines the side of the gap between the element and the substrate. The anode chamber has an inlet to the gap 25 adapted to receive the anolyte from source of anolyte through, for example, the cross flow injection manifold, and an outlet to the gap 27 adapted for removing the anolyte from the gap. The inlet 25 and the outlet 27 are positioned proximate azimuthally opposing perimeter locations of the working surface of the substrate (and also proximate azimuthally opposing perimeter locations of the substrate holder and proximate azimuthally opposing perimeter locations of the element). The inlet 25 and the outlet 27 are adapted to generate the cross-flow of electrolyte in the gap and to create or maintain transverse flow of electrolyte near the working surface of the substrate during electrochemical metal removal. In some embodiments the ionically resistive ionically permeable element serves the dual purpose of mitigating the terminal effect, and of restricting electrolyte flow to provide a defined space for transverse flow of the electrolyte near the substrate. A reference electrode 29 is positioned above the element 19 near the periphery of the substrate holder 1. The reference electrode is preferably positioned within about 5 cm from the surface of the substrate, or, at a position where a potential that is equivalent to a potential measured within 5 cm of the substrate can be measured. More preferably, the reference electrode is positioned within about 5 mm of the substrate, or at a position with an equivalent or minimally different potential to that at the plane of the wafer surface. For example, the reference electrode may be immersed into the electrolyte that exits the anode chamber. In the depicted embodiment the reference electrode is made of a strip or rod of metal that is same as the metal that is being removed from the wafer substrate. For example, a copper reference electrode can be used during copper removal, a nickel reference electrode during nickel removal, a tin reference electrode during tin removal, etc., whereas part of such electrode's surface is in direct contact with the processing electrolyte. It is advantageous to use the same metal for the reference electrode as the metal that is being removed from the substrate because such reference electrode would have a zero (or nearly zero) open circuit potential relative to the zero current operation point, and may also be able to operate longer and with greater stability than commonly used reference electrodes. In some cases a metal electrode may form a film (oxide or salt film) when exposed to the chosen electroetching electrolyte, making it a less preferred reference electrode choice. More generally, a variety of different types of reference electrodes can be used, including but not limited to those which contain an electrolyte that is different than the electrolyte processing solution, such as a saturated calomel electrode ($Hg/Hg_2Cl_2$, or SCE), a $Hg/HgSO_4$ electrode, and a $Ag/AgCl$ electrode. It is noted that the physical position of the reference electrode can be close to or far from the substrate in those embodiments where a Luggin capillary is used; The above referenced 5 mm distance from the wafer is the point of closest approach of the reference electrode, or the confined and isolated lines of current between the reference electrode and the wafer making up the Luggin connection. The reference electrode senses the solution potential at the open tip of the Luggin capillary. Therefore, a reference electrode can also be housed separately and remotely from the cell and connected via a so-called "Luggin capillary" with the opening of the Luggin capillary 5 mm or less from the wafer. A Luggin capillary is also known as a Luggin probe, Luggin tip, or Luggin-Haber capillary. In the depicted implementation, the reference electrode is positioned in the anolyte radially outward from the substrate holder 1. Such peripheral position is preferred in many implementations, because the reference electrode preferably should not interfere with the plating current near the working surface of the substrate. In some embodiments the footprint of the reference electrode onto the working surface of the substrate (a projection of the electrode onto the substrate surface) during the electrochemical metal removal is zero.

The reference electrode, and other elements of the apparatus are in electrical communication with a controller 31, which has a processor and a memory, and has program instructions for controlling the operation of the apparatus. For example, an electrical connection 30 can connect the reference electrode 29 with the controller 31. The controller may include program instructions for performing any of the methods described herein. The controller can process the information on the potential provided by the reference electrode and can adjust current and/or potential provided to the anodically biased substrate in response to the measured potential, in order to control the electrochemical metal removal process In an exemplary embodiment the reference electrode is made of the same metal that is removed from the substrate, is immersed in the anolyte and is positioned above (but not necessarily over) the ionically resistive ionically permeable element in proximity of the substrate. Such position minimizes the voltage drop between the substrate and the reference electrode and improves the accuracy of the potential reading.

Figure 21:
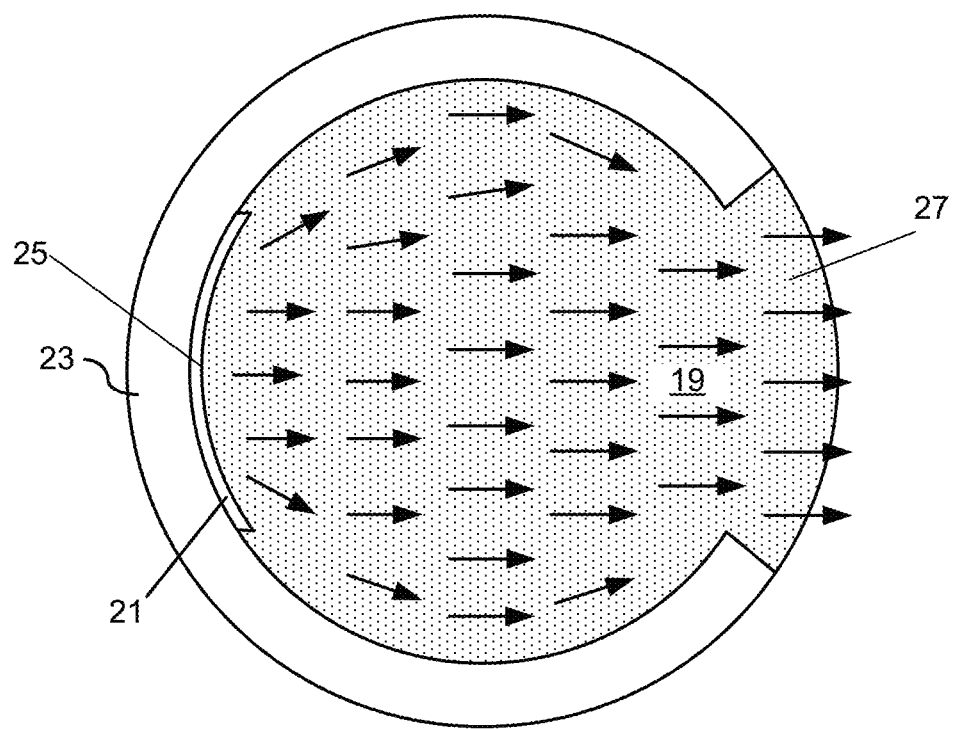
FIG. 21 is a top view of an ionically resistive ionically permeable element having a cross flow confinement structure disposed thereon, in accordance with an embodiment provided herein.

FIG. 21 illustrates a top view of a system that can be used for generating and maintaining a transverse flow near the working surface of the substrate. The ionically resistive ionically permeable element 19 is partially surrounded about its perimeter by the crossflow confinement ring 23, which is designed to form sidewalls of a gap between the element and the working surface of the substrate. The arc-shaped cross flow injection manifold 21 injects electrolyte using an inlet to the gap 25. The flow of electrolyte is shown by arrows. The electrolyte flows in a transverse fashion towards an outlet 27, which is located at a substantially azimuthally opposing position relative to the perimeter of the substrate (or the perimeter of the substrate holder, or the perimeter of the ionically resistive ionically permeable element).

The apparatus is preferably configured to provide a transverse flow having a velocity of at least about 3 cm/second across the center of the substrate. In some embodiments it is preferable to provide a vigorous transverse flow with a transverse flow rate of at least 10 cm/second, such as between about 10-90 cm/second or between about 20-80 cm/second across the center point of the substrate. Such relatively high transverse flow rates can be achieved for example using lateral injection of electrolyte into a gap proximate the substrate or by using reciprocating paddle movement.

In different implementations, the transverse flow may be generated using one or more of the following mechanisms: (1) a lateral electrolyte flow injector; (2) a flow diverter configured to divert electrolyte flow to a transverse flow; (3) an ionically resistive ionically permeable element having variation from uniformity in number, orientation and distribution of holes at or near the center of the rotating substrate, such as an element in which at least some of the holes proximate to the center of the rotating work piece have an angle deviating from vertical (more generally, an angle that is not perpendicular to the plating face of the rotating substrate), (4) a mechanism for generating a lateral component of relative motion between the work piece surface and the ionically resistive ionically permeable element (e.g., a relative linear or orbital motion), (5) one or more reciprocating or rotating paddles or a plate with a number of paddles or fan blades that force fluid to move at least partially transverse to the wafer as the plate is moved (e.g., a paddlewheel or impeller) provided in the plating cell, and (6) a rotating assembly attached to or proximate to the flow shaping plate and offset from the axis of rotation of the work piece. The apparatus in some embodiments includes a wafer holder that is part of the module/processing station, where the wafer holder stays in the module and/or processing station but can rotate and move up and down within the processing station or module, e.g. the wafer holder can have a clam-shell design. In another embodiment the wafer holder can be removable from the processing station and travel through the tool with the wafer that it holds, forming a seal and releasing the wafer from the carrier elsewhere than at the metal removal processing station.

Figure 22A:
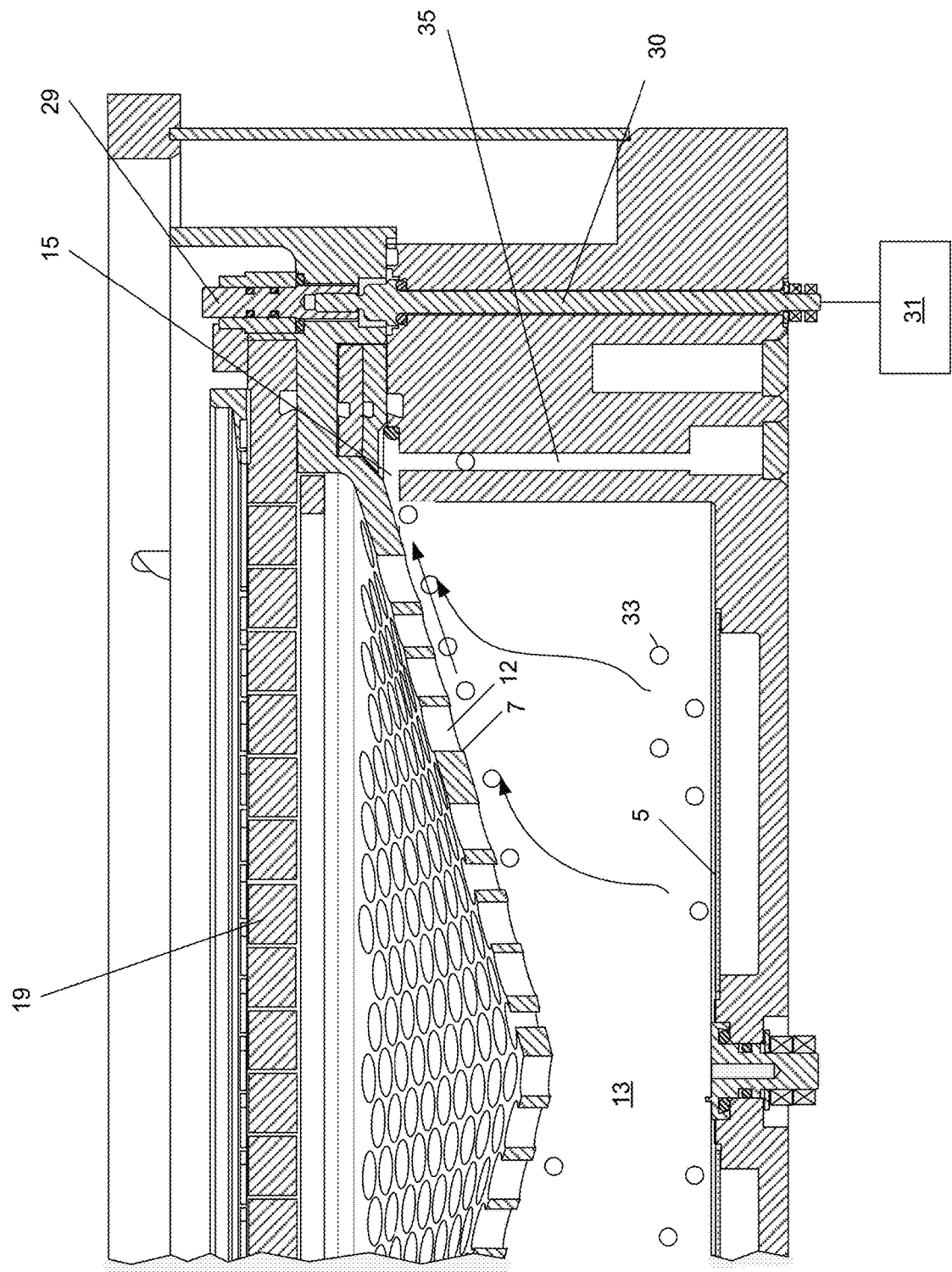
FIG. 22A is a schematic cross-sectional view of a portion of a deplating cell, illustrating $H_2$ bubble removal from the cathode chamber, according to an embodiment provided herein.

FIG. 22 provides a cross-sectional schematic view of a portion of the deplating cell and illustrates removal of $H_2$ bubbles with the flow of catholyte from the cathode chamber 13. The $H_2$ bubbles 33 and/or particles are generated at the cathode 5, and rise towards the membrane 7 as shown by arrows. At the membrane, the bubbles move along the conical wall of the membrane/frame assembly until they reach the cathode chamber outlet 15. They are removed together with a portion of catholyte through conduit 35, which, in some embodiments, transports the mixture of the catholyte and bubbles to a stilling chamber, where $H_2$ gas is separated from the catholyte, is diluted with an inert gas and is safely removed. FIG. 22A also shows a position of the reference electrode 29, and an electrical connection 30 that goes, in this embodiment, downward from the reference electrode and is configured to connect the reference electrode with a controller.

Figure 22B:
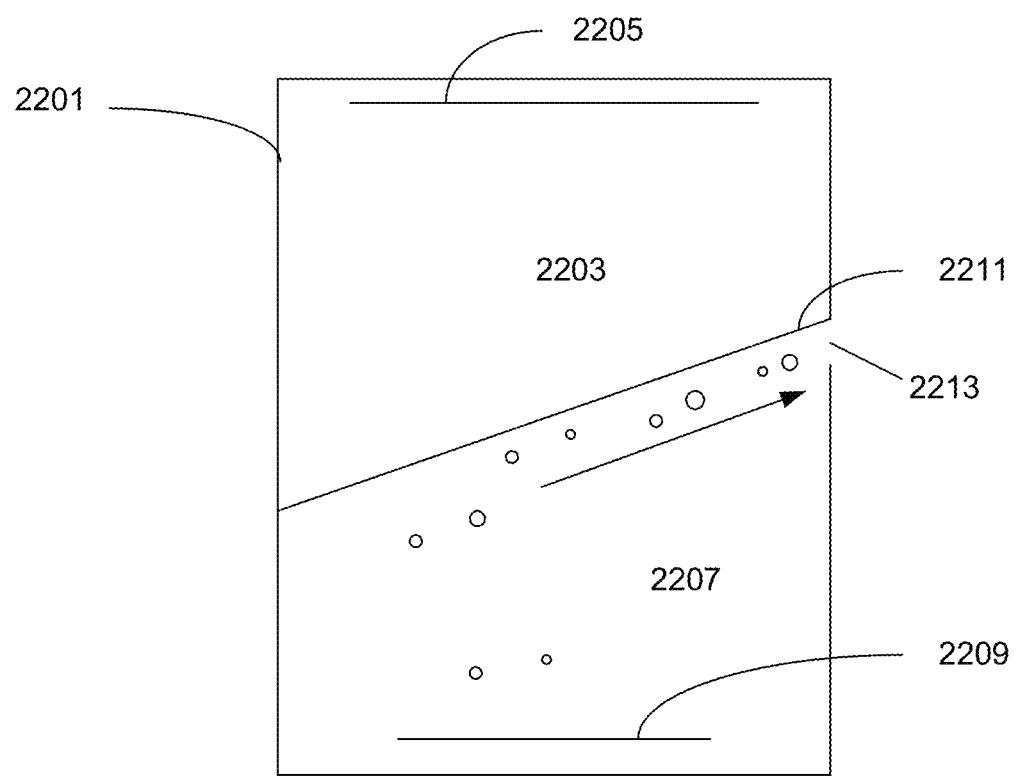
FIG. 22B is a schematic cross-sectional view of a deplating cell in accordance with an alternative embodiment, illustrating a slanted membrane.

An embodiment illustrating an alternative position of the bubble-separating membrane is illustrated in FIG. 22B, which shows a simplified cross-sectional view of the cell 2201. The cell includes an anode chamber 2203 housing a horizontally positioned anodic substrate 2205, and a cathode chamber 2207 housing the cathode 2209. The membrane 2211 separating the two chambers in this embodiment is positioned at an angle to the horizontal plane. For example, the membrane may be a planar sheet of material attached to the sidewalls of the cell, such that it is in a slanted position, as shown. In some embodiments the angle of the membrane plane incline to the horizontal plane is between about 5-85°, such as between about 10-60°. The slanted positioning of the planar membrane facilitates transport and removal of the bubbles from the cathode chamber. The cathode chamber outlet 2213 in the illustrated embodiment is located near the junction of the upper portion of the membrane with the sidewall of the cell, allowing for removal of the bubbles with the catholyte after they traveled upwards from the cathode.

In yet another alternative embodiment, the substrate may be processed in a vertical orientation, such that the working surface of the substrate is oriented at 90 degrees to the horizontal plane. In this embodiment, the membrane separating the anode and cathode chambers can be positioned vertically (parallel to the substrate surface), and the cathode chamber outlet can be anywhere in the upper portion of the cathode chamber, as long as it allows for the removal of bubbles and/or prevention of particles from reaching the workpiece.

Figure 23:
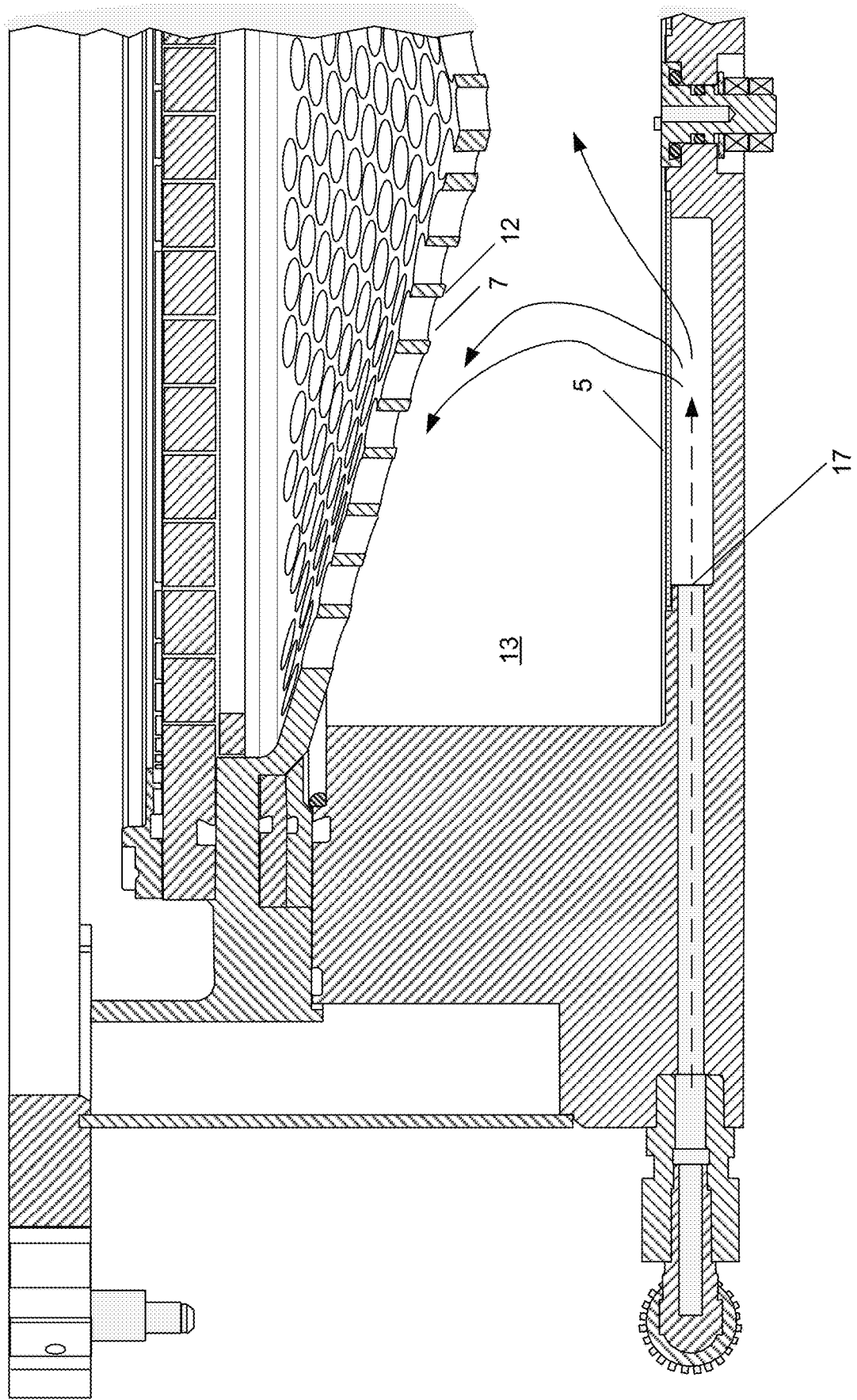
FIG. 23 is a schematic cross-sectional view of a portion of a deplating cell, according to an embodiment provided herein.

FIG. 23 provides a cross-sectional schematic view of a portion of the deplating cell of the embodiment shown in FIG. 22A illustrating addition of catholyte to the cathode chamber. The catholyte enters the cathode chamber 13 through the cathode chamber inlet 17. The catholyte is provided via a conduit coupled to the inlet 17, and in some embodiments, the catholyte is provided from a catholyte recirculation loop, e.g., from a reservoir located in the catholyte recirculation loop. The flow of catholyte is illustrated by the arrows. The catholyte flows to the catholyte outlets which are located peripherally at the junction of the membrane with the sidewalls of the cells. In general, the positions of catholyte inlets and outlets can vary, but preferably they are arranged to provide a uniform convection over or through the cathode itself. As mentioned above, the outlet or outlets are preferably located at the periphery of the cell as close to the membrane junction with the wall as possible.

Figure 24:
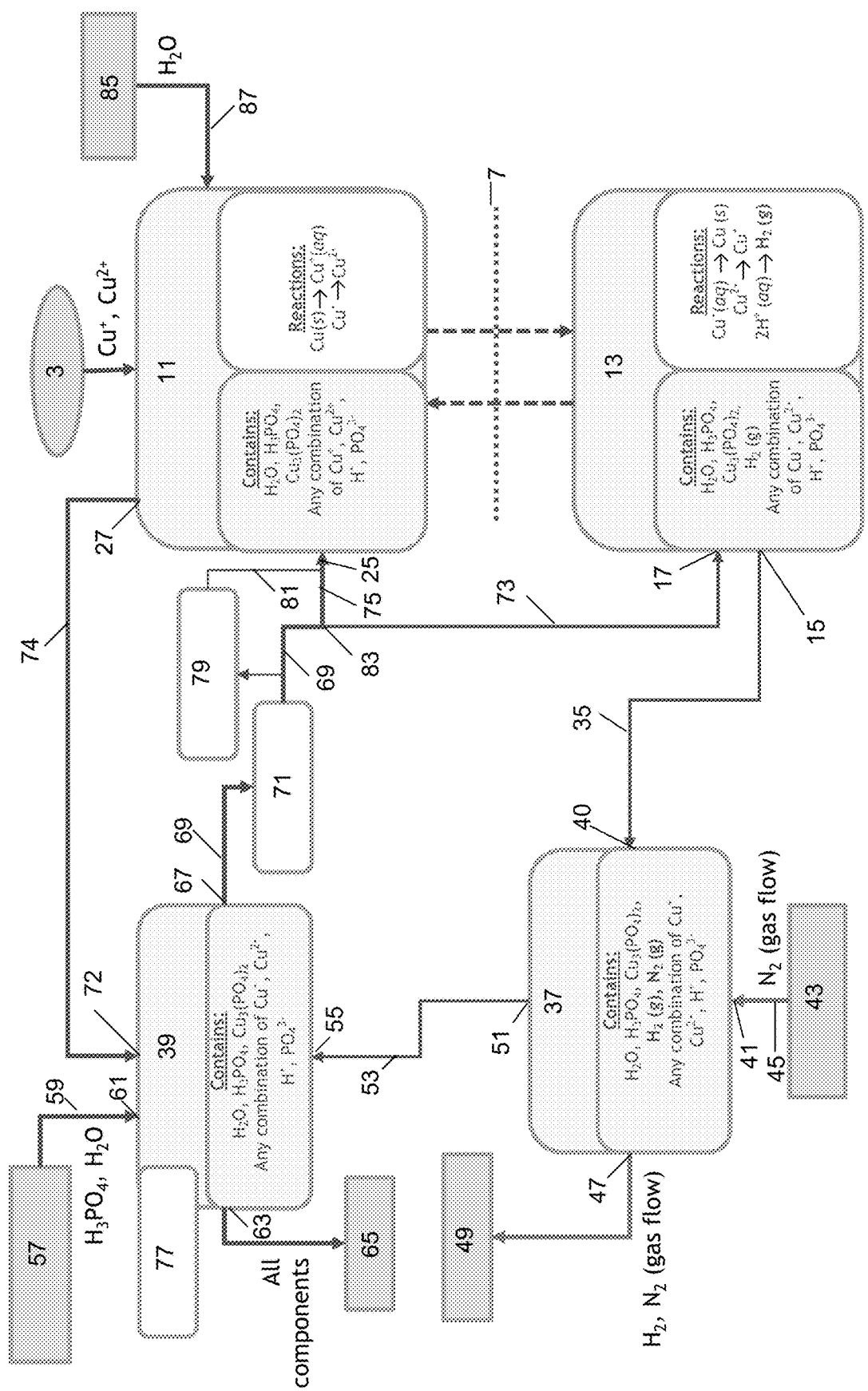
FIG. 24 is a schematic presentation illustrating fluidic connectivity in the electrochemical metal removal apparatus, in accordance with an embodiment provided herein.

FIG. 24 provides a schematic presentation of an electrochemical metal removal apparatus, which includes a deplating cell, a stilling chamber, an anolyte recirculation loop, and a catholyte recirculation loop, where the loops have a shared reservoir. In cases where an active cathode is used and the efficiency for metal plating onto the cathode is high (e.g. >95% of the current ends up as plated metal), the stilling chamber used to segregate and dilute hydrogen gas may not be required. FIG. 24 illustrates fluidic connectivity between elements of the apparatus. In an illustrative implementation the depicted apparatus is used for electrochemically removing copper from the substrate, using an electrolyte that comprises or consists essentially of an aqueous solution of phosphoric acid ($H_3PO_4$) and one or more copper salts of phosphoric acid (e.g., $Cu_3(PO_4)_2$). For example, the electrolyte may contain any combination of $Cu^{2+}$, $Cu^+$, $H^+$, $H_2PO_4^-$, $HPO_4^{2-}$, and $PO_4^{3-}$. It is understood that the provided apparatus can be used for electrochemically removing other metals (e.g., Ni, Co, Sn, etc.) using other electrolytes as described herein. The apparatus includes a deplating cell 9, which is divided by a membrane 7 into an anode chamber 11 and a cathode chamber 13. The anode chamber 11 houses the anodically biased substrate 3, that releases $Cu^+$ and $Cu^{2+}$ ions into the anolyte during electrochemical metal removal, as the copper layer on the substrate is electrochemically dissolved in accordance with reactions (3) and (4). $Cu^{2+}$ is typically the predominant copper ion in the electrolyte, as $Cu^+$ typically is present only in trace amounts. The cathode chamber 13 houses the cathode, at which reactions (5), (6), and (7) take place. Hydrogen gas evolution at the cathode is the main driving force for placing the membrane 7 between the anode and the cathode, since it is advantageous to segregate hydrogen in the cathode chamber. In the depicted example, the compositions of the anolyte and catholyte are substantially identical, but the catholyte in the cathode chamber includes $H_2$ bubbles, while the anolyte in the anode chamber is substantially free from the $H_2$ bubbles, which are blocked from entering the cathode chamber by the membrane 7. The depicted system includes a catholyte recirculation loop that is adapted for removing a portion of the catholyte from the cathode chamber, treating the removed catholyte and returning the treated catholyte back to the cathode chamber. Treatment of the catholyte can include one or more of removing hydrogen bubbles from the catholyte, mixing the catholyte with the anolyte, diluting the catholyte (e.g., after mixing with the anolyte), electrowinning copper from the catholyte (e.g., after mixing with the anolyte), filtering the catholyte, degassing the electrolyte (e.g. via a contactor), and heating or cooling the catholyte. The catholyte recirculation loop in the depicted embodiment includes a stilling chamber 37, a reservoir 39 and associated fluidic ports, fluidic lines, and fluid management mechanisms (e.g., one or more pumps, electrolyte flow meters, and filters). The catholyte, which contains phosphoric acid, copper phosphate, and hydrogen bubbles exits through the cathode chamber outlet 15 and travels through an associated fluidic line 35, to the stilling chamber 37. The stilling chamber 37 is configured for separating the hydrogen bubbles from the liquid catholyte, for diluting hydrogen with an inert gas, and for removing the diluted hydrogen from the stilling chamber. The catholyte enters the stilling chamber 37 through the stilling chamber catholyte inlet 40 and, in one implementation travels through the stilling chamber via a tortuous path that facilitates separation of hydrogen gas by buoyancy from the catholyte mixture. The stilling chamber further has an inert gas inlet 41, which is connected to a source of an inert gas 43 (e.g., $N_2$ source) via an inert gas line 45. The inert gas flows into the stilling chamber through the inlet 41 and is allowed to mix with the hydrogen. The diluted hydrogen mixture then flows to a gas outlet 47 of the stilling chamber, then measurement of the hydrogen concentration in the diluted gas stream can be performed, and the mixture is then removed to the exhaust 49. The catholyte, after it has been at least partially freed of hydrogen in the stilling chamber 37 exits the stilling chamber via a catholyte outlet 51 and flows via a fluidic line 53 to the reservoir 39. In some embodiments the stilling chamber 37 and the reservoir 39 are combined together in one compact assembly and in these embodiments the fluidic line 53 is removed such that the catholyte outlet 51 and the reservoir catholyte inlet 55 are coincident.

The catholyte from the stilling chamber 37 enters the reservoir 39 through a reservoir catholyte inlet 55. In the embodiment shown in FIG. 24, the reservoir 39 is shared by catholyte and anolyte recirculation loops, and catholyte is mixed in the reservoir with the anolyte from the anolyte recirculation loop. If needed, the mixture can be diluted with a diluent (e.g., aqueous phosphoric acid) at this stage. The diluent is added to the reservoir 39 from a diluent source 57, via a diluent line 59 and through a reservoir diluent inlet 61. In some embodiments, the diluent may contain a copper salt at a concentration that is smaller than in the reservoir electrolyte. The reservoir further includes an electrolyte removal port 63, through which a portion of electrolyte may be removed to a drain 65, if the volume of electrolyte in the reservoir exceeds a pre-determined threshold value. The catholyte recirculation loop is completed by removing a portion of catholyte (mixed with the anolyte) from the reservoir 39 via an electrolyte exit port 67 and line 69 with the use of a pump 71 and directing a portion of the catholyte (mixed with anolyte) to the cathode chamber 13 using a catholyte entry line 73. The recirculated and treated catholyte enters the cathode chamber 13 via the catholyte inlet 17, thereby completing the recirculation loop.

The anolyte recirculation loop is configured for removing a portion of the anolyte from the anode chamber 11, treating the anolyte, and returning the treated anolyte to the anode chamber 11. Treatment of the anolyte can include one or more of: combining the anolyte with the catholyte, adding a diluent to the anolyte (e.g., after it is combined with the catholyte), electrowinning copper from the anolyte (e.g., after it is combined with the catholyte), filtering the anolyte, and heating the anolyte. In addition, the anolyte recirculation loop may be configured for measuring one or more anolyte properties, such as density, conductivity, and temperature outside of the depleting cell. In the depicted example, the anolyte recirculation loop includes the reservoir 39, which is shared with the catholyte recirculation loop, fluidic line 74 for delivering the anolyte from the anode chamber 11 to the reservoir 39, fluidic lines 69 and 75 for delivering the anolyte from the reservoir 39 to the anode chamber 11, a conductivity meter 77 positioned in the reservoir 39, and a densitometer 79 positioned in a fluidic line 81 that forms a loop from the line 69 before line 75 leads to the anode chamber inlet 25. During recirculation, the anolyte exits the anode chamber 11 through the anolyte outlet 27 and flows via conduit 74 to the reservoir 39, where it is combined with the catholyte from the catholyte recirculation loop. The anolyte (combined with the catholyte) can be diluted as described above, and if needed, a portion of the anolyte (combined with catholyte) can be removed from the reservoir 39 to the drain. The conductivity of the anolyte (combined with the catholyte) is measured in the reservoir using the conductivity meter 77. The anolyte (combined with the catholyte) is then directed using a pump 71 back to the anode chamber 11. The anolyte (combined with the catholyte) exits through an electrolyte exit port 67 and flows through line 69 (combined with the catholyte recirculation loop). At junction 83, the fluidic line 69 branches into a fluidic line 75 (leading to the anode chamber 11) and fluidic line 73 (leading to the cathode chamber 13). A portion of the anolyte (mixed with catholyte) passes through the loop 81, where density of the electrolyte is measured with a densitometer 79. The anolyte (mixed with catholyte) then re-enters the anode chamber 11 through the anode chamber inlet 25.

In some embodiments, the electrolyte is heated using a heater installed in the reservoir 39, the anode chamber 11, and/or the anolyte recirculation loop. In these embodiments, a temperature sensor installed near the heater, in the reservoir 39, or the anode chamber 11 is used to communicate with the system controller and regulate the temperature.

The depicted system further includes a substrate rinsing mechanism that connects a source of rinsing liquid 85 (e.g., deionized water) with a rinsing liquid delivery line 87. The line 87 may be coupled with a nozzle and may be configured to rinse the substrate to remove the electrolyte from the substrate after electrochemical metal removal.

Figure 25:
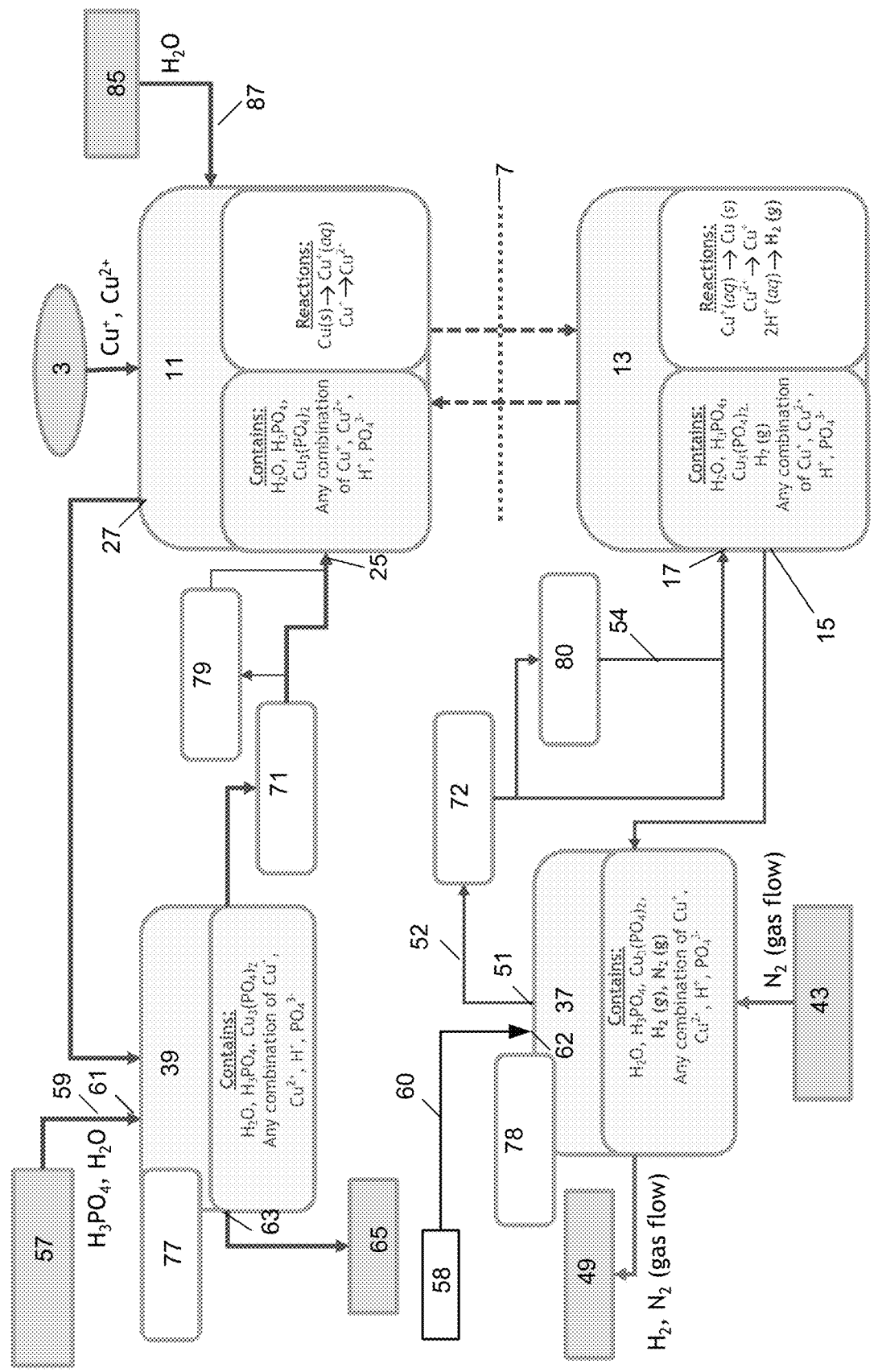
FIG. 25 is a schematic presentation illustrating fluidic connectivity in the electrochemical metal removal apparatus, in accordance with another embodiment provided herein.

In an alternative embodiment the catholyte recirculation loop and the anolyte recirculation loop do not have shared elements. This embodiment is illustrated in FIG. 25, which provides a schematic presentation of the electrochemical metal removal apparatus, having two separate recirculation loops. In this embodiment the anolyte recirculation loop is identical to the anolyte recirculation loop shown in FIG. 24, except the reservoir 39 does not accept any catholyte from the catholyte recirculation loop. The catholyte recirculation loop in this embodiment includes a stilling chamber 37. However, unlike in the shared reservoir embodiment of FIG. 24, the recirculated catholyte is not directed from the stilling chamber to the reservoir but is instead directed back to the catholyte chamber after hydrogen gas removal. The catholyte exits through the catholyte exit port 51 into the fluidic line 52 and is directed with the help of the pump 72 back to the catholyte chamber 13, which it enters through the catholyte inlet 17. The catholyte recirculation loop may include one or more sensors to separately measure catholyte properties. For example, in the depicted example, a conductivity meter 78 is positioned in the stilling chamber and is configured to measure the conductivity of the catholyte. Further a fluidic loop 54 that branches off of the catholyte line 52 is equipped with a densitometer 80 that is configured to measure the density of the catholyte. The catholyte recirculation loop in some embodiments may be configured to receive a diluent and/or an electrolyte component separately from the anolyte recirculation loop in response to the information provided by the sensors of the catholyte recirculation loop. For example an acid solution may be dosed to the stilling chamber 37 through a port 62 from a source of acid 58 via an acid delivery line 60. In the depicted embodiment the anolyte recirculation loop and the catholyte recirculation loop are not in a fluidic or ionic communication outside of the cell. However, in an alternative embodiment the anolyte recirculation loop may receive the catholyte from the catholyte recirculation loop, e.g., through a catholyte reservoir overflow tube. It is also noted that while in the previously described embodiments, the anolyte and catholyte had substantially identical composition containing the same components at substantially identical concentrations, in other embodiments catholyte and anolyte have different compositions and concentrations of components in the catholyte and anolyte are separately managed using separate anolyte and catholyte sensors and component delivery systems. In one example that employs anolyte and catholyte of different compositions, the catholyte is maintained substantially free of the metal ions. In this implementation, the separated cathode chamber (SCC) is separated from the anode chamber by a membrane that substantially prevents transport of metal ions that are present in the anolyte (e.g., copper ions that are dissolved from the substrate) from entering the cathode chamber. This separated catholyte chamber embodiment (or SCC) allows for a substantially different chemical composition exposure to the anode/substrate and cathode. In this case where the SCC membrane would inhibit and/or prevent the transport of copper (or other metal) ions in the anolyte from reaching the cathode and plating on the cathode. Such plating can be potentially dendritic or irregular and may result in formation of particles resulting in deterioration of cell operation. Therefore, in some embodiments there is a SCC, and the electrolyte in the SCC is substantially free of the metal that is being removed from the wafer and contained in the anolyte (e.g. copper). For example, the catholyte can contain an acid, which may be the same type of acid as the acid contained in the anolyte. In some embodiments the SCC is periodically replenished with acid as it is consumed by the hydrogen generating cathodic reaction, either by a direct addition of acid to the SCC, or by addition of the SCC to the catholyte recirculation loop.

Figure 26:
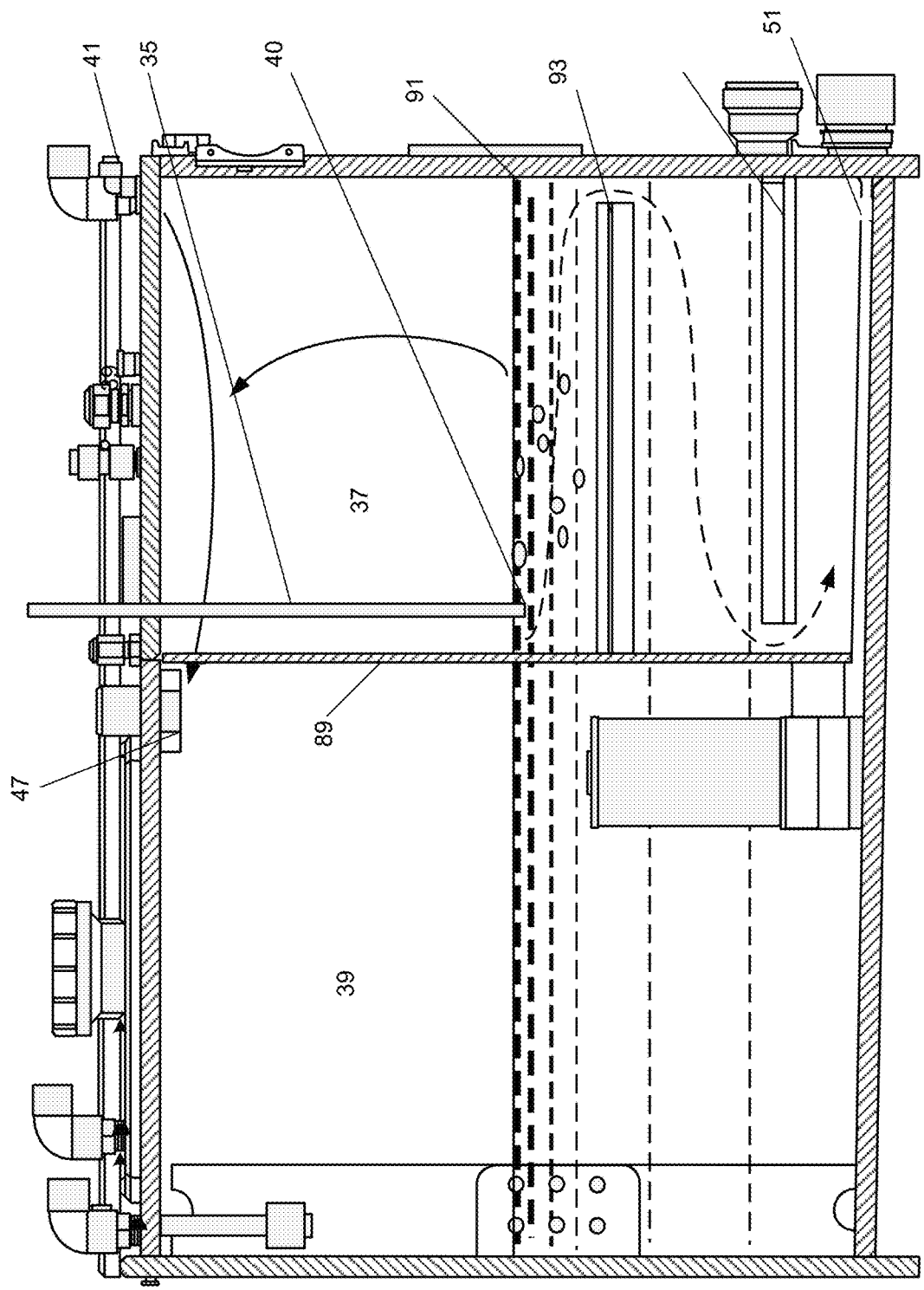
FIG. 26 is a schematic cross-sectional view of a stilling chamber depicted in combination with an electrolyte reservoir, in accordance with an embodiment provided herein.

FIG. 26 provides a cross-sectional view of a combined stilling chamber/reservoir assembly. The stilling chamber 37 occupies the front right portion of the assembly and is separated from the reservoir 39 by sidewalls (including sidewall 89) and a bottom wall, where the bottom wall has an opening 51 for flowing the catholyte from the stilling chamber 37 to the reservoir 39. Because the stilling chamber and the reservoir are communicating vessels, the level of the electrolyte in both vessels is typically the same and is shown as level 91. The catholyte from the cathode chamber (e.g., a mixture of acid, metal salt, and hydrogen bubbles) is directed to the stilling chamber via a conduit 35 having an opening 40. The catholyte flows downward in the stilling chamber via a tortuous path defined by baffles 93 as shown by the arrow. The hydrogen bubbles separate from the catholyte during this course and rise up through the catholyte reaching the space above the catholyte level 91. At the bottom of the stilling chamber the catholyte enters the reservoir through opening 51. Hydrogen in the stilling chamber is mixed with an inert gas (e.g., $N_2$) in the space above the catholyte and is directed with an inert gas flow outside of the stilling chamber. In the depicted embodiment, the inert gas is flowed into the stilling chamber through the opening 41, and the mixture of hydrogen and inert gas exits the stilling chamber through an opening in the sidewall (not shown) and then through an opening 47, which leads to an exhaust. The stilling chamber is configured for separating hydrogen bubbles from the electrolyte (at least partially), and for diluting the separated hydrogen with an inert gas. In some embodiments, hydrogen is diluted such that its concentration in the mixture with the inert gas is lower than 4% by volume (4% is the lower explosive limit (LEL) for hydrogen in air), more preferably lower than about 1% by volume immediately prior to its release through the exhaust. It is preferable to configure the mixture of hydrogen with the inert gas such that the concentration of the hydrogen is lower than its lower explosive limit (LEL) as a mixture in air, even if all of the inert gas in the mixture were substituted with $O_2$. In one example 0.8 L of $H_2$ is diluted with 20 L of $N_2$. It is noted that the maximum amount of $H_2$ in the catholyte can be estimated by measuring the amount of charge that passes through the deplating cell, because it is proportional to the passed charge. Further, $H_2$ concentration is measured, in some embodiments by a hydrogen sensor, that can be placed immediately before the gaseous mixture enters the exhaust. In some implementations the inert gas is flowed continuously through the stilling chamber at a flow rate of between about 20-30 L/min and the flow rate in some embodiments is adjusted such that the $H_2$ concentration is lower than a pre-determined concentration (e.g., lower than 4% by volume) using feedback provided by the $H_2$ sensor.

Figure 27:
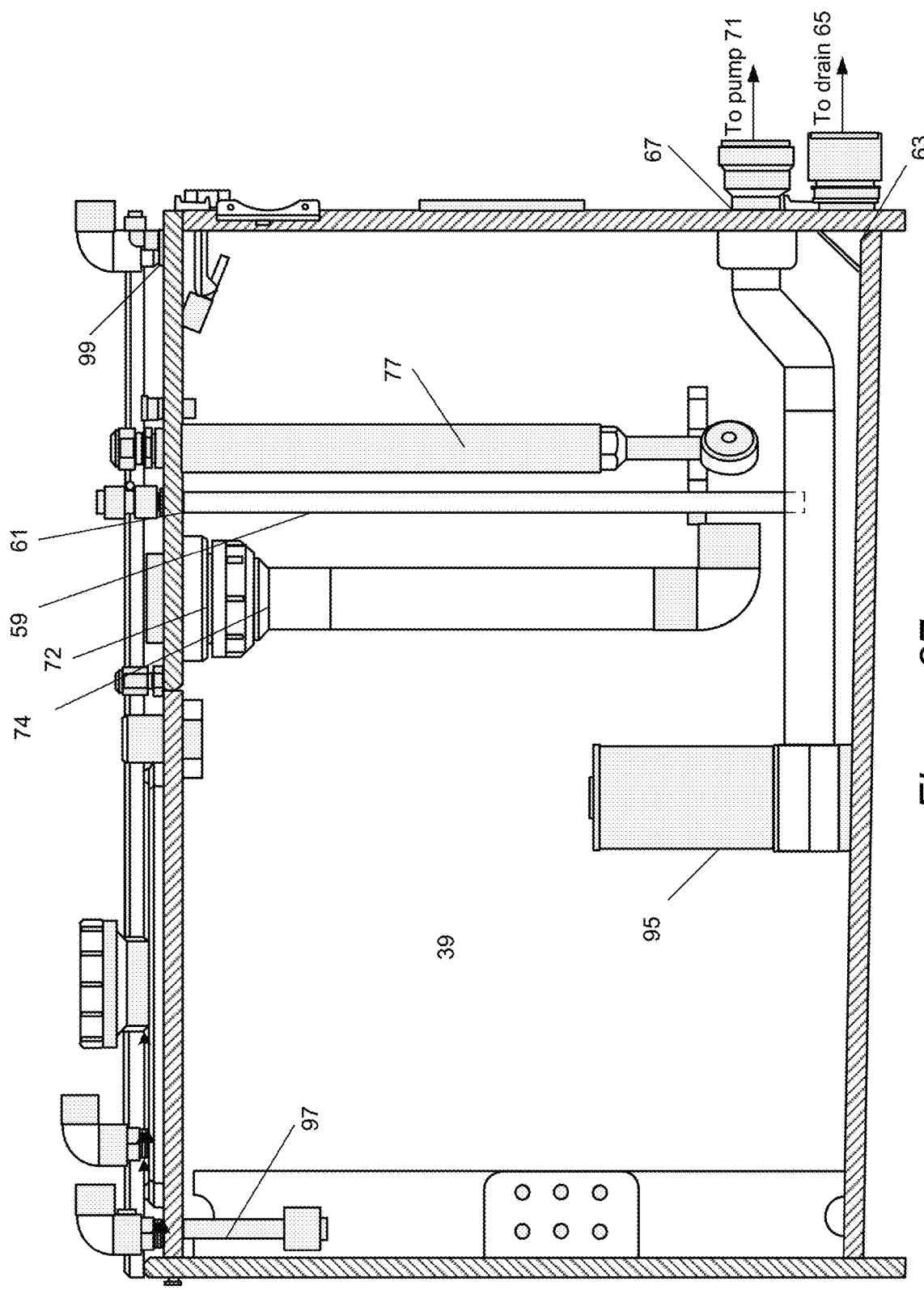
FIG. 27 is a schematic cross-sectional view of an electrolyte reservoir, in accordance with an embodiment provided herein.

A cross-sectional view of the reservoir 39 in accordance with one embodiment, is shown in FIG. 27. The details of the adjacent stilling chamber are not shown to preserve clarity. The reservoir 39 has an entry port 72 for receiving an anolyte from the anolyte chamber via line 74. The reservoir also has an inlet for receiving the catholyte from the stilling chamber. The inlet is not shown in this view. The catholyte and the anolyte mix in the reservoir in the illustrated embodiment, and the conductivity of the mixed electrolyte is measured with the conductivity meter 77. The electrolyte then returns from the reservoir to the recirculation loops, first passing through the filter 95 positioned in the reservoir. The filter 95 may be one of a plurality of filters positioned in the reservoir and adapted to filter the electrolyte from any remaining hydrogen bubbles. In one implementation two filters are used in the reservoir. The filters are positioned, in one embodiment, such that the electrolyte passes downward (rather than laterally) through them. Such vertically oriented filters facilitate hydrogen bubble separation.

In the depicted embodiment, the diluent is added to the reservoir 39 from a diluent source via diluent line 59, which enters via diluent inlet 61. Diluent line 59 terminates near the bottom of the reservoir 39, near the outlet of line 74, and from the perspective depicted in FIG. 27, behind the line leading to the pump 71. This ensures that the diluent and the electrolyte from the anolyte return line 74 mix quickly.

The pump 71 in some embodiments is configured to generate a lower pressure than the pressure in the reservoir such that the electrolyte from the reservoir is drawn to the filter coupled with the fluidic line and the pump via suction. This is more advantageous in the depicted system than using a pump to raise pressure in the reservoir because increased pressure can lead to dissolution of gasses into the electrolyte, which is not desired.

The reservoir further includes an electrolyte level sensor 97 that is configured to measure the level of electrolyte into the reservoir and communicate to controller if a threshold level is exceeded. The reservoir further includes an outlet 63 configured to remove electrolyte to drain 65. At the top portion of the reservoir, it may include one or more openings for introducing air, such as an air inlet 99.

Figure 28A:
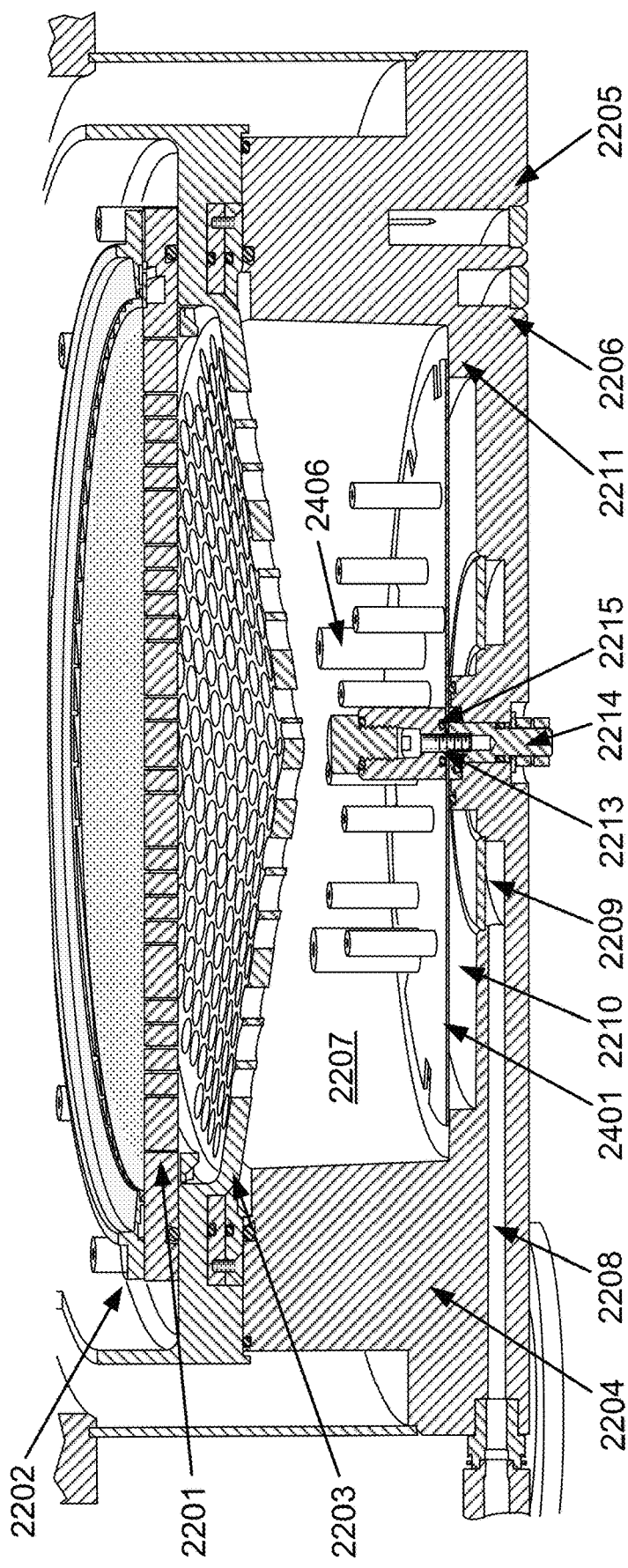
FIG. 28A is a schematic cross-sectional view of a portion of a deplating cell housing an active cathode according to an embodiment provided herein.
Figure 28B:
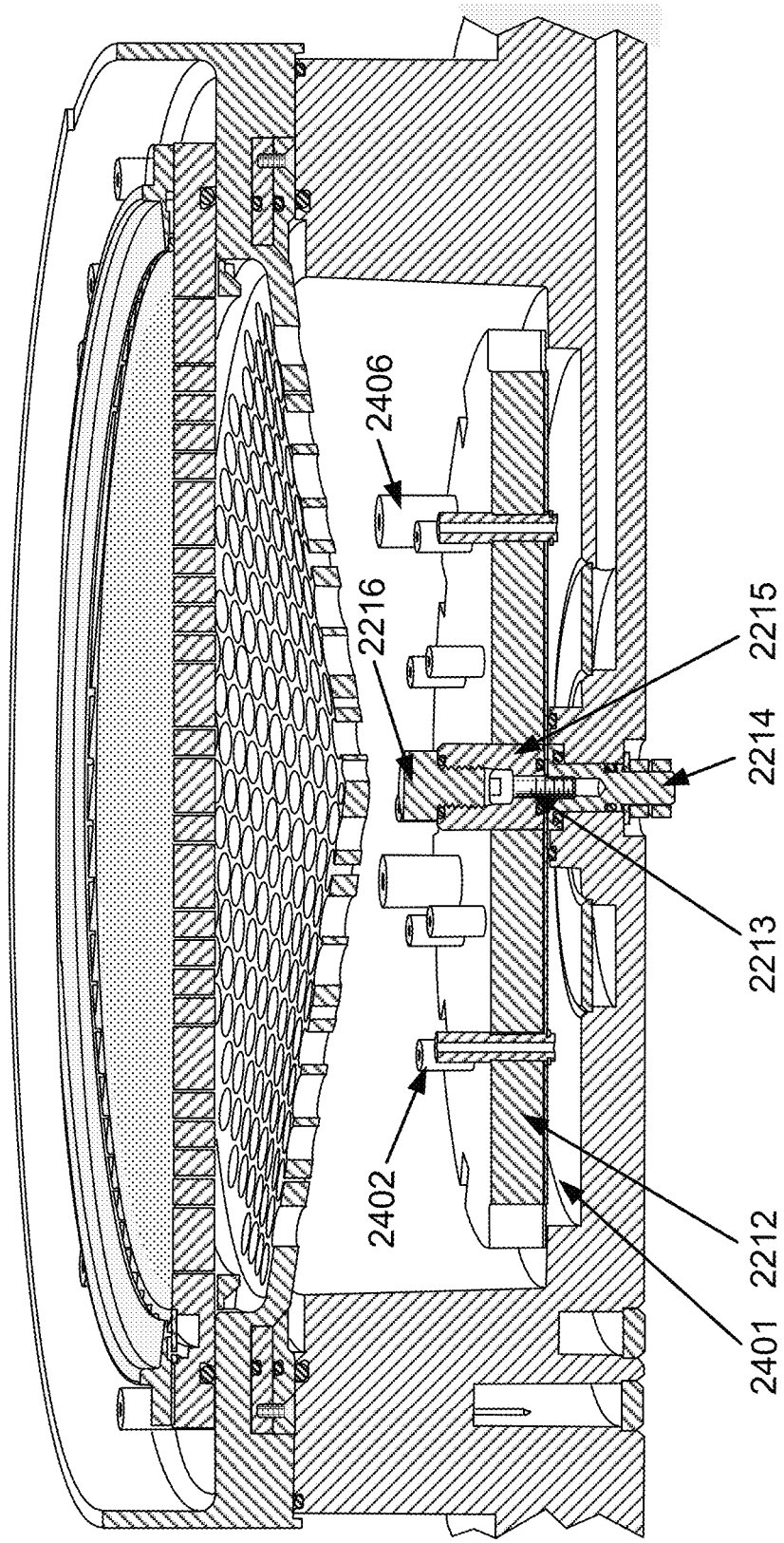
FIG. 28B is a cross-sectional view of a deplating cell shown in FIG. 28A after a layer of metal was deposited onto the active cathode.

FIGS. 28A and 28B provide cross-sectional depictions of a portion of a deplating cell according to some embodiments that employ an active cathode. The cathode in the depicted embodiments is generally disc-shaped and is positioned opposite the substrate during electroplating. In some embodiments the diameter of the substrate and the diameter of the cathode differ by less than 30%, such as less than 25%. This is advantageous for uniformity. Further, a relatively large surface area of the cathode helps reduce the current density at the cathode, which in turn can minimize undesired interactions between the cathode and the electrolyte.

FIG. 28A shows the cell before metal (e.g., copper) has plated onto the active cathode, and FIG. 28B shows the same cell after metal has been removed from the substrates and plated onto the active cathode. In the depicted embodiment the apparatus is configured to admit electrolyte into the cathode chamber and to pass electrolyte through openings made in the active cathode in an upward direction. The apparatus is further configured to separately admit electrolyte into the anode chamber at two locations—above the ionically resistive ionically permeable element, and below the element. The inlet to the anode chamber and the outlet from the anode chamber are located proximate azimuthally opposing positions, such as to generate transverse electrolyte flow proximate the surface of the substrate.

In FIG. 28A, a portion of a deplating cell 2200 is illustrated. The cell includes a cathode chamber housing an active cathode and an anode chamber that houses an ionically resistive ionically permeable element 2201 and a substrate (not shown). The anode chamber and the cathode chamber are separated by a membrane frame 2203 which supports an ionically permeable membrane. Generally, the membrane need not be ion-selective. The membrane is configured to prevent metal particles that can be generated at the active cathode from entering the anode chamber and contacting the substrate. The ionically resistive ionically permeable element 2201 with a cross flow confinement structure 2202 are arranged above and are attached to the membrane frame 2203. The membrane frame lies above the cathode chamber and is attached and sealed to the cathode chamber walls 2204.

A fluid injection manifold 2205 is used to feed flowing electrolyte into the chamber between the ionically resistive ionically permeable element 2201 and membrane frame 2203 and into the gap between the ionically resistive ionically permeable element and the substrate. In addition to the fluid stream feeding into the anode chamber, there is an additional fluid stream feeding into the cathode chamber. Fluid is injected into the cathode chamber 2207 via conduit 2208 and then flows in the depicted example through a diffuser plate 2209, and passes through and around the cathode 2210. The catholyte then exits the cathode chamber via a gap in the cathode chamber below the membrane frame 2203 and exits through another set of conduits (not shown) arriving at a manifold 2006 and eventually out of the cell. The cathode 2210 is supported at its periphery by a ledge 2211 in the cathode chamber bottom portion. In the depicted embodiment the cathode 2210 has a plurality of indentations (grooves) at the cathode's edge. These indentations form openings when the cathode is placed onto the ledge 2211, that allow the fluid admitted into the cathode chamber underneath the cathode, to pass at the periphery of the cathode into the bulk of the cathode chamber. Referring to FIG. 28B, metal 2212 is plated onto the cathode 2210 during deplating of the one or more substrates. In some embodiments, the metal is allowed to build up on the cathode to a thickness of at least about 1 cm, such as between about 1.5-3 cm until the cathode is removed from the cathode chamber.

When metal is deposited onto the cathode, the weight of the cathode can significantly increase, and it may be difficult to remove the cathode from the cell. In some embodiments the cathode is designed or configured to include a plurality of non-conductive fixation elements on the conductive surface of the cathode, where the fixation elements are configured to be attached to one or more handles that can be used for lifting the cathode and removing it from the cell after use.

The cathode in some embodiments includes a plurality of holes that allow for the passage of electrolyte, as it is flowed upward through the cathode. In additions, the indentations made at the edge of the cathode allow for an upward movement of electrolyte at the edge of the cathode after the cathode is positioned on a ledge in the cathode chamber such that the indentations form peripheral openings.

In the embodiment shown in FIGS. 28A and 28B the cathode includes both non-conductive fixation elements for handle attachment, through-holes fitted with non-conductive tubes that extend upward from the surface of the cathode, and indentations at the edge of the cathode.

Figure 29A:
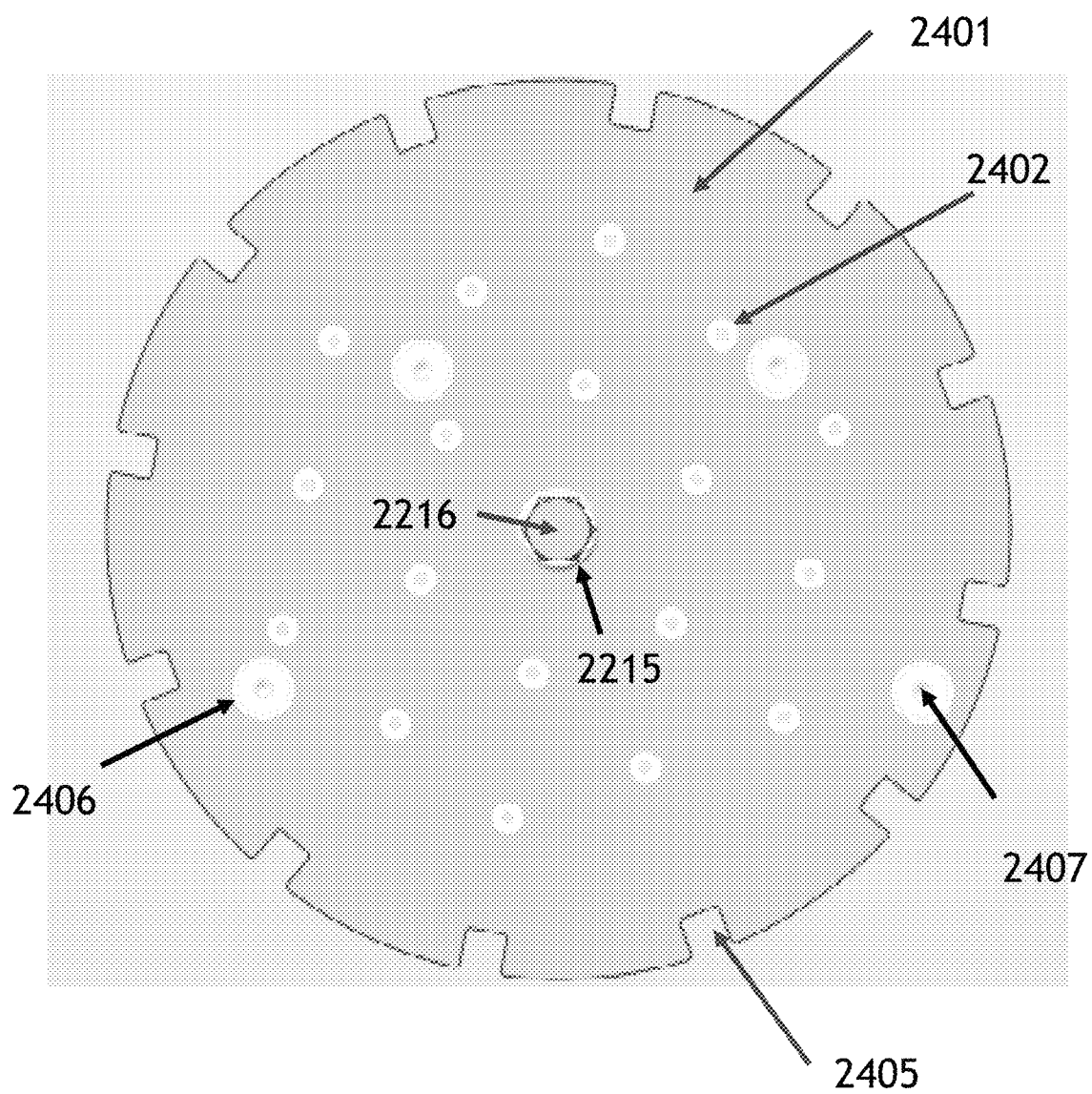
FIG. 29A is a top view of a cathode according to an embodiment provided herein.

The top view of such cathode is shown in FIG. 29A, and a perspective view is shown in FIG. 2C. FIG. 2D illustrates the same cathode with the handles attached to the fixation elements. FIG. 2B is a view of a portion of an insulating tube fitted into one of the through-holes of the cathode.

Figure 29B:
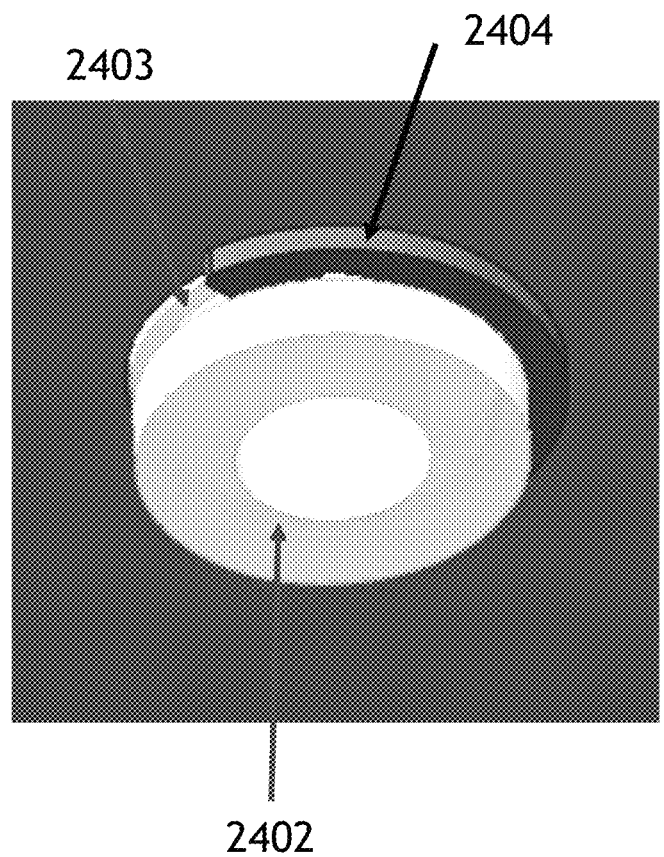
FIG. 29B is a view of a portion of a tube adapted for fitting into a through hole in a cathode.
Figure 29C:
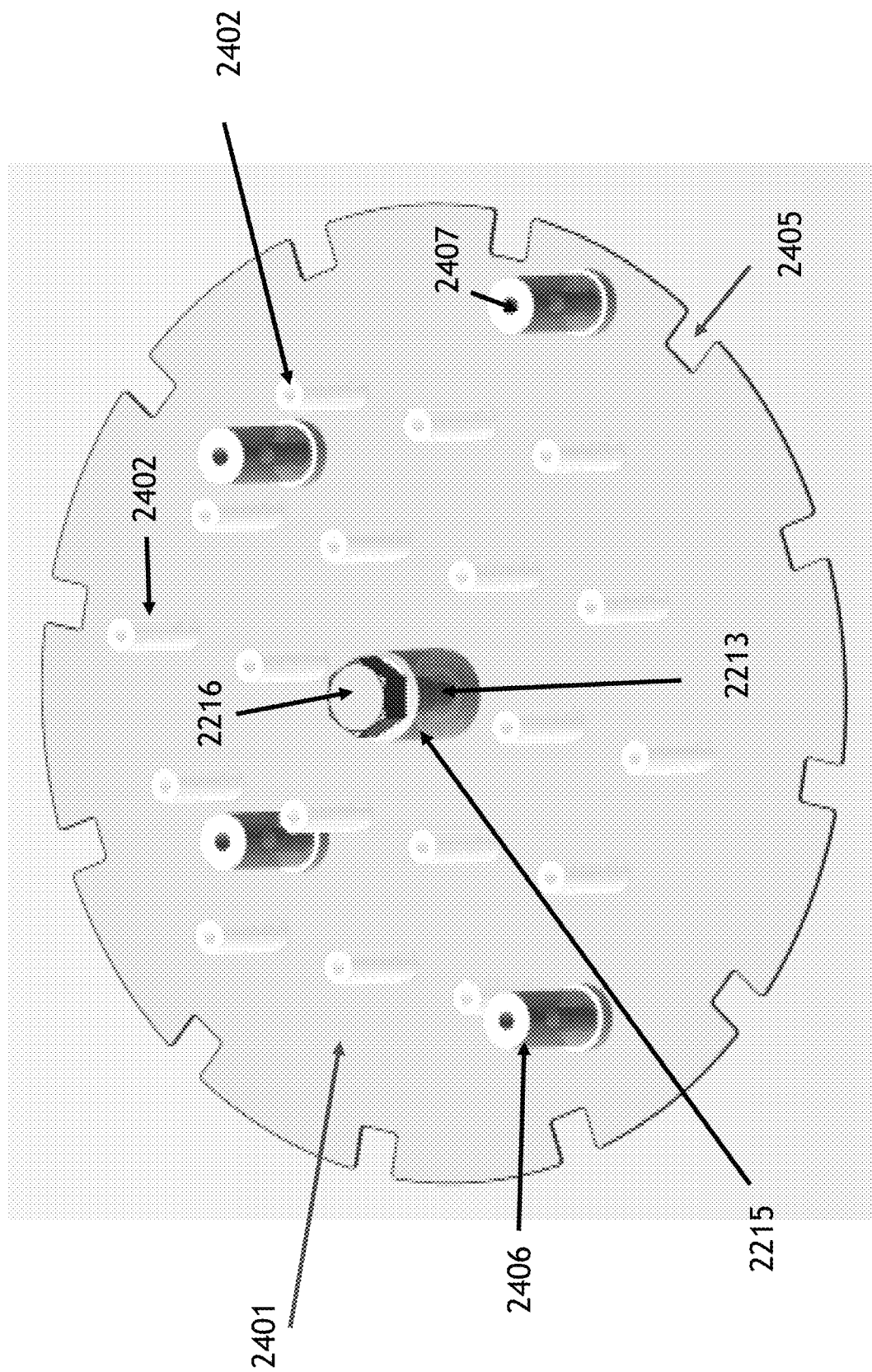
FIG. 29C is a view of a cathode illustrated in FIG. 29A.
Figure 29D:
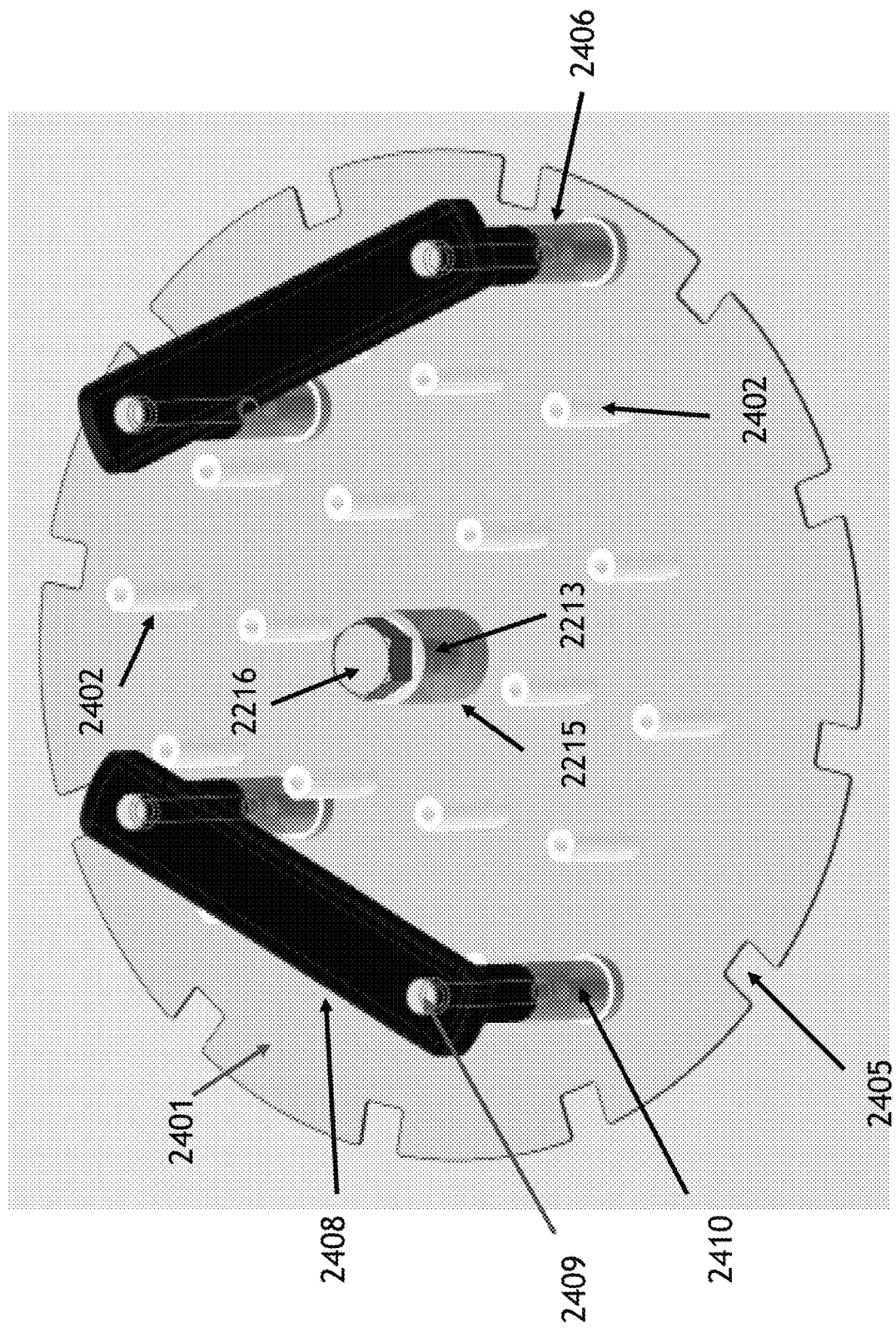
FIG. 29D is a view of a cathode illustrated in FIG. 29A showing handles attached to the cathode for cathode removal.

Referring to FIGS. 29A-29D, the cathode has a generally disk-shaped body 2401 and can be made of stainless steel or any plateable metal. The disk has been machined to allow fitting with several non-conductive (e.g., plastic) elements. A set of flow-through insulating plastic tubes 2402 is attached to the cathode 2401 and fitted to the openings in the cathode. The fitting is illustrated in FIG. 29B, which shows a plastic tube 2402 attached to the cathode by a groove in the tube 2403 and a clip ring 2404. Each tube passes through a hole formed in the cathode and is attached to the cathode via a clip ring. In some embodiments the tubes extend above the disk-shaped body of the cathode to a height of 1.2-4.5 cm in height. The height of the tubes should be preferably greater than the projected thickness of metal that will be plated onto the cathode.

The flow-through tubes are configured to allow convective flow inside the cathode chamber and to allow metal buildup on the cathode's surface. The tubes further prevent blockage of the through holes by the metal buildup.

The cathode in this embodiment has indentations (grooves) 2405 arranged at the periphery, which, when the cathode is mounted in the cell with a supporting edge 2211 at the cathode chamber periphery, will allow for an additional path for fluid to flow around the edge of the cathode. These indentations 2406 in combination with the flow-through tubes 2402 provide several paths for the electrolyte to allow convective flow of electrolyte in the cathode chamber.

The cathode also includes a centrally located mounting bolt 2213 that is used to position the cathode at the center of the apparatus and also drive the base of the cathode into the cathode electrical buss terminal 2214. The mounting bolt is insulated from the electrolyte by a plastic insulating cap and force transfer piece 2215, that also can receive a sealing cap 2216 for preventing the bolt head 2213 from being exposed to electrolyte and allowing it to be removed at the end of the cathode life (when the metal has plated up on the cathode to is maximum thickness, just below the openings of the flow-through tubes). Various O-rings and gasket seals can prevent exposure of metallic portions of the assembly, such as the bolt 2213, and the cathode electrical buss terminal 2214 to electrolyte, and help avoid plating on these parts and joining of the various metal mounting parts by plating. Also included are several (four shown) non-conductive (e.g. plastic) mounting posts 2406 where the posts are configured to be attached to the handles 2408. The manual removal handles 2408 are screwed into threads 2407 using bolts 2409. Posts 2406 are also threaded on the opposite size of the cathode to enable another set of bolts to firmly attach the posts 2406 to the cathode 2401 from the underside. The positions of the mounting posts 2406 is preferably selected such that all posts are placed at different radial locations on the cathode disk. As illustrated, the mounting posts 2406 are radially staggered such as to avoid creating a region on the wafer substrate at a particular radius that is exposed to a significantly smaller amount of current due to the presence of the non-conductive mounting posts. No two posts 2406 are located at the same radius or have the surface block the same projected radius that any portion of the wafer would be exposed to during a 360 degree rotation above the cathode 2401. When the cathode has been plated to a thickness, that calls for cathode removal, the handles 2408 are attached to the posts 2406 via a bolt 2409 using threading within the holes of posts 2406. This allows the plate with the attached plated metal to be removed in one piece quickly and efficiently. The procedure of removal involves unscrewing of the cap 2216 to expose the mounting bolt 2213, unscrewing bolt 2213, and pulling up handles 2408.

In some embodiments, the apparatuses that employ an active cathode, such as the apparatus described in FIG. 28A, are used in conjunction with specially developed electrolytes. These electrolytes allow efficient electroetching and electroplanariziation of masked substrates and are configured to achieve high efficiency plating on the cathode. For example, plating of very thick films (e.g. at least 2 cm thick or at least 2.5 cm thick films) with high charge efficiency (e.g. >95% charge efficiency) is possible. The electrolytes are configured to optimize the morphology of films deposited on the cathode, such that a compact, non-powderous and non-dendric metal layer is formed on the cathode. The described advantages of the electrolyte are particularly pronounced when it is used in conjunction with the cathode chamber illustrated in FIG. 28A. In one embodiment the provided electrolyte has a very high metal concentration and high acid concentration, and, may additionally include an additive that inhibits plating at the active cathode surface without inhibiting or interfering with oxidative processes at the surface of the substrate. For example, in some embodiments the electrolyte includes copper at a concentration of greater than 30 g/L and phosphoric acid at a concentration of greater than 625 g/L, and further includes an electroplating suppressor additive, and/or another additive. Examples of suitable plating suppressors (e.g., copper plating suppressors) include compounds from the classes of polyalkylene glycols and polyalkylene oxides. For example substituted or unsubstituted polyethylene glycol and/or polyethylene oxide may be used as additives. Further, small amounts of chloride ion may be included in the electrolyte as an additive.

Figure 30:
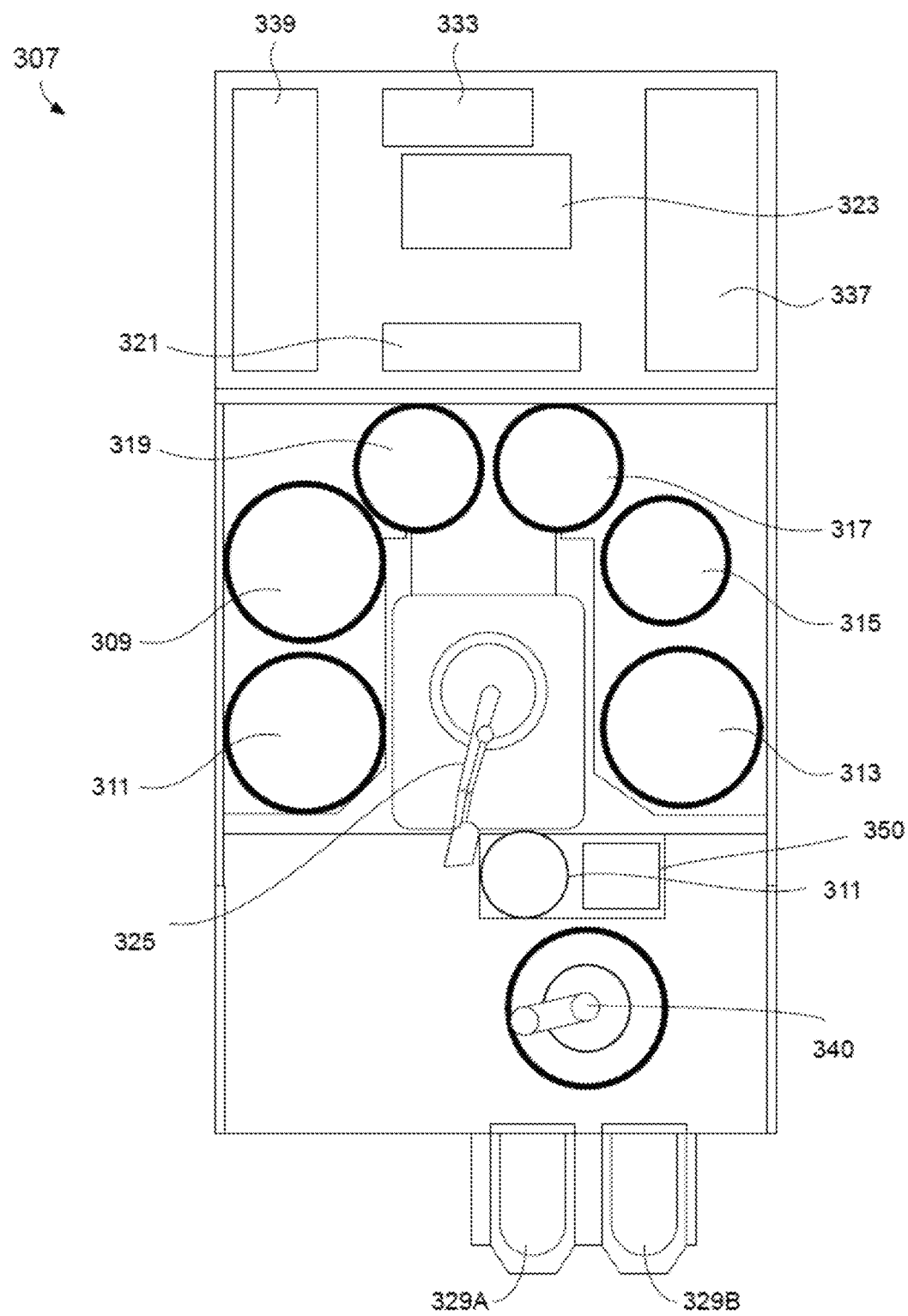
FIG. 30 is a schematic top view of an integrated system that may be used to carry out operations in accordance with embodiments presented herein.

The apparatus for the electrochemical metal removal can be part of the system that also includes an electroplating apparatus, where the system is configured to transport the substrate to the electrochemical metal removal apparatus after electroplating. FIG. 30 presents a schematic of one exemplary integrated system which may be used to carry out multiple operations, including electroplating and electrochemical metal removal. As shown in FIG. 30, the integrated system 307 may include multiple electroplating modules, in this case the three separate modules 309, 311, and 313. Each electroplating module typically includes a cell for containing an anode and an electroplating solution during electroplating, and a wafer holder for holding the wafer in the electroplating solution and rotating the wafer during electroplating. The electroplating system 307 shown in FIG. 3 further includes an electrochemical metal removal system which includes three separate electrochemical metal removal modules 315, 317 and 319. Each of the modules includes a deplating cell configured for containing a cathode and a wafer holder, as described herein. In addition, the integrated system 307 may include one or more post-electrofill modules (PEMs), which are not shown, but whose function may include thoroughly rinsing and/or drying the wafer of any electrolyte solution and contaminants. Depending on the embodiment, each of PEMs may be employed to perform any of the following functions: edge bevel removal (EBR), backside etching, acid cleaning of wafers, rinsing and drying of wafers after they have been electrofilled by one of modules 309, 311, and 313. The integrated system 307 may also include a chemical dilution module 321 configured to hold and deliver the diluent to the electrochemical removal modules, and a central electrolyte bath 323 configured to hold electrolyte that is used by the electrochemical removal modules. The latter may be a tank that holds the chemical solution used as the electrolyte in the electrochemical metal removal modules. The integrated system 307 may also include a hydrogen management system 333 that may include one or more stilling chambers and an inert gas source that stores and delivers an inert gas to the stilling chambers. In some embodiments, a filtration and pumping unit 337 filters the electrolyte solution for central bath 323 and pumps it to the electrochemical metal removal modules. The electroplating and/or electrochemical metal removal modules may include their own dilution and dosing module (e.g., for adding electroplating additives to the electroplating solution), their own filtration and pumping unit, and their own central electrolyte bath (not shown). In some embodiments the electrochemical metal removal modules and the electroplating modules are vertically stacked in a double-decker arrangement, with the electroplating modules occupying a first deck and the electrochemical metal removal modules occupying a different deck. In other embodiments the electroplating modules may be stacked in one section of the tool, and the electrochemical metal removal modules may be stacked in a different section of the tool.

Finally, in some embodiments, an electronics unit 339 may serve as a system controller providing the electronic and interface controls required to operate electroplating system 307. The system controller typically includes one or more memory devices and one or more processors configured to execute instructions so that the integrated system can perform its intended process operations. Machine-readable media containing instructions for controlling process operations in accordance with the implementations described herein may be coupled to the system controller. Unit 339 may also provide a power supply for the system.

In operation, a robot including a back-end robot arm 325 may be used to select wafers from a wafer cassette, such as a cassette 329A or 329B. Back-end robot arm 325 may attach to the wafer using a vacuum attachment or some other feasible attaching mechanism.

A front-end robot arm 340 may select a wafer from a wafer cassette such as the cassette 329A or the cassette 329B. The cassettes 329A or 329B may be front opening unified pods (FOUPs). A FOUP is an enclosure designed to hold wafers securely and safely in a controlled environment and to allow the wafers to be removed for processing or measurement by tools equipped with appropriate load ports and robotic handling systems. The front-end robot arm 340 may hold the wafer using a vacuum attachment or some other attaching mechanism. The front-end robot arm 340 may interface with the cassettes 329A or 329B, a transfer station 350, or an aligner 310. From the transfer station 350, a back-end robot arm 325 may gain access to the wafer. The transfer station 350 may be a slot or a position to and from which front-end robot arm 340 and back-end robot arm 325 may pass wafers without going through the aligner 310. Note, that in some embodiments, the transfer station 350 may serve as (or serve as the location of) a wafer edge imaging module. In some implementations, however, to ensure that a wafer is properly aligned on the back-end-robot 325 for precision delivery to an electroplating module, the back-end robot arm 325 may align the wafer with aligner 310. Back-end robot arm 325 may also deliver a wafer to one of the electrofill modules 309, 311, or 313 or to one of the electrochemical metal removal modules 315, 317, and 319.

To ensure that the wafer is properly aligned on back-end robot arm 325 for precision delivery to an either an electroplating module 309, 311, or 313, or an electrochemical metal removal module 315, 317, and 319, back-end robot arm 325 transports the wafer to an aligner module 331. In certain embodiments, aligner module 331 includes alignment arms against which back-end robot arm 325 pushes the wafer. When the wafer is properly aligned against the alignment arms, the back-end robot arm 325 moves to a preset position with respect to the alignment arms. In other embodiments, the aligner module 331 determines the wafer center so that the back-end robot arm 325 picks up the wafer from the new position. It then reattaches to the wafer and delivers it to one of the electroplating modules 309, 311, or 313, or electrochemical metal removal modules 315, 317, and 319.

Thus, in a typical operation of forming a layer of metal on a wafer using the integrated system 307, back-end robot arm 325 transports a wafer from wafer cassette 329A or 329B to aligner module 331 for pre-electroplating centering adjustment, then to electroplating module 309, 311, or 313 for electroplating, then back to aligner module 331 for pre-electroplanarization centering adjustment, and then to electrochemical metal removal module 315, 317, or 319 for edge bevel removal. Of course, in some embodiments, an intermediate centering/alignment step may be omitted and the wafers may be transported directly between the plating module and the electroplanarization module. In some embodiments the wafer is transported from the electrofill module to a PEM module and then from the PEM module to the electrochemical metal removal module.

In some cases the process involves first removing a wafer from a wafer holding cassette or FOUP (front opening universal pod), transporting the wafer to a vacuum prewetting station where the surface of the wafer containing through resist features is completely wetted in a bubble free wetting process under subatmospheric pressure, transporting that wetted wafer to a first plating module and electroplating a first metal (e.g. copper) in the first plating module, reclaiming plating solution and rinsing the wafer in the first plating module, removing the wafer from the first plating module and transferring the still surface-wetted wafer to an electroplanarization module, processing the wafer in the electroplanarization module, reclaiming electroplanarization solution and rinsing the wafer in the electroplanariation module, then transferring the wafer to the post treatment module (PTM) where it is at least thoroughly rinsed and dried, and then returning the dried wafer to the cassette or FOUP. Some embodiments modify the above sequence to include, after process is completed in the electroplanarization module, transporting the wafer to another plating station configured to either plate the substrate with the same metal as deposited in the first visited plating module (e.g. copper) or to a plating station configured to plate a different metal (e.g. nickel, tin, or tin-silver alloy), prior to visiting and being processed in the electroplanarization module. In one of the preferred embodiments the wafer is first plated in a first plating module with copper, then transferred to a second plating module and plated with nickel in the second plating module (this step may be optionally skipped). Next the wafer is transferred to a third plating module where either tin or a tin-silver alloy is deposited, then the wafer is transferred to an electroplanarization module where a portion of the tin-silver film is removed, and as a result of the latter process, results in the improved thickness distribution of the tin-silver. The improvement in the thickness distribution includes improvement in individual features (within feature distribution) and in aggregated distribution of the laminated structure over the wafer (within die and within wafer thickness distribution), where improvement is compared to a structure where processing in the final electroplanarization module was not performed. In one implementation of this preferred embodiment the electrolyte solution used in the electroplanarization module for tin-silver planarization is a sulfuric acid or a methanesulphonic acid solution with a concentration of greater than 45% by weight.

Electroplating operation may involve loading the wafer in a clamshell type wafer holder and lowering the clamshell into an electroplating bath contained within a cell of one of electroplating modules 309, 311, or 313 where the electroplating is to take place. The cell typically contains an anode which serves as a source of the metal to be plated (although the anode may be remote), as well as an electroplating bath solution that may be supplied by a central electrofill bath reservoir (not shown) along with optional chemical additives from a dosing system. After the optional EBR, the wafer is typically cleaned, rinsed, and dried, and is directed to one of the electrochemical metal removal modules 315, 317, and 319, which may similarly employ clamshell type wafer holders that are configured for lowering the substrate into the electrochemical metal removal electrolyte.

Finally, it is noted that after electrochemical metal removal processing is complete, and after optional rinsing and drying in the PTM module, back-end robot arm 325 may retrieve the wafer and return it to cassette 329A or 329B. From there the cassettes 329A or 329B may be provided to other semiconductor wafer processing systems.

Figure 31:
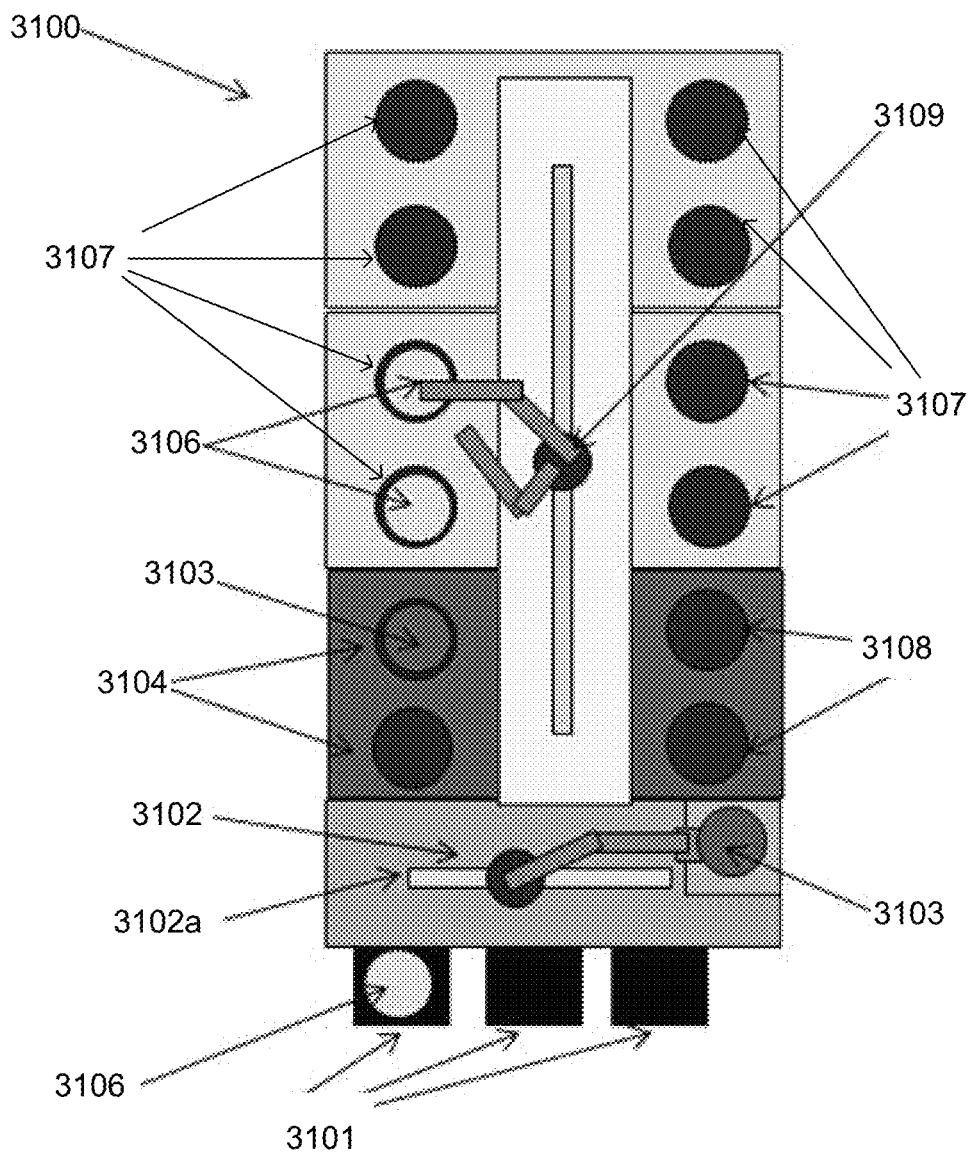
FIG. 31 is a schematic top view of another integrated system that may be used to carry out operations in accordance with embodiments presented herein.

An alternative embodiment of an integrated apparatus configured for electrodeposition and electrochemical metal removal is schematically illustrated in FIG. 31. In this embodiment, the apparatus 3100 has a set of electroplating and/or electrochemical metal removal cells 3107, each containing an electrolyte-containing bath, in a paired or multiple "duet" configuration. In addition to electroplating and electrochemical metal removal per se, the apparatus 3100 may perform a variety of other electroplating or electroplanarization related processes and sub-steps, such as spin-rinsing, spin-drying, metal and silicon wet etching, electroless deposition, pre-wetting and pre-chemical treating, reducing, annealing, photoresist stripping, and surface pre-activation, for example. The apparatus 3100 is shown schematically looking top down in FIG. 31, and only a single level or "floor" is revealed in the figure, but it is to be readily understood by one having ordinary skill in the art that such an apparatus, e.g. the Lam Research Sabre™ 3D tool, can have two or more levels "stacked" on top of each other, each potentially having identical or different types of processing stations. In some embodiments electroplating stations and electrochemical metal removal stations are arranged on different levels of the tool. In other embodiments a single level may include both electroplating and electrochemical metal removal stations.

Referring once again to FIG. 31, the substrates 3206 that are to be electroplated are generally fed to the apparatus 3100 through a front end loading FOUP 3101 and, in this example, are brought from the FOUP to the main substrate processing area of the apparatus 3100 via a front-end robot 3102 that can retract and move a substrate 3106 driven by a spindle 3103 in multiple dimensions from one station to another of the accessible stations—two front-end accessible stations 3104 and also two front-end accessible stations 3108 are shown in this example. The front-end accessible stations 3104 and 3108 may include, for example, pre-treatment stations, and spin rinse drying (SRD) stations. Lateral movement from side-to-side of the front-end robot 3102 is accomplished utilizing robot track 3102a. Each of the substrates 3106 may be held by a cup/cone assembly (not shown) driven by a spindle 3103 connected to a motor (not shown), and the motor may be attached to a mounting bracket 3109. Also shown in this example are the four "duets" of electroplating and/or electrochemical metal removal cells 3107, for a total of eight cells 3107. The electroplating cells 3107 may be used for electroplating copper for the copper containing structure and electroplating solder material for the solder structure. After metal has been electroplated in one of the plating stations 3107, the substrate is transferred to an electrochemical removal cell either on the same level of the apparatus or on a different level of the apparatus 3100. A system controller (not shown) may be coupled to the electrodeposition apparatus 3100 to control some or all of the properties of the electrodeposition apparatus 3100. The system controller may be programmed or otherwise configured to execute instructions according to processes described earlier herein.

Another aspect of the invention is an apparatus configured to accomplish the methods described herein. A suitable apparatus includes hardware for accomplishing the process operations and a system controller having instructions for controlling process operations in accordance with the present invention. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include an electrochemical metal removal system or module, an electroplating system or module, plasma etch chamber or module, a deposition chamber or module, a chemical metal etching chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Generally, the controller may include program instructions for performing any of the methods described herein. In some embodiments the controller includes program instructions for removing metal in an electroetching regime, in an electropolishing regime, or in an electroetching regime followed by an electropolishing regime. The controller may also receive feedback from one or more sensors of the electrochemical metal removal apparatus and may include program instructions for adding one or more fluids to the deplating cell based on the sensor readings.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXAMPLES

Example 1

Empirical equations for determining concentrations of $H_3PO_4$ and $Cu^{2+}$ ions based on temperature, conductivity, and density, were obtained. The equations are valid for solutions consisting essentially of phosphoric acid and copper phosphate at a temperature range of between about 20-50° C., phosphoric acid concentration range of between about 45-50 weight %, and $Cu^{2+}$ concentration range of between about 30-60 g/L. The equations were determined by measuring conductivity as a function of temperature and concentration (separately for acid and copper ions), and of density as a function of concentration (separately for acid and copper ions), using solutions that have known concentrations of acid and copper. Measurement of density as a function of temperature is not needed because the solution density has a very weak dependence on temperature.

Table 2 lists seven solutions with known acid and copper concentrations that were used for determining the empirical equations. Density and conductivity were measured for each solution. Density was measured at 19° C. Conductivity was measured at 19° C., 29° C., 40° C., and 49° C.

TABLE 2

Solutions used for determination of empirical equations.

| Solution | $H_3PO_4$ (weight %) | $Cu^{2+}$ (g/L) |
|---|---|---|
| 1 | 0.5 | 57.7 |
| 2 | 0.45 | 29.1 |
| 3 | 0.5 | 28.9 |
| 4 | 0.5 | 43.4 |
| 5 | 0.475 | 29.0 |
| 6 | 0.45 | 58.1 |
| 7 | 0.475 | 43.4 |

An empirical correlation for the concentration of phosphoric acid as a function of temperature, density and conductivity was determined using the data provided in Table 2. Further, an empirical correlation for the concentrations of copper ions as a function of temperature, density and conductivity was determined using the data provided in Table 2. These correlations were used to determine copper and phosphoric acid concentrations based on electrolyte, conductivity, and density readings during operation of the electrochemical metal removal apparatus.

Example 2

The amount of electrolyte that needs to be removed from the electrochemical metal removal apparatus in order to maintain a desired steady-state concentration of copper ions (target concentration of copper ions) was determined by computational modeling. The model in this example assumes that the volume of removed electrolyte is equal to a volume of copper-free diluent, that the copper removal rate in the cell is about 2.4 mg/second, and the total volume of the electrolyte in the system is 60 L.

Figure 32:
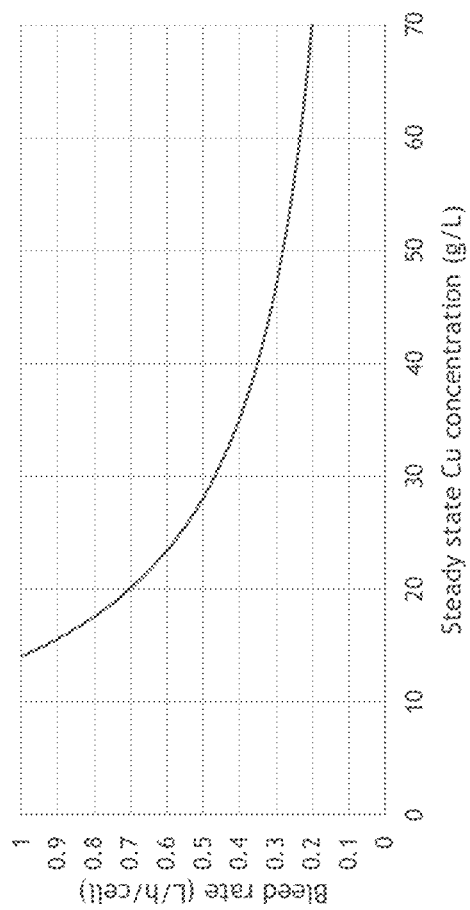
FIG. 32 is a computational modeling plot illustrating dependence of electrolyte removal rate as a function of steady state copper concentration according to an example provided herein.

The resulting dependence of electrolyte removal rate (bleed rate in liters per hour per cell) as a function of steady state copper concentration is shown in FIG. 32. It can be seen that at higher steady state copper concentration lower rates of electrolyte removal (and diluent addition) are needed.

Example 3

An electrooxidative process was applied to Cu features to correct feature uniformity. The substrate used was a 300 mm diameter Si wafer, with a 3000 Å Cu seed layer coated with a 50 μm thick photoresist. The features were defined by selective removal of the photoresist to form a repeating die pattern with a sparsely packed layout (50 μm diameter features with a 200 μm center-to-center distance) and a densely packed layout (50 μm diameter features with a 100 μm center-to-center distance). The target feature thickness was 30 μm, or 60% of the photoresist feature depth. When these features are electroplated at typical conditions (see Table 3) and no electrooxidative postprocessing is applied, WID nonuniformity is 0.86 μm, and WIF nonuniformity is 3.0 μm.

TABLE 3

Process conditions for electroplating in accordance with Example 3.

| Condition | Plating only | Preplating for electrooxidative correction |
|---|---|---|
| Electrolyte | 40 g/L Cu, 140 g/L $H_2SO_4$, Enthone SC additive chemistry | 40 g/L Cu, 140 g/L $H_2SO_4$, Enthone SC additive chemistry |
| Cross-flow rate | 20 L/min | 20 L/min |
| Temperature | 30° C. | 30° C. |
| % fill | 60% | 84% |
| % overplating | 0% | 40% |

A wafer to be used for electrooxidative postprocessing was plated to an additional 12 μm of thickness, for a total of 42 μm or 84% of the photoresist feature depth (see Table 3). Subsequently, the wafer was transferred to a cell suitable for electrooxidative processing, as described above, with an inert stainless steel anode and a combined settling chamber and anolyte/catholyte reservoir. The cross-flow velocity used was 10 L/min. The electrolyte was composed of 60 g/L Cu and 48 wt % phosphoric acid at 30° C. The critical potential for this pattern in this electrolyte had previously been determined to be about 0.5-0.6V. 4 μm of Cu was removed under current control at a 6 A, where the applied voltage was approx. 0.3 V vs. a Cu reference electrode in the electroetching regime. 8 μm of Cu was then removed under potential control at 0.7 V in an electropolishing regime. Endpoints for each step were determined by integrating the applied current over time to give the amount of charge passed.

The resultant features showed a WID nonuniformity of 0.36 μm (a 57% reduction relative to plating alone) and a WIF nonuniformity of 0.75 μm (a 75% reduction relative to plating alone).

The invention claimed is:

1. A method for processing a semiconductor substrate, the method comprising:
(a) providing a semiconductor substrate having a working surface, wherein the working surface comprises a plurality of through mask metal features, into an apparatus configured for electrochemical metal removal;
(b) selecting a regime for the electrochemical metal removal from the group consisting of an electroetching below a critical potential, electropolishing above the critical potential, and electroetching below the critical potential followed by electropolishing above the critical potential; and
(c) electrochemically removing a portion of the metal from the through mask metal features in the selected regime while improving the uniformity of the metal, wherein the apparatus configured for electrochemical metal removal comprises:
(i) a vessel configured for holding an electrolyte and a cathode during electrochemical metal removal from the semiconductor substrate;
(ii) a semiconductor substrate holder configured to hold the semiconductor substrate such that the working surface of the semiconductor substrate is immersed into the electrolyte and is separated from the cathode during the electrochemical removal of metal from the semiconductor substrate;

(iii) a mechanism configured to provide a transverse flow of electrolyte contacting the working surface of the semiconductor substrate in a direction that is substantially parallel to the working surface of the semiconductor substrate, wherein the mechanism is different from a mechanism for rotating the semiconductor substrate; and (iv) a reference electrode for measuring a potential proximate the semiconductor substrate or an equivalent potential.

2. The method of claim 1, wherein electrochemically removing the portion of the metal comprises electroetching the metal below the critical potential under current-controlled conditions.

3. The method of claim 1, wherein electrochemically removing the portion of the metal comprises electropolishing the metal above the critical potential under potential-controlled conditions.

4. A method for processing a semiconductor substrate, the method comprising:

(a) providing a semiconductor substrate having a working surface, wherein the working surface comprises an exposed metal, into an apparatus configured for electrochemical metal removal;

(b) anodically biasing the semiconductor substrate and immersing the working surface of the semiconductor substrate into an electrolyte; and (c) electrochemically removing a portion of the metal while improving the uniformity of the metal by removing metal in an electroetching regime below a critical potential, followed by removing metal in an electropolishing regime above the critical potential, wherein the apparatus configured for electrochemical metal removal comprises:

(i) a vessel configured for holding an electrolyte and a cathode during electrochemical metal removal from the semiconductor substrate;

(ii) a semiconductor substrate holder configured to hold the semiconductor substrate such that the working surface of the semiconductor substrate is immersed into the electrolyte and is separated from the cathode during the electrochemical removal of metal from the semiconductor substrate;

(iii) a mechanism configured to provide a transverse flow of electrolyte contacting the working surface of the semiconductor substrate in a direction that is substantially parallel to the working surface of the semiconductor substrate, wherein the mechanism is different from a mechanism for rotating the semiconductor substrate; and (iv) a reference electrode for measuring a potential proximate the semiconductor substrate or an equivalent potential.

5. A method for processing a semiconductor substrate, the method comprising:

(a) providing a semiconductor substrate having a plurality of through mask metal features, into an apparatus configured for electrochemical metal removal;

(b) anodically biasing the semiconductor substrate and immersing the working surface of the semiconductor substrate into the electrolyte;

(c) electrochemically removing a portion of the metal from the through mask metal features, such that metal thickness variation within individual through mask features is reduced, wherein the apparatus configured for electrochemical metal removal comprises:

(i) a vessel configured for holding an electrolyte and a cathode during electrochemical metal removal from the semiconductor substrate;

(ii) a semiconductor substrate holder configured to hold the semiconductor substrate such that the working surface of the semiconductor substrate is immersed into the electrolyte and is separated from the cathode during the electrochemical removal of metal from the semiconductor substrate;

(iii) a mechanism configured to provide a transverse flow of electrolyte contacting the working surface of the semiconductor substrate in a direction that is substantially parallel to the working surface of the semiconductor substrate, wherein the mechanism is different from a mechanism for rotating the semiconductor substrate; and (iv) a reference electrode for measuring a potential proximate the semiconductor substrate or an equivalent potential.

6. An apparatus for electrochemically removing metal from a semiconductor substrate, the apparatus comprising:

(a) an anode chamber configured to house an anodically biased semiconductor substrate during electrochemical metal removal from the semiconductor substrate, wherein the anode chamber has at least one inlet for introducing a fluid to the anode chamber;

(b) a cathode chamber configured to house a cathode, wherein the cathode chamber has at least one inlet for introducing a fluid into the cathode chamber; and (c) an ionically permeable separator between the anode chamber and the cathode chamber, wherein the apparatus further comprises a reference electrode for measuring a potential proximate the semiconductor substrate or an equivalent potential, wherein the reference electrode is positioned to reside within about 5 cm from the surface of the semiconductor substrate, or, is positioned at a location, where a potential is equivalent to a potential measured within about 5 cm of the semiconductor substrate.

7. The apparatus of claim 6, wherein the inlet to the cathode chamber is positioned proximate the cathode, and wherein the cathode chamber further comprises an outlet positioned proximate the ionically permeable separator.

8. The apparatus of claim 6, wherein the ionically permeable separator is configured to block or inhibit transfer of hydrogen bubbles and/or metal particles from the cathode chamber to the anode chamber.

9. The apparatus of claim 6, further comprising a catholyte recirculation loop and an anolyte recirculation loop.

10. The apparatus of claim 6, further comprising a cathode having a plurality of through-holes, wherein the apparatus is configured to pass the fluid from the at least one inlet in the cathode chamber through the holes of the cathode.

11. The apparatus of claim 6, wherein the apparatus is configured to process data from the reference electrode, and maintain electrochemical removal process in a selected regime.

12. The apparatus of claim 6, wherein the apparatus further comprises a controller comprising program instructions for causing an electrochemical metal removal from the semiconductor substrate in an electroetching regime below a critical potential.

13. The apparatus of claim 6, wherein the apparatus further comprises a controller comprising program instructions for causing an electrochemical metal removal from the semiconductor substrate in an electropolishing regime above a critical potential.

14. The apparatus of claim 6, wherein the apparatus further comprises a controller comprising program instructions for causing an electrochemical metal removal from the semiconductor substrate in an electroetching regime below a critical potential followed by an electrochemical metal removal in an electropolishing regime above a critical potential.

15. The apparatus of claim 6, wherein the reference electrode is positioned to reside within about 5 mm from the surface of the semiconductor substrate, or, is positioned at a location, where a potential is equivalent to a potential measured within about 5 mm of the semiconductor substrate.

16. The apparatus of claim 6, wherein the reference electrode is positioned to be immersed into the fluid that exits the anode chamber.

17. The apparatus of claim 6, wherein the reference electrode is positioned remotely and is in communication with the anode chamber via a Luggin capillary, wherein an opening of the Luggin capillary is within about 5 cm of the semiconductor substrate.

18. The apparatus of claim 6, wherein the reference electrode is a copper electrode, a nickel electrode, or a tin electrode.

19. The apparatus of claim 6, wherein the cathode chamber includes a cathode, and wherein the cathode comprises:
(i) a plurality of channels, wherein the channels are configured for passing an electrolyte through the body of the cathode; and
(ii) a plurality of indentations at the edge of the cathode, wherein the cathode has a generally disc-shaped body.

20. The apparatus of claim 6, further comprising: a mechanism configured to provide a transverse flow of an electrolyte contacting a working surface of the semiconductor substrate in a direction that is substantially parallel to the working surface of the semiconductor substrate, wherein the mechanism is different from a mechanism for rotating the semiconductor substrate.

21. An apparatus for electrochemically removing metal from a semiconductor substrate, the apparatus comprising:
(a) a vessel configured for holding an electrolyte and a cathode during electrochemical metal removal from the semiconductor substrate;
(b) a semiconductor substrate holder configured to hold the semiconductor substrate such that a working surface of the semiconductor substrate is immersed into the electrolyte and is separated from the cathode during the electrochemical removal of metal from the semiconductor substrate;
(c) a mechanism configured to provide a transverse flow of electrolyte contacting the working surface of the semiconductor substrate in a direction that is substantially parallel to the working surface of the semiconductor substrate, wherein the mechanism is different from a mechanism for rotating the semiconductor substrate; and
(d) a reference electrode for measuring a potential proximate the semiconductor substrate or an equivalent potential.

22. The apparatus of claim 21, wherein the mechanism configured to provide the transverse flow of electrolyte comprises a mechanism for flowing the electrolyte into an inlet in the vessel and flowing the electrolyte out of an outlet in the vessel, wherein the inlet and outlet are positioned proximate azimuthally opposing portions of perimeter locations of the working surface of the semiconductor substrate.

23. The apparatus of claim 21, wherein the mechanism configured to provide the transverse flow of electrolyte comprises a reciprocating paddle.

24. The apparatus of claim 21, wherein the mechanism configured to provide the transverse flow of electrolyte comprises a lateral electrolyte injector.

25. The apparatus of claim 21, wherein the mechanism configured to provide the transverse flow of electrolyte comprises an electrolyte flow diverter configured to divert an impinging electrolyte flow to a transverse electrolyte flow.

26. The apparatus of claim 21, wherein the apparatus is configured to process data from the reference electrode, and maintain electrochemical removal process in a selected regime.

27. The apparatus of claim 21, wherein the apparatus further comprises an ionically resistive ionically permeable element having a plurality of channels, wherein the apparatus is configured for generating the transverse flow of electrolyte in a gap between the ionically resistive ionically permeable element and the semiconductor substrate.

28. An apparatus for electrochemically removing metal from a semiconductor substrate, the apparatus comprising:
(a) an anode chamber configured to house an anodically biased semiconductor substrate during electrochemical metal removal from the semiconductor substrate, wherein the anode chamber has at least one inlet for introducing a fluid to the anode chamber;
(b) a cathode chamber configured to house a cathode, wherein the cathode chamber has at least one inlet for introducing a fluid into the cathode chamber; and
(c) a controller comprising program instructions for causing electrochemical metal removal in an electroetching regime below a critical potential and/or in an electropolishing regime above a critical potential.

29. The apparatus of claim 28, wherein the controller comprises program instructions for causing an electrochemical metal removal from the semiconductor substrate in an electroetching regime below a critical potential followed by an electrochemical metal removal in an electropolishing regime above a critical potential.

* * * * *